United States Patent
Haketa et al.

(10) Patent No.: US 12,514,115 B2
(45) Date of Patent: Dec. 30, 2025

(54) ORGANIC ELECTROLUMINESCENCE DEVICE AND ELECTRONIC APPARATUS

(71) Applicant: IDEMITSU KOSAN CO., LTD., Tokyo (JP)

(72) Inventors: Tasuku Haketa, Sodegaura (JP); Kazuki Nishimura, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 858 days.

(21) Appl. No.: 17/766,213

(22) PCT Filed: Sep. 28, 2020

(86) PCT No.: PCT/JP2020/036549
§ 371 (c)(1),
(2) Date: Apr. 1, 2022

(87) PCT Pub. No.: WO2021/065774
PCT Pub. Date: Apr. 8, 2021

(65) Prior Publication Data
US 2024/0138254 A1    Apr. 25, 2024

(30) Foreign Application Priority Data
Oct. 4, 2019    (JP) .................. 2019-184168

(51) Int. Cl.
*H10K 50/15* (2023.01)
*H10K 50/00* (2023.01)
*H10K 85/60* (2023.01)

(52) U.S. Cl.
CPC .......... *H10K 85/636* (2023.02); *H10K 50/00* (2023.02); *H10K 85/631* (2023.02); *H10K 85/633* (2023.02); *H10K 50/156* (2023.02); *H10K 85/615* (2023.02); *H10K 85/626* (2023.02); *H10K 85/655* (2023.02); *H10K 85/6572* (2023.02); *H10K 85/6574* (2023.02)

(58) Field of Classification Search
None
See application file for complete search history.

(56) References Cited

U.S. PATENT DOCUMENTS

| | | |
|---|---|---|
| 2012/0326141 A1 | 12/2012 | Pflumm et al. |
| 2017/0317289 A1 | 11/2017 | Lee et al. |
| 2019/0074446 A1 | 3/2019 | Xia |
| 2020/0091435 A1* | 3/2020 | Masuda ............... H10K 85/633 |
| 2022/0231226 A1* | 7/2022 | Maier-Flaig ......... H10K 85/633 |

FOREIGN PATENT DOCUMENTS

| | | |
|---|---|---|
| CN | 110272421 A | 9/2019 |
| JP | 2013-522864 A | 6/2013 |
| JP | 2016-017078 A | 2/2016 |
| JP | 2017-538282 A | 12/2017 |
| JP | 2018-121046 A | 8/2018 |
| WO | WO-2010/064655 A1 | 6/2010 |
| WO | WO-2010/134350 A1 | 11/2010 |
| WO | WO-2010/134352 A1 | 11/2010 |
| WO | WO-2011/110262 A1 | 9/2011 |
| WO | WO-2014/017484 A1 | 1/2014 |
| WO | WO-2015/162912 A1 | 10/2015 |
| WO | WO-2018/101492 A2 | 6/2018 |
| WO | WO-2018174293 A1 * | 9/2018 |
| WO | WO-2019/088231 A1 | 5/2019 |

OTHER PUBLICATIONS

Ma, Lin, et al. "Single photon triggered dianion formation in TCNQ and F4TCNQ crystals." Scientific Reports 6.1 (2016): 28510. (Year: 2016).*
International Search Report issued in corresponding International Patent Application No. PCT/JP2020/036549 dated Dec. 8, 2020.
Translation of Written Opinion issued in corresponding International Patent Application No. PCT/JP2020/036549 dated Dec. 8, 2020.

* cited by examiner

*Primary Examiner* — Robert S Loewe
(74) *Attorney, Agent, or Firm* — Foley & Lardner LLP

(57) ABSTRACT

An organic electroluminescence device containing a cathode, an anode, and an organic layer disposed between the cathode and the anode, wherein the organic layer contains an emitting layer, a first layer, and a second layer, the first layer is disposed between the anode and the emitting layer, the second layer is disposed between the anode and the first layer, the first layer contains a first hole-transporting material and a second hole-transporting material, and the second layer contains an acceptor material having an affinity value in the range of 3.8 to 6.0 eV and at least one hole-transporting material.

26 Claims, 1 Drawing Sheet

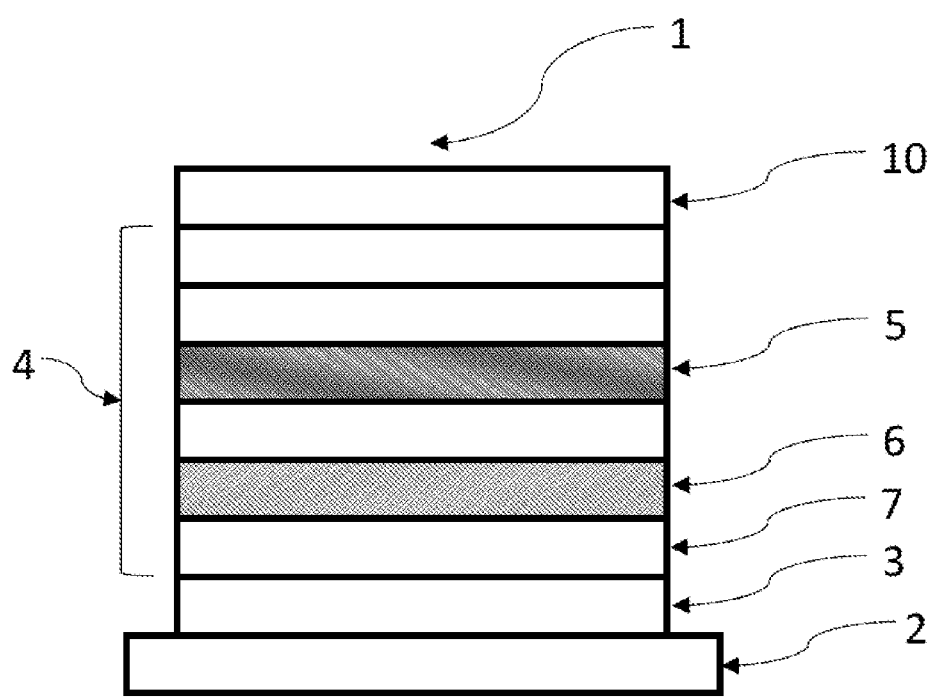

ORGANIC ELECTROLUMINESCENCE DEVICE AND ELECTRONIC APPARATUS

CROSS-REFERENCE TO RELATED APPLICATIONS

The present application claims priority under 35 U.S.C. § 371 to International Patent Application No. PCT/JP2020/036549, filed Sep. 28, 2020, which claims priority to and the benefit of Japanese Patent Application No. 2019-184168, filed on Oct. 4, 2019. The contents of these applications are hereby incorporated by reference in their entireties.

TECHNICAL FIELD

The invention relates to an organic electroluminescence device and an electronic apparatus.

BACKGROUND ART

When voltage is applied to an organic electroluminescence device (hereinafter, referred to as an organic EL device), holes and electrons are injected into an emitting layer from an anode and a cathode, respectively. Then, thus injected holes and electrons are recombined in the emitting layer, and excitons are formed therein.

The organic EL device includes the emitting layer between the anode and the cathode. Further, the organic EL device has a stacked structure including an organic layer such as a hole-injecting layer, a hole-transporting layer, an electron-injecting layer, and an electron-transporting layer in several cases.

Patent Document 1 discloses an organic EL device having a mixture of two or more materials in a hole-transporting layer.

Patent Document 2 discloses an organic EL device having a hole-transporting layer containing a composition containing two or more kinds of compounds having similar structures.

RELATED ART DOCUMENTS

Patent Documents

[Patent Document 1] WO2011/110262
[Patent Document 2] US2017/0317289

SUMMARY OF THE INVENTION

The object of the invention is to provide an organic EL device having low drive-voltage, high luminous efficiency, and long lifetime.

According to the invention, the following organic electroluminescence device and electronic apparatus are provided.
1. An organic electroluminescence device comprising a cathode, an anode, and an organic layer disposed between the cathode and the anode, wherein
   the organic layer comprises an emitting layer, a first layer, and a second layer,
   the first layer is disposed between the anode and the emitting layer,
   the second layer is disposed between the anode and the first layer,
   the first layer comprises a first hole-transporting material, and a second hole-transporting material, and the second layer comprises an acceptor material having an affinity value in the range of 3.8 to 6.0 eV, and at least one hole-transporting material.
2. An electronic apparatus, equipped with the organic electroluminescence device according to 1.

According to the invention, an organic EL device having low drive-voltage, high luminous efficiency, and long lifetime can be provided.

BRIEF DESCRIPTION OF THE DRAWINGS

The FIGURE is a diagram showing a schematic configuration of an organic EL device according to one embodiment of the invention.

MODE FOR CARRYING OUT THE INVENTION

Definition

In this specification, a hydrogen atom includes its isotopes different in the number of neutrons, namely, a protium, a deuterium and a tritium.

In this specification, at a bondable position in a chemical formula where a symbol such as "R", or "D" representing a deuterium atom is not indicated, a hydrogen atom, that is, a protium atom, a deuterium atom or a tritium atom is bonded.

In this specification, the number of ring carbon atoms represents the number of carbon atoms forming a subject ring itself among the carbon atoms of a compound having a structure in which atoms are bonded in a ring form (for example, a monocyclic compound, a fused ring compound, a cross-linked compound, a carbocyclic compound, or a heterocyclic compound). When the subject ring is substituted by a substituent, the carbon contained in the substituent is not included in the number of ring carbon atoms. The same shall apply to "the number of ring carbon atoms" described below, unless otherwise specified. For example, a benzene ring has 6 ring carbon atoms, a naphthalene ring includes 10 ring carbon atoms, a pyridine ring includes 5 ring carbon atoms, and a furan ring includes 4 ring carbon atoms. Further, for example, a 9,9-diphenylfluorenyl group includes 13 ring carbon atoms, and a 9,9'-spirobifluorenyl group includes 25 ring carbon atoms.

When a benzene ring is substituted by, for example, an alkyl group as a substituent, the number of carbon atoms of the alkyl group is not included in the number of ring carbon atoms of the benzene ring. Therefore, the number of ring carbon atoms of the benzene ring substituted by the alkyl group is 6. When a naphthalene ring is substituted by, for example, an alkyl group as a substituent, the number of carbon atoms of the alkyl group is not included in the number of ring carbon atoms of the naphthalene ring. Therefore, the number of ring carbon atoms of the naphthalene ring substituted by the alkyl group is 10.

In this specification, the number of ring atoms represents the number of atoms forming a subject ring itself among the atoms of a compound having a structure in which atoms are bonded in a ring form (for example, the structure includes a monocyclic ring, a fused ring and a ring assembly) (for example, a monocyclic compound, a fused ring compound, a cross-linked compound, a carbocyclic compound and a heterocyclic compound). The number of ring atoms does not include atoms which do not form the ring (for example, a hydrogen atom which terminates a bond of the atoms forming the ring), or atoms contained in a substituent when the ring is substituted by the substituent. The same shall apply to "the number of ring atoms" described below, unless otherwise specified. For example, the number of atoms of a pyridine ring is 6, the number of atoms of a quinazoline ring is 10, and the number of a furan ring is 5. For example, hydrogen atoms bonded to a pyridine ring and atoms constituting a substituent substituted on the pyridine ring are not included in the number of ring atoms of the pyridine ring. Therefore, the number of ring atoms of a pyridine ring with which a hydrogen atom or a substituent is bonded is 6. For example, hydrogen atoms and atoms constituting a substituent which are bonded with a quinazoline ring is not included in the number of ring atoms of the quinazoline ring. Therefore, the number of ring atoms of a quinazoline ring with which a hydrogen atom or a substituent is bonded is 10.

In this specification, "XX to YY carbon atoms" in the expression "a substituted or unsubstituted ZZ group including XX to YY carbon atoms" represents the number of carbon atoms in the case where the ZZ group is unsubstituted by a substituent, and does not include the number of carbon atoms of a substituent in the case where the ZZ group is substituted by the substituent. Here, "YY" is larger than "XX", and "XX" means an integer of 1 or more and "YY" means an integer of 2 or more.

In this specification, "XX to YY atoms" in the expression "a substituted or unsubstituted ZZ group including XX to YY atoms" represents the number of atoms in the case where the ZZ group is unsubstituted by a substituent, and does not include the number of atoms of a substituent in the case where the ZZ group is substituted by the substituent. Here, "YY" is larger than "XX", and "XX" means an integer of 1 or more and "YY" means an integer of 2 or more.

In this specification, the unsubstituted ZZ group represents the case where the "substituted or unsubstituted ZZ group" is a "ZZ group unsubstituted by a substituent", and the substituted ZZ group represents the case where the "substituted or unsubstituted ZZ group" is a "ZZ group substituted by a substituent".

In this specification, a term "unsubstituted" in the case of "a substituted or unsubstituted ZZ group" means that hydrogen atoms in the ZZ group are not substituted by a substituent. Hydrogen atoms in a term "unsubstituted ZZ group" are a protium atom, a deuterium atom, or a tritium atom.

In this specification, a term "substituted" in the case of "a substituted or unsubstituted ZZ group" means that one or more hydrogen atoms in the ZZ group are substituted by a substituent. Similarly, a term "substituted" in the case of "a BB group substituted by an AA group" means that one or more hydrogen atoms in the BB group are substituted by the AA group.

"Substituent as Described in this Specification"

Hereinafter, the substituent described in this specification will be explained.

The number of ring carbon atoms of the "unsubstituted aryl group" described in this specification is 6 to 50, preferably 6 to 30, and more preferably 6 to 18, unless otherwise specified.

The number of ring atoms of the "unsubstituted heterocyclic group" described in this specification is 5 to 50, preferably 5 to 30, and more preferably 5 to 18, unless otherwise specified.

The number of carbon atoms of the "unsubstituted alkyl group" described in this specification is 1 to 50, preferably 1 to 20, and more preferably 1 to 6, unless otherwise specified.

The number of carbon atoms of the "unsubstituted alkenyl group" described in this specification is 2 to 50, preferably 2 to 20, and more preferably 2 to 6, unless otherwise specified.

The number of carbon atoms of the "unsubstituted alkynyl group" described in this specification is 2 to 50, preferably 2 to 20, and more preferably 2 to 6, unless otherwise specified.

The number of ring carbon atoms of the "unsubstituted cycloalkyl group" described in this specification is 3 to 50, preferably 3 to 20, and more preferably 3 to 6, unless otherwise specified.

The number of ring carbon atoms of the "unsubstituted arylene group" described in this specification is 6 to 50, preferably 6 to 30, and more preferably 6 to 18, unless otherwise specified.

The number of ring atoms of the "unsubstituted divalent heterocyclic group" described in this specification is 5 to 50, preferably 5 to 30, and more preferably 5 to 18, unless otherwise specified.

The number of carbon atoms of the "unsubstituted alkylene group" described in this specification is 1 to 50, preferably 1 to 20, and more preferably 1 to 6, unless otherwise specified.

"Substituted or Unsubstituted Aryl Group"

Specific examples of the "substituted or unsubstituted aryl group" described in this specification (specific example group G1) include the following unsubstituted aryl groups (specific example group G1A), substituted aryl groups (specific example group G1B), and the like. (Here, the unsubstituted aryl group refers to the case where the "substituted or unsubstituted aryl group" is an "aryl group unsubstituted by a substituent", and the substituted aryl group refers to the case where the "substituted or unsubstituted aryl group" is an "aryl group substituted by a substituent".). In this specification, in the case where simply referred as an "aryl group", it includes both a "unsubstituted aryl group" and a "substituted aryl group."

The "substituted aryl group" means a group in which one or more hydrogen atoms of the "unsubstituted aryl group" are substituted by a substituent. Specific examples of the "substituted aryl group" include, for example, groups in which one or more hydrogen atoms of the "unsubstituted aryl group" of the following specific example group G1A are substituted by a substituent, the substituted aryl groups of the following specific example group G1B, and the like. It should be noted that the examples of the "unsubstituted aryl group" and the examples of the "substituted aryl group" enumerated in this specification are mere examples, and the "substituted aryl group" described in this specification also includes a group in which a hydrogen atom bonded with a carbon atom of the aryl group itself in the "substituted aryl group" of the following specific group G1B is further substituted by a substituent, and a group in which a hydrogen atom of a substituent in the "substituted aryl group" of the following specific group G1B is further substituted by a substituent.

Unsubstituted Aryl Group (Specific Example Group G1A):
  a phenyl group,
  a p-biphenyl group,
  a m-biphenyl group,
  an o-biphenyl group,
  a p-terphenyl-4-yl group,
  a p-terphenyl-3-yl group,
  a p-terphenyl-2-yl group,
  a m-terphenyl-4-yl group,
  a m-terphenyl-3-yl group,
  a m-terphenyl-2-yl group,
  an o-terphenyl-4-yl group,
  an o-terphenyl-3-yl group,
  an o-terphenyl-2-yl group, a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group,
a perylenyl group, and
a monovalent aryl group derived by removing one hydrogen atom from the ring structures represented by any of the following general formulas (TEMP-1) to (TEMP-15).

(TEMP-1)
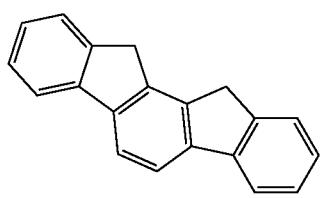

(TEMP-2)
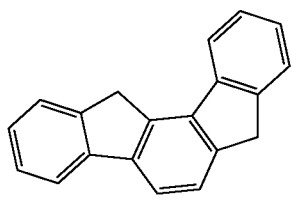

(TEMP-3)
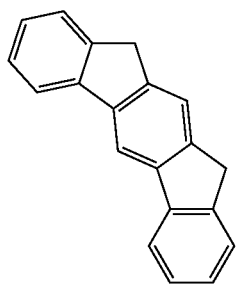

(TEMP-4)
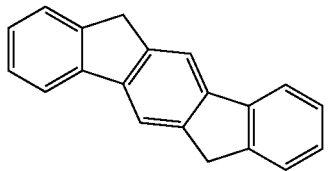

(TEMP-5)
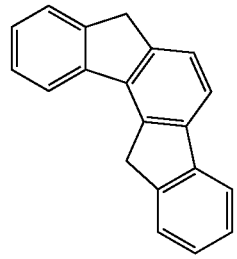

(TEMP-6)
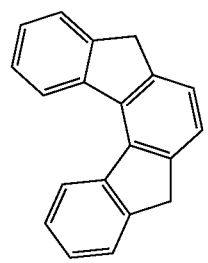

(TEMP-7)
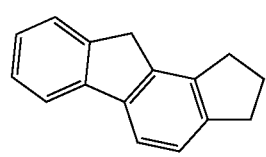

(TEMP-8)
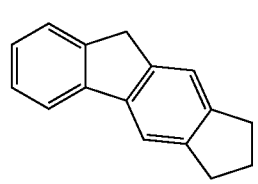

(TEMP-9)
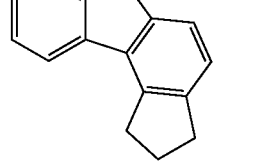

(TEMP-10)
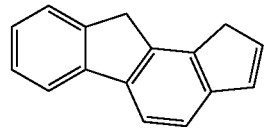

(TEMP-11)
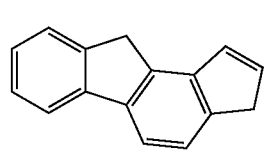

(TEMP-12)
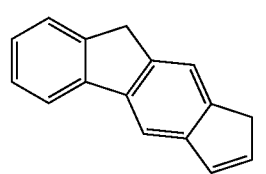

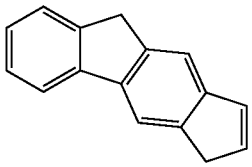
(TEMP-13)

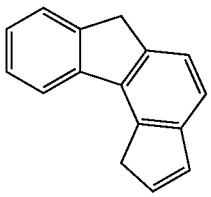
(TEMP-14)

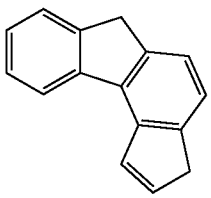
(TEMP-15)

Substituted Aryl Group (Specific Example Group G1B):
  an o-tolyl group,
  a m-tolyl group,
  a p-tolyl group,
  a p-xylyl group,
  a m-xylyl group,
  an o-xylyl group,
  a p-isopropylphenyl group,
  a m-isopropylphenyl group,
  an o-isopropylphenyl group,
  a p-t-butylphenyl group,
  a m-t-butylphenyl group,
  an o-t-butylphenyl group,
  a 3,4,5-trimethylphenyl group,
  a 9,9-dimethylfluorenyl group,
  a 9,9-diphenylfluorenyl group,
  a 9,9-bis(4-methylphenyl)fluorenyl group,
  a 9,9-bis(4-isopropylphenyl)fluorenyl group,
  a 9,9-bis(4-t-butylphenyl)fluorenyl group,
  a cyanophenyl group,
  a triphenylsilylphenyl group,
  a trimethylsilylphenyl group,
  a phenylnaphthyl group,
  a naphthylphenyl group, and
  a group in which one or more hydrogen atoms of a monovalent group derived from the ring structures represented by any of the general formulas (TEMP-1) to (TEMP-15) are substituted by a substituent.

"Substituted or Unsubstituted Heterocyclic Group"

The "heterocyclic group" described in this specification is a ring group having at least one hetero atom in the ring atom. Specific examples of the hetero atom include a nitrogen atom, an oxygen atom, a sulfur atom, a silicon atom, a phosphorus atom, and a boron atom.

The "heterocyclic group" in this specification is a monocyclic group or a fused ring group.

The "heterocyclic group" in this specification is an aromatic heterocyclic group or a non-aromatic heterocyclic group.

Specific examples of the "substituted or unsubstituted heterocyclic group" (specific example group G2) described in this specification include the following unsubstituted heterocyclic group (specific example group G2A), the following substituted heterocyclic group (specific example group G2B), and the like. (Here, the unsubstituted heterocyclic group refers to the case where the "substituted or unsubstituted heterocyclic group" is a "heterocyclic group unsubstituted by a substituent", and the substituted heterocyclic group refers to the case where the "substituted or unsubstituted heterocyclic group" is a "heterocyclic group substituted by a substituent".). In this specification, in the case where simply referred as a "heterocyclic group", it includes both the "unsubstituted heterocyclic group" and the "substituted heterocyclic group."

The "substituted heterocyclic group" means a group in which one or more hydrogen atom of the "unsubstituted heterocyclic group" are substituted by a substituent. Specific examples of the "substituted heterocyclic group" include a group in which a hydrogen atom of "unsubstituted heterocyclic group" of the following specific example group G2A is substituted by a substituent, the substituted heterocyclic groups of the following specific example group G2B, and the like. It should be noted that the examples of the "unsubstituted heterocyclic group" and the examples of the "substituted heterocyclic group" enumerated in this specification are mere examples, and the "substituted heterocyclic group" described in this specification includes groups in which hydrogen atom bonded with a ring atom of the heterocyclic group itself in the "substituted heterocyclic group" of the specific example group G2B is further substituted by a substituent, and a group in which hydrogen atom of a substituent in the "substituted heterocyclic group" of the specific example group G2B is further substituted by a substituent.

Specific example group G2A includes, for example, the following unsubstituted heterocyclic group containing a nitrogen atom (specific example group G2A1), the following unsubstituted heterocyclic group containing an oxygen atom (specific example group G2A2), the following unsubstituted heterocyclic group containing a sulfur atom (specific example group G2A3), and the monovalent heterocyclic group derived by removing one hydrogen atom from the ring structures represented by any of the following general formulas (TEMP-16) to (TEMP-33) (specific example group G2A4).

Specific example group G2B includes, for example, the following substituted heterocyclic group containing a nitrogen atom (specific example group G2B1), the following substituted heterocyclic group containing an oxygen atom (specific example group G2B2), the following substituted heterocyclic group containing a sulfur atom (specific example group G2B3), and the following group in which one or more hydrogen atoms of the monovalent heterocyclic group derived from the ring structures represented by any of the following general formulas (TEMP-16) to (TEMP-33) are substituted by a substituent (specific example group G2B4).

Unsubstituted Heterocyclic Group Containing a Nitrogen Atom (Specific Example Group G2A1):
  a pyrrolyl group,
  an imidazolyl group,
  a pyrazolyl group,
  a triazolyl group,
  a tetrazolyl group,
  an oxazolyl group,
  an isoxazolyl group,
  an oxadiazolyl group,
  a thiazolyl group, an isothiazolyl group,
a thiadiazolyl group,
a pyridyl group,
a pyridazinyl group,
a pyrimidinyl group,
a pyrazinyl group,
a triazinyl group,
an indolyl group,
an isoindolyl group,
an indolizinyl group,
a quinolizinyl group,
a quinolyl group,
an isoquinolyl group,
a cinnolyl group,
a phthalazinyl group,
a quinazolinyl group,
a quinoxalinyl group,
a benzimidazolyl group,
an indazolyl group,
a phenanthrolinyl group,
a phenanthridinyl group,
an acridinyl group,
a phenazinyl group,
a carbazolyl group,
a benzocarbazolyl group,
a morpholino group,
a phenoxazinyl group,
a phenothiazinyl group,
an azacarbazolyl group, and
a diazacarbazolyl group.

Unsubstituted Heterocyclic Group Containing an Oxygen Atom (Specific Example Group G2A2):
a furyl group,
an oxazolyl group,
an isoxazolyl group,
an oxadiazolyl group,
a xanthenyl group,
a benzofuranyl group,
an isobenzofuranyl group,
a dibenzofuranyl group,
a naphthobenzofuranyl group,
a benzoxazolyl group,
a benzisoxazolyl group,
a phenoxazinyl group,
a morpholino group,
a dinaphthofuranyl group,
an azadibenzofuranyl group,
a diazadibenzofuranyl group,
an azanaphthobenzofuranyl group, and
a diazanaphthobenzofuranyl group.

Unsubstituted Heterocyclic Group Containing a Sulfur Atom (Specific Example Group G2A3):
a thienyl group,
a thiazolyl group,
an isothiazolyl group,
a thiadiazolyl group,
a benzothiophenyl group (benzothienyl group),
an isobenzothiophenyl group (isobenzothienyl group),
a dibenzothiophenyl group (dibenzothienyl group),
a naphthobenzothiophenyl group (naphthobenzothienyl group),
a benzothiazolyl group,
a benzisothiazolyl group,
a phenothiazinyl group,
a dinaphthothiophenyl group (dinaphthothienyl group),
an azadibenzothiophenyl group (azadibenzothienyl group),
a diazadibenzothiophenyl group (diazadibenzothienyl group),
an azanaphthobenzothiophenyl group (azanaphthobenzothienyl group), and
a diazanaphthobenzothiophenyl group (diazanaphthobenzothienyl group).

Monovalent Heterocyclic Group Derived by Removing One Hydrogen Atom from the Ring Structures Represented by any of the Following General Formulas (TEMP-16) to (TEMP-33) (Specific Example Group G2A4):

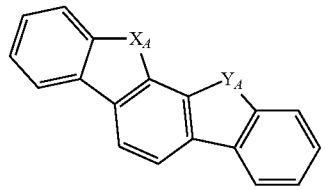

(TEMP-16)

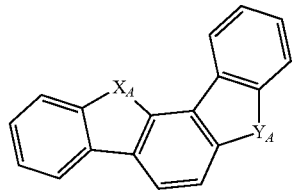

(TEMP-17)

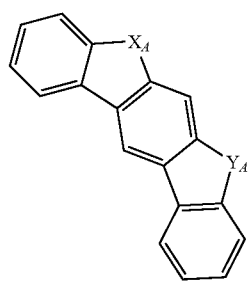

(TEMP-18)

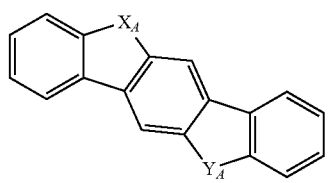

(TEMP-19)

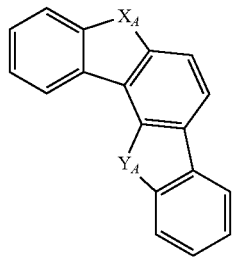

(TEMP-20)

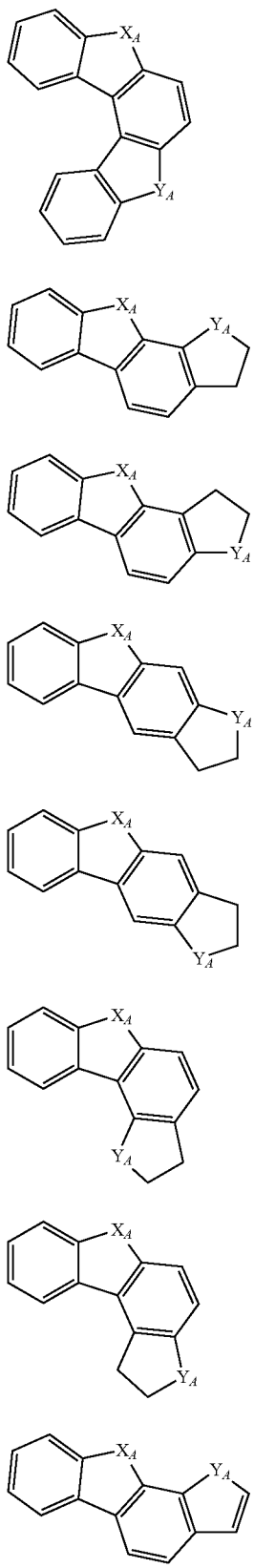

In the general formulas (TEMP-16) to (TEMP-33), $X_A$ and $Y_A$ are independently an oxygen atom, a sulfur atom, NH, or CH$_2$. Provided that at least one of $X_A$ and $Y_A$ is an oxygen atom, a sulfur atom, or NH.

In the general formulas (TEMP-16) to (TEMP-33), when at least one of $X_A$ and $Y_A$ is NH or CH$_2$, the monovalent heterocyclic group derived from the ring structures represented by any of the general formulas (TEMP-16) to (TEMP-33) includes a monovalent group derived by removing one hydrogen atom from these NH or CH$_2$.

Substituted Heterocyclic Group Containing a Nitrogen Atom (Specific Example Group G2B1):

a (9-phenyl)carbazolyl group,
a (9-biphenylyl)carbazolyl group,
a (9-phenyl)phenylcarbazolyl group,
a (9-naphthyl)carbazolyl group,
a diphenylcarbazol-9-yl group,
a phenylcarbazol-9-yl group,
a methylbenzimidazolyl group,
an ethylbenzimidazolyl group,
a phenyltiiazinyl group,
a biphenylyltriazinyl group,
a diphenyltriazinyl group,
a phenylquinazolinyl group, and
a biphenylylquinazolinyl group.

Substituted Heterocyclic Group Containing an Oxygen Atom (Specific Example Group G2B2):
- a phenyldibenzofuranyl group,
- a methyldibenzofuranyl group,
- a t-butyldibenzofuranyl group, and
- a monovalent residue of spiro[9H-xanthene-9,9'-[9H]fluorene].

Substituted Heterocyclic Group Containing a Sulfur Atom (Specific Example Group G2B3):
- a phenyldibenzothiophenyl group,
- a methyldibenzothiophenyl group,
- a t-butyldibenzothiophenyl group, and
- a monovalent residue of spiro[9H-thioxanthene-9,9'-[9H]fluorene].

Group in which One or More Hydrogen Atoms of the Monovalent Heterocyclic Group Derived from the Ring Structures Represented by any of the Following General Formulas (TEMP-16) to (TEMP-33) are Substituted by a Substituent (Specific Example Group G2B4):

The "one or more hydrogen atoms of the monovalent heterocyclic group" means one or more hydrogen atoms selected from hydrogen atoms bonded with ring carbon atoms of the monovalent heterocyclic group, a hydrogen atom bonded with a nitrogen atom when at least one of $X_A$ and $Y_A$ is NH, and hydrogen atoms of a methylene group when one of $X_A$ and $Y_A$ is $CH_2$.

"Substituted or Unsubstituted Alkyl Group"

Specific examples of the "substituted or unsubstituted alkyl group" (specific example group G3) described in this specification include the following unsubstituted alkyl groups (specific example group G3A) and the following substituted alkyl groups (specific example group G3B). (Here, the unsubstituted alkyl group refers to the case where the "substituted or unsubstituted alkyl group" is an "alkyl group unsubstituted by a substituent", and the substituted alkyl group refers to the case where the "substituted or unsubstituted alkyl group" is an "alkyl group substituted by a substituent".). In this specification, in the case where simply referred as an "alkyl group" includes both the "unsubstituted alkyl group" and the "substituted alkyl group."

The "substituted alkyl group" means a group in which one or more hydrogen atoms in the "unsubstituted alkyl group" are substituted by a substituent. Specific examples of the "substituted alkyl group" include groups in which one or more hydrogen atoms in the following "unsubstituted alkyl group" (specific example group G3A) are substituted by a substituent, the following substituted alkyl group (specific example group G3B), and the like. In this specification, the alkyl group in the "unsubstituted alkyl group" means a linear alkyl group. Thus, the "unsubstituted alkyl group" includes a straight-chain "unsubstituted alkyl group" and a branched-chain "unsubstituted alkyl group". It should be noted that the examples of the "unsubstituted alkyl group" and the examples of the "substituted alkyl group" enumerated in this specification are mere examples, and the "substituted alkyl group" described in this specification includes a group in which hydrogen atom of the alkyl group itself in the "substituted alkyl group" of the specific example group G3B is further substituted by a substituent, and a group in which hydrogen atom of a substituent in the "substituted alkyl group" of the specific example group G3B is further substituted by a substituent.

Unsubstituted Alkyl Group (Specific Example Group G3A):
- a methyl group,
- an ethyl group,
- a n-propyl group,
- an isopropyl group,
- a n-butyl group,
- an isobutyl group,
- a s-butyl group, and
- a t-butyl group.

Substituted Alkyl Group (Specific Example Group G3B):
- a heptafluoropropyl group (including isomers),
- a pentafluoroethyl group,
- a 2,2,2-trifluoroethyl group, and
- a trifluoromethyl group.

"Substituted or Unsubstituted Alkenyl Group"

Specific examples of the "substituted or unsubstituted alkenyl group" described in this specification (specific example group G4) include the following unsubstituted alkenyl group (specific example group G4A), the following substituted alkenyl group (specific example group G4B), and the like. (Here, the unsubstituted alkenyl group refers to the case where the "substituted or unsubstituted alkenyl group" is a "alkenyl group unsubstituted by a substituent", and the "substituted alkenyl group" refers to the case where the "substituted or unsubstituted alkenyl group" is a "alkenyl group substituted by a substituent."). In this specification, in the case where simply referred as an "alkenyl group" includes both the "unsubstituted alkenyl group" and the "substituted alkenyl group."

The "substituted alkenyl group" means a group in which one or more hydrogen atoms in the "unsubstituted alkenyl group" are substituted by a substituent. Specific examples of the "substituted alkenyl group" include a group in which the following "unsubstituted alkenyl group" (specific example group G4A) has a substituent, the following substituted alkenyl group (specific example group G4B), and the like. It should be noted that the examples of the "unsubstituted alkenyl group" and the examples of the "substituted alkenyl group" enumerated in this specification are mere examples, and the "substituted alkenyl group" described in this specification includes a group in which a hydrogen atom of the alkenyl group itself in the "substituted alkenyl group" of the specific example group G4B is further substituted by a substituent, and a group in which a hydrogen atom of a substituent in the "substituted alkenyl group" of the specific example group G4B is further substituted by a substituent.

Unsubstituted Alkenyl Group (Specific Example Group G4A):
- a vinyl group,
- an allyl group,
- a 1-butenyl group,
- a 2-butenyl group, and
- a 3-butenyl group.

Substituted Alkenyl Group (Specific Example Group G4B):
- a 1,3-butanedienyl group,
- a 1-methylvinyl group,
- a 1-methylallyl group,
- a 1,1-dimethylallyl group,
- a 2-methylally group, and
- a 1,2-dimethylallyl group.

"Substituted or Unsubstituted Alkynyl Group"

Specific examples of the "substituted or unsubstituted alkynyl group" described in this specification (specific example group G5) include the following unsubstituted alkynyl group (specific example group G5A) and the like. (Here, the unsubstituted alkynyl group refers to the case where the "substituted or unsubstituted alkynyl group" is an "alkynyl group unsubstituted by a substituent".). In this specification, in the case where simply referred as an "alkynyl group" includes both the "unsubstituted alkynyl group" and the "substituted alkynyl group."

The "substituted alkynyl group" means a group in which one or more hydrogen atoms in the "unsubstituted alkynyl group" are substituted by a substituent. Specific examples of the "substituted alkynyl group" include a group in which one or more hydrogen atoms in the following "unsubstituted alkynyl group" (specific example group G5A) are substituted by a substituent, and the like.

Unsubstituted Alkynyl Group (Specific Example Group G5A):
an ethynyl group.

"Substituted or Unsubstituted Cycloalkyl Group"

Specific examples of the "substituted or unsubstituted cycloalkyl group" described in this specification (specific example group G6) include the following unsubstituted cycloalkyl group (specific example group G6A), the following substituted cycloalkyl group (specific example group G6B), and the like. (Here, the unsubstituted cycloalkyl group refers to the case where the "substituted or unsubstituted cycloalkyl group" is a "cycloalkyl group unsubstituted by a substituent", and the substituted cycloalkyl group refers to the case where the "substituted or unsubstituted cycloalkyl group" is a "cycloalkyl group substituted by a substituent".). In this specification, in the case where simply referred as a "cycloalkyl group" includes both the "unsubstituted cycloalkyl group" and the "substituted cycloalkyl group."

The "substituted cycloalkyl group" means a group in which one or more hydrogen atoms in the "unsubstituted cycloalkyl group" are substituted by a substituent. Specific examples of the "substituted cycloalkyl group" include a group in which one or more hydrogen atoms in the following "unsubstituted cycloalkyl group" (specific example group G6A) are substituted by a substituent, and examples of the following substituted cycloalkyl group (specific example group G6B), and the like. It should be noted that the examples of the "unsubstituted cycloalkyl group" and the examples of the "substituted cycloalkyl group" enumerated in this specification are mere examples, and the "substituted cycloalkyl group" in this specification includes a group in which one or more hydrogen atoms bonded with the carbon atom of the cycloalkyl group itself in the "substituted cycloalkyl group" of the specific example group G6B are substituted by a substituent, and a group in which a hydrogen atom of a substituent in the "substituted cycloalkyl group" of specific example group G6B is further substituted by a substituent.

Unsubstituted Cycloalkyl Group (Specific Example Group G6A):
a cyclopropyl group,
a cyclobutyl group,
a cyclopentyl group,
a cyclohexyl group,
a 1-adamantyl group,
a 2-adamantyl group,
a 1-norbornyl group, and
a 2-norbornyl group.

Substituted Cycloalkyl Group (Specific Example Group G6B):
a 4-methylcyclohexyl group.

"Group Represented by —Si ($R_{901}$)($R_{902}$)($R_{903}$)"

Specific examples of the group represented by —Si($R_{901}$)($R_{902}$)($R_{903}$) described in this specification (specific example group G7) include:
—Si(G1)(G1)(G1),
—Si(G1)(G2)(G2),
—Si(G1)(G1)(G2),
—Si(G2)(G2)(G2),
—Si(G3)(G3)(G3), and
—Si(G6)(G6)(G6).

G1 is the "substituted or unsubstituted aryl group" described in the specific example group G1.
G2 is the "substituted or unsubstituted heterocyclic group" described in the specific example group G2.
G3 is the "substituted or unsubstituted alkyl group" described in the specific example group G3.
G6 is the "substituted or unsubstituted cycloalkyl group" described in the specific example group G6.

Plural G1's in —Si(G1)(G1)(G1) are the same or different.
Plural G2's in —Si(G1)(G2)(G2) are the same or different.
Plural G1's in —Si(G1)(G1)(G2) are the same or different.
Plural G2's in —Si(G2)(G2)(G2) are be the same or different.
Plural G3's in —Si(G3)(G3)(G3) are the same or different.
Plural G6's in —Si(G6)(G6)(G6) are be the same or different.

"Group Represented by —O—($R_{904}$)"

Specific examples of the group represented by —O—($R_{904}$) in this specification (specific example group G8) include:
—O(G1),
—O(G2),
—O(G3), and
—O(G6).

G1 is the "substituted or unsubstituted aryl group" described in the specific example group G1.
G2 is the "substituted or unsubstituted heterocyclic group" described in the specific example group G2.
G3 is the "substituted or unsubstituted alkyl group" described in the specific example group G3.
G6 is the "substituted or unsubstituted cycloalkyl group" described in the specific example group G6.

"Group Represented by —S—($R_{905}$)"

Specific examples of the group represented by —S—($R_{905}$) in this specification (specific example group G9) include:
—S(G1),
—S(G2),
—S(G3), and
—S(G6).

G1 is the "substituted or unsubstituted aryl group" described in the specific example group G1.
G2 is the "substituted or unsubstituted heterocyclic group" described in the specific example group G2.
G3 is the "substituted or unsubstituted alkyl group" described in the specific example group G3.
G6 is the "substituted or unsubstituted cycloalkyl group" described in the specific example group G6.

"Group Represented by —N($R_{906}$)($R_{907}$)"

Specific examples of the group represented by —N($R_{906}$)($R_{907}$) in this specification (specific example group G10) include:
—N(G1)(G1),
—N(G2)(G2),
—N(G1)(G2),
—N(G3)(G3), and
—N(G6)(G6).

G1 is the "substituted or unsubstituted aryl group" described in the specific example group G1.
G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —N(G1)(G1) are the same or different.
Plural G2's in —N(G2)(G2) are the same or different.
Plural G3's in —N(G3)(G3) are the same or different.
Plural G6's in —N(G6)(G6) are the same or different.

"Halogen Atom"

Specific examples of the "halogen atom" described in this specification (specific example group G11) include a fluorine atom, a chlorine atom, a bromine atom, an iodine atom, and the like.

"Substituted or Unsubstituted Fluoroalkyl Group"

The "substituted or unsubstituted fluoroalkyl group" described in this specification is a group in which at least one hydrogen atom bonded with a carbon atom constituting the alkyl group in the "substituted or unsubstituted alkyl group" is substituted by a fluorine atom, and includes a group in which all hydrogen atoms bonded with a carbon atom constituting the alkyl group in the "substituted or unsubstituted alkyl group" are substituted by a fluorine atom (a perfluoro group). The number of carbon atoms of the "unsubstituted fluoroalkyl group" is 1 to 50, preferably 1 to 30, more preferably 1 to 18, unless otherwise specified in this specification. The "substituted fluoroalkyl group" means a group in which one or more hydrogen atoms of the "fluoroalkyl group" are substituted by a substituent. The "substituted fluoroalkyl group" described in this specification also includes a group in which one or more hydrogen atoms bonded with a carbon atom of the alkyl chains in the "substituted fluoroalkyl group" are further substituted by a substituent, and a group in which one or more hydrogen atom of a substituent in the "substituted fluoroalkyl group" are further substituted by a substituent. Specific examples of the "unsubstituted fluoroalkyl group" include a group in which one or more hydrogen atoms in the "alkyl group" (specific group G3) are substituted by a fluorine atom, and the like.

"Substituted or Unsubstituted Haloalkyl Group"

The "substituted or unsubstituted haloalkyl group" described in this specification is a group in which at least one hydrogen atom bonded with a carbon atom constituting the alkyl group in the "substituted or unsubstituted alkyl group" is substituted by a halogen atom, and also includes a group in which all hydrogen atoms bonded with a carbon atom constituting the alkyl group in the "substituted or unsubstituted alkyl group" are substituted by a halogen atom. The number of carbon atoms of the "unsubstituted haloalkyl group" is 1 to 50, preferably 1 to 30, more preferably 1 to 18, unless otherwise specified in this specification. The "substituted haloalkyl group" means a group in which one or more hydrogen atoms of the "haloalkyl group" are substituted by a substituent. The "substituted haloalkyl group" described in this specification also includes a group in which one or more hydrogen atoms bonded with a carbon atom of the alkyl chain in the "substituted haloalkyl group" are further substituted by a substituent, and a group in which one or more hydrogen atoms of a substituent in the "substituted haloalkyl group" are further substituted by a substituent. Specific examples of the "unsubstituted haloalkyl group" include a group in which one or more hydrogen atoms in the "alkyl group" (specific example group G3) are substituted by a halogen atom, and the like. A haloalkyl group is sometimes referred to as an alkyl halide group.

"Substituted or Unsubstituted Alkoxy Group"

Specific examples of the "substituted or unsubstituted alkoxy group" described in this specification include a group represented by —O(G3), wherein G3 is the "substituted or unsubstituted alkyl group" described in the specific example group G3. The number of carbon atoms of the "unsubstituted alkoxy group" is 1 to 50, preferably 1 to 30, more preferably 1 to 18, unless otherwise specified in this specification.

"Substituted or Unsubstituted Alkylthio Group"

Specific examples of the "substituted or unsubstituted alkylthio group" described in this specification include a group represented by —S(G3), wherein G3 is the "substituted or unsubstituted alkyl group" described in the specific example group G3. The number of carbon atoms of the "unsubstituted alkylthio group" is 1 to 50, preferably 1 to 30, more preferably 1 to 18, unless otherwise specified in this specification.

"Substituted or Unsubstituted Aryloxy Group"

Specific examples of the "substituted or unsubstituted aryloxy group" described in this specification include a group represented by —O(G1), wherein G1 is the "substituted or unsubstituted aryl group" described in the specific example group G1. The number of ring carbon atoms of the "unsubstituted aryloxy group" is 6 to 50, preferably 6 to 30, more preferably 6 to 18, unless otherwise specified in this specification.

"Substituted or Unsubstituted Arylthio Group"

Specific examples of the "substituted or unsubstituted arylthio group" described in this specification include a group represented by —S(G1), wherein G1 is a "substituted or unsubstituted aryl group" described in the specific example group G1. The number of ring carbon atoms of the "unsubstituted arylthio group" is 6 to 50, preferably 6 to 30, more preferably 6 to 18, unless otherwise specified in this specification.

"Substituted or Unsubstituted Trialkylsilyl Group"

Specific examples of the "trialkylsilyl group" described in this specification include a group represented by —Si(G3)(G3)(G3), where G3 is the "substituted or unsubstituted alkyl group" described in the specific example group G3. Plural G3's in —Si(G3)(G3)(G3) are the same or different. The number of carbon atoms in each alkyl group of the "trialkylsilyl group" is 1 to 50, preferably 1 to 20, more preferably 1 to 6, unless otherwise specified in this specification.

"Substituted or Unsubstituted Aralkyl Group"

Specific examples of the "substituted or unsubstituted aralkyl group" described in this specification is a group represented by -(G3)-(G1), wherein G3 is the "substituted or unsubstituted alkyl group" described in the specific example group G3, and G1 is the "substituted or unsubstituted aryl group" described in the specific example group G1. Therefore, the "aralkyl group" is a group in which a hydrogen atom of the "alkyl group" is substituted by an "aryl group" as a substituent, and is one form of the "substituted alkyl group." The "unsubstituted aralkyl group" is the "unsubstituted alkyl group" substituted by the "unsubstituted aryl group", and the number of carbon atoms of the "unsubstituted aralkyl group" is 7 to 50, preferably 7 to 30, more preferably 7 to 18, unless otherwise specified in this specification.

Specific examples of the "substituted or unsubstituted aralkyl group" include a benzyl group, a 1-phenylethyl group, a 2-phenylethyl group, a 1-phenylisopropyl group, a 2-phenylisopropyl group, a phenyl-t-butyl group, an a-naphthylmethyl group, a 1-a-naphthylethyl group, a 2-a-naphthylethyl group, a 1-a-naphthylisopropyl group, a 2-a-naphthylisopropyl group, a p-naphthylmethyl group, a 1-p- naphthylethyl group, a 2-p-naphthylethyl group, a 1-p-naphthylisopropyl group, a 2-p-naphthylisopropyl group, and the like.

Unless otherwise specified in this specification, examples of the substituted or unsubstituted aryl group described in this specification preferably include a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, 9,9-dimethylfluorenyl group, 9,9-diphenylfluorenyl group, and the like.

Unless otherwise specified in this specification, examples of the substituted or unsubstituted heterocyclic groups described in this specification preferably include a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl)carbazolyl group, a (9-phenyl)phenylcarbazolyl group, a diphenylcarbazol-9-yl group, a phenylcarbazol-9-yl group, a phenyltriazinyl group, a biphenylyltriazinyl group, a diphenyltriazinyl group, a phenyldibenzofuranyl group, a phenyldibenzothiophenyl group, and the like.

In this specification, the carbazolyl group is specifically any of the following groups, unless otherwise specified in this specification.

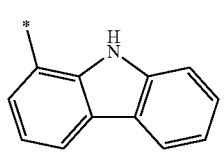

(TEMP-Cz1)

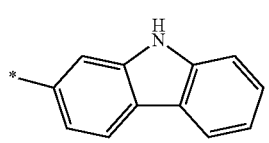

(TEMP-Cz2)

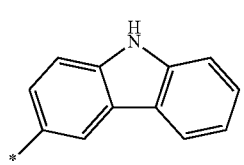

(TEMP-Cz3)

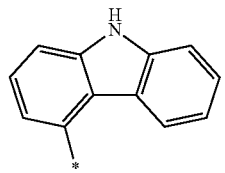

(TEMP-Cz4)

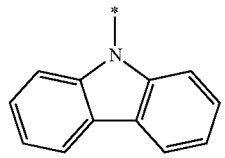

(TEMP-Cz5)

In this specification, the (9-phenyl)carbazolyl group is specifically any of the following groups, unless otherwise specified in this specification.

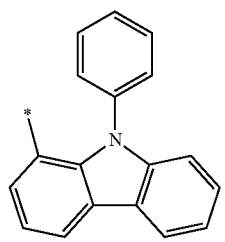

(TEMP-Cz6)

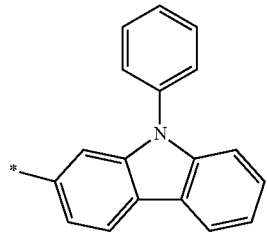

(TEMP-Cz7)

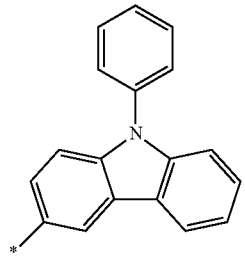

(TEMP-Cz8)

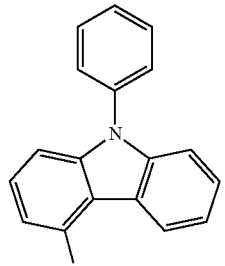

(TEMP-Cz9)

In the general formulas (TEMP-Cz1) to (TEMP-Cz9), * represents a bonding position.

In this specification, the dibenzofuranyl group and the dibenzothiophenyl group are specifically any of the following groups, unless otherwise specified in this specification.

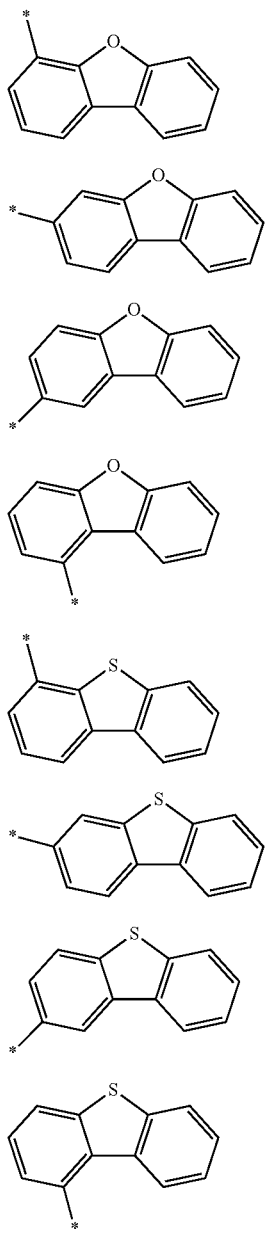

(TEMP-34)

(TEMP-35)

(TEMP-36)

(TEMP-37)

(TEMP-38)

(TEMP-39)

(TEMP-40)

(TEMP-41)

In the general formulas (TEMP-34) to (TEMP-41), * represents a bonding position.

The substituted or unsubstituted alkyl group described in this specification is preferably a methyl group, an ethyl group, a propyl group, an isopropyl group, a n-butyl group, an isobutyl group, a t-butyl group, or the like, unless otherwise specified in this specification.

"Substituted or Unsubstituted Arylene Group"

The "substituted or unsubstituted arylene group" described in this specification is a divalent group derived by removing one hydrogen atom on the aryl ring of the "substituted or unsubstituted aryl group", unless otherwise specified. Specific examples of the "substituted or unsubstituted arylene group" (specific example group G12) include a divalent group derived by removing one hydrogen atom on the aryl ring of the "substituted or unsubstituted aryl group" described in the specific example group G1, and the like.

"Substituted or Unsubstituted Divalent Heterocyclic Group"

The "substituted or unsubstituted divalent heterocyclic group" described in this specification is a divalent group derived by removing one hydrogen atom on the heterocyclic ring of the "substituted or unsubstituted heterocyclic group", unless otherwise specified. Specific examples of the "substituted or unsubstituted divalent heterocyclic group" (specific example group G13) include a divalent group derived by removing one hydrogen atom on the heterocyclic ring of the "substituted or unsubstituted heterocyclic group" described in the specific example group G2, and the like.

"Substituted or Unsubstituted Alkylene Group"

The "substituted or unsubstituted alkylene group" described in this specification is a divalent group derived by removing one hydrogen atom on the alkyl chain of the "substituted or unsubstituted alkyl group", unless otherwise specified. Specific examples of the "substituted or unsubstituted alkylene group" (specific example group G14) include a divalent group derived by removing one hydrogen atom on the alkyl chain of the "substituted or unsubstituted alkyl group" described in the specific example group G3, and the like.

The substituted or unsubstituted arylene group described in this specification is preferably any group of the following general formulas (TEMP-42) to (TEMP-68), unless otherwise specified in this specification.

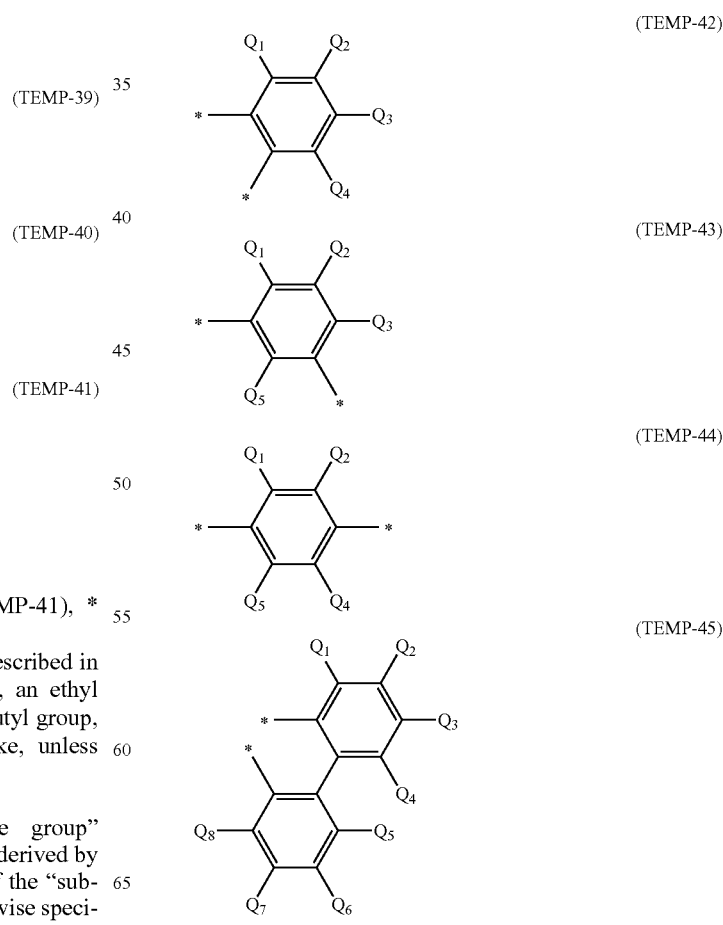

(TEMP-42)

(TEMP-43)

(TEMP-44)

(TEMP-45)

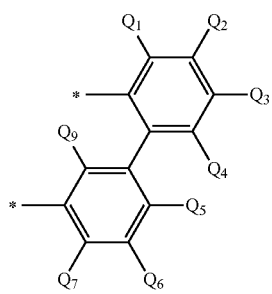
(TEMP-46)
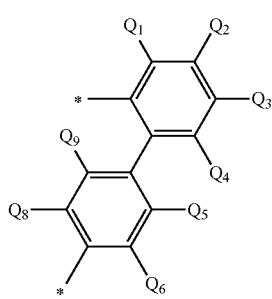
(TEMP-47)
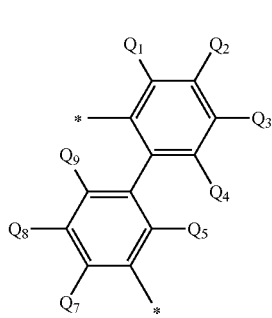
(TEMP-48)
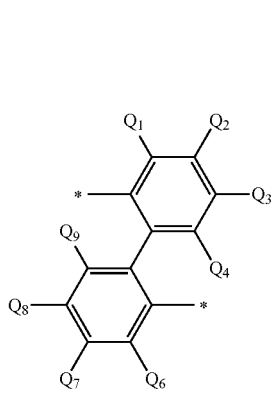
(TEMP-49)
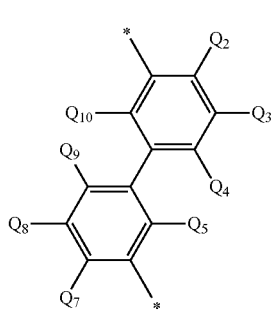
(TEMP-50)
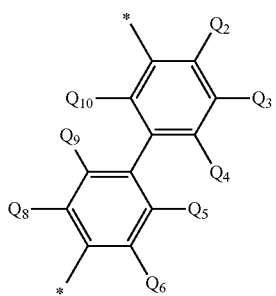
(TEMP-51)
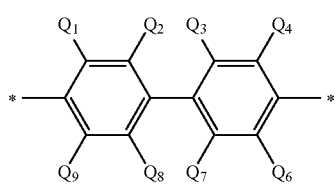
(TEMP-52)
In the general formulas (TEMP-42) to (TEMP-52), $Q_1$ to $Q_{10}$ are independently a hydrogen atom or a substituent.
In the general formulas (TEMP-42) to (TEMP-52), * represents a bonding position.
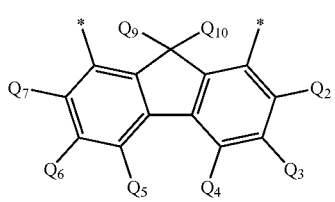
(TEMP-53)
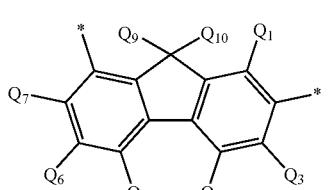
(TEMP-54)
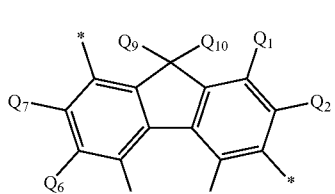
(TEMP-55)
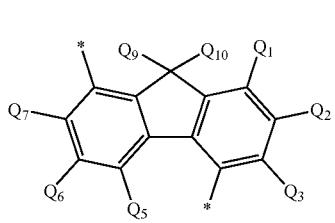
(TEMP-56)

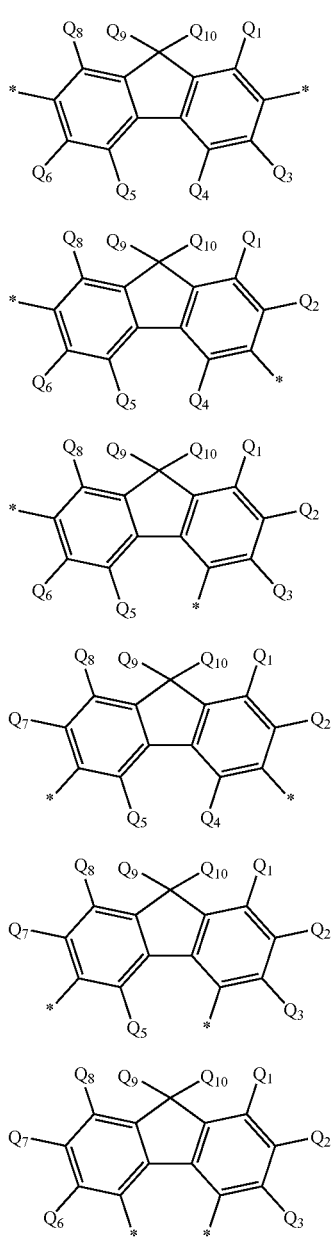

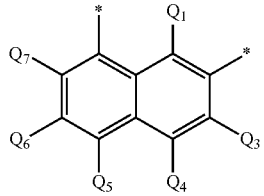
(TEMP-64)

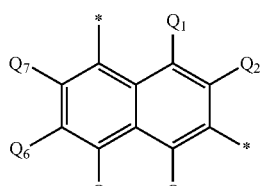
(TEMP-65)

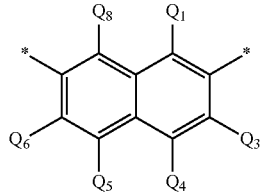
(TEMP-66)

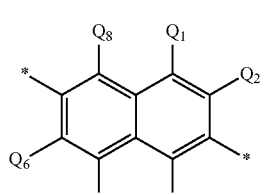
(TEMP-67)

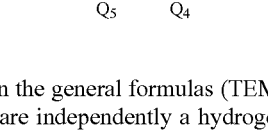
(TEMP-68)

In the general formulas (TEMP-53) to (TEMP-62), $Q_1$ to $Q_{10}$ are independently a hydrogen atom or a substituent.

$Q_9$ and $Q_{10}$ may be bonded With each other via a single bond to form a ring.

In the general formulas (TEMP-53) to (TEMP-62), * represents a bonding position.

In the general formulas (TEMP-63) to (TEMP-68), $Q_1$ to $Q_8$ are independently a hydrogen atom or a substituent.

In the general formulas (TEMP-63) to (TEMP-68), * represents a bonding position.

The substituted or unsubstituted divalent heterocyclic group described in this specification is preferably any group of the following general formulas (TEMP-69) to (TEMP-102), unless otherwise specified in this specification.

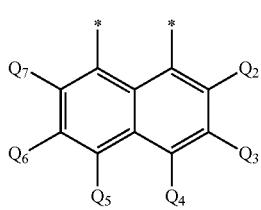
(TEMP-63)

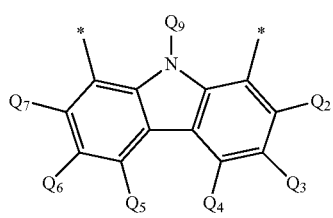
(TEMP-69)

(TEMP-70)
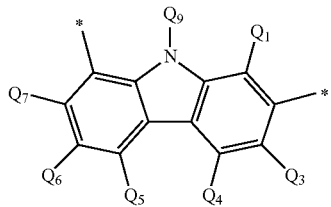
(TEMP-71)
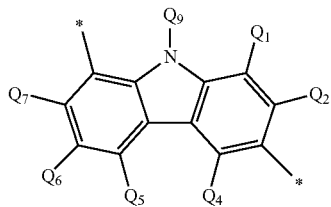
(TEMP-72)
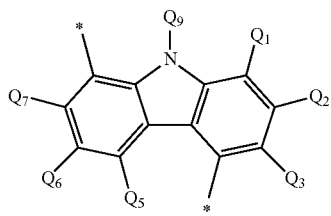
(TEMP-73)
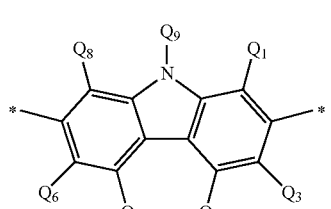
(TEMP-74)
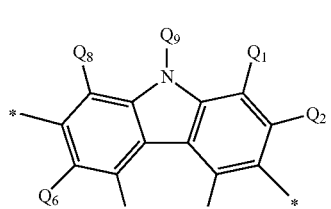
(TEMP-75)
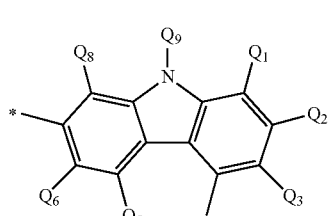
(TEMP-76)
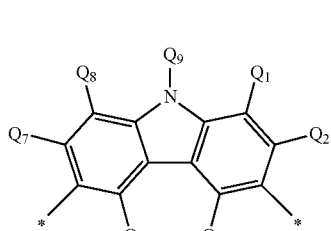
(TEMP-77)
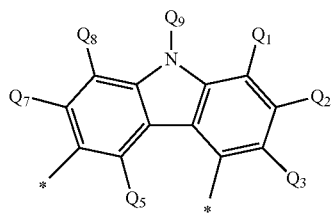
(TEMP-78)
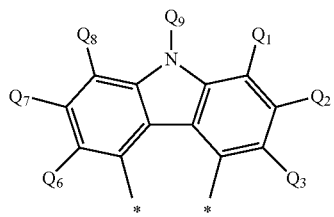
(TEMP-79)
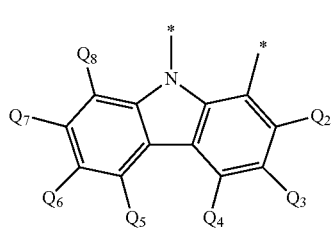
(TEMP-80)
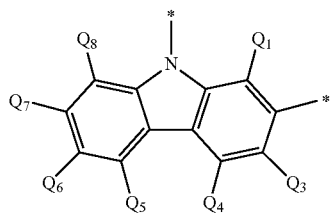
(TEMP-81)
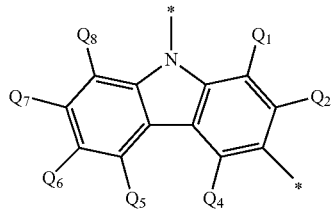
(TEMP-82)
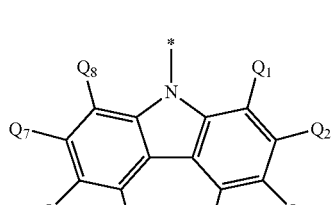
In the general formulas (TEMP-69) to (TEMP-82), $Q_1$ to $Q_9$ are independently a hydrogen atom or a substituent.

(TEMP-83)
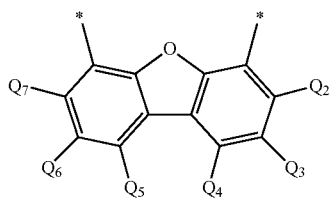
(TEMP-84)
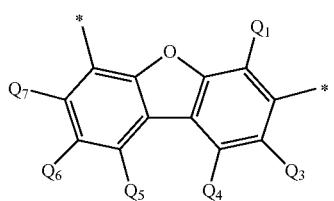
(TEMP-85)
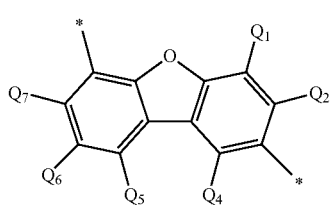
(TEMP-86)
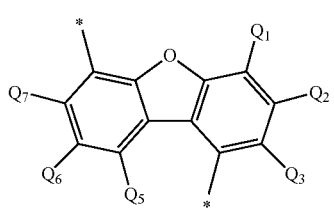
(TEMP-87)
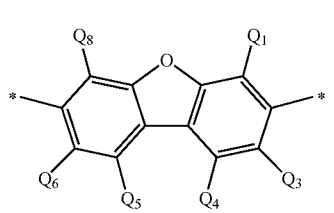
(TEMP-88)
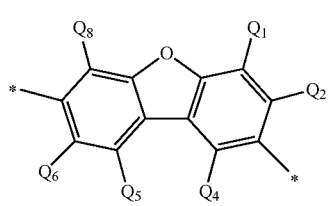
(TEMP-89)
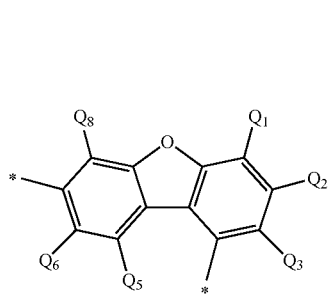
-continued
(TEMP-90)
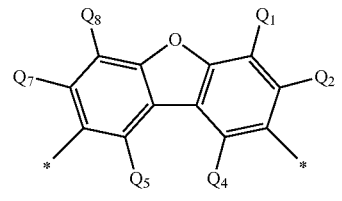
(TEMP-91)
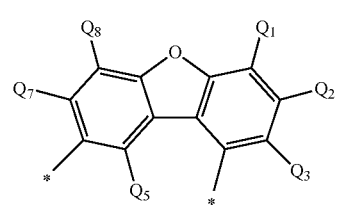
(TEMP-92)
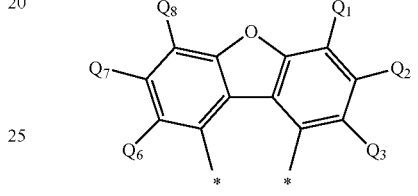
(TEMP-93)
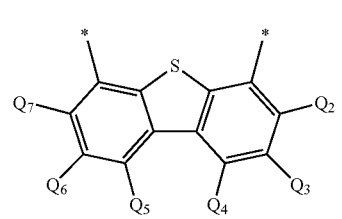
(TEMP-94)
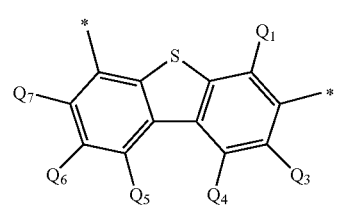
(TEMP-95)
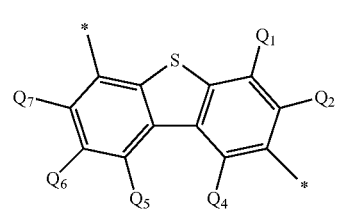
(TEMP-96)
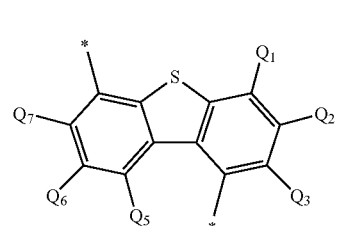

-continued

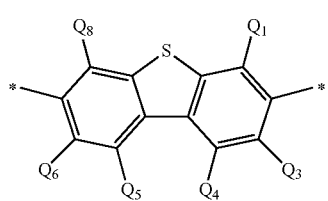
(TEMP-97)

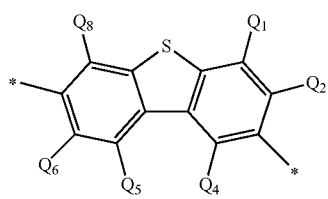
(TEMP-98)

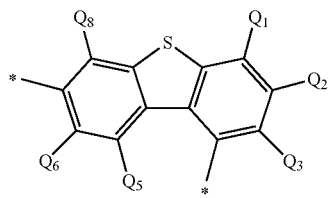
(TEMP-99)

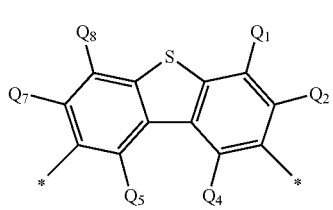
(TEMP-100)

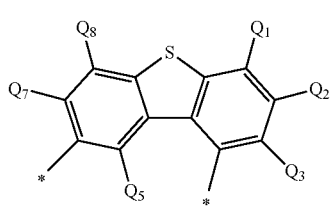
(TEMP-101)

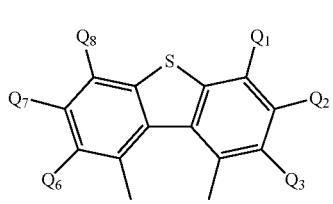
(TEMP-102)

In the general formulas (TEMP-83) to (TEMP-102), $Q_1$ to $Q_8$ are independently a hydrogen atom or a substituent.

The above is the explanation of the "Substituent described in this specification."

"The Case where Bonded with Each Other to Form a Ring"

In this specification, the case where "one or more sets of adjacent two or more form a substituted or unsubstituted monocycle by bonding with each other, form a substituted or unsubstituted fused ring by bonding with each other, or do not bond with each other" means the case where "one or more sets of adjacent two or more form a substituted or unsubstituted monocycle by bonding with each other"; the case where "one or more sets of adjacent two or more form a substituted or unsubstituted fused ring by bonding with each other"; and the case where "one or more sets of adjacent two or more do not bond with each other."

The case where "one or more sets of adjacent two or more form a substituted or unsubstituted monocycle by bonding with each other" and the case where "one or more sets of adjacent two or more form a substituted or unsubstituted fused ring by bonding with each other" in this specification (these cases may be collectively referred to as "the case where forming a ring by bonding with each other") will be described below. The case of an anthracene compound represented by the following general formula (TEMP-103) in which the mother skeleton is an anthracene ring will be described as an example.

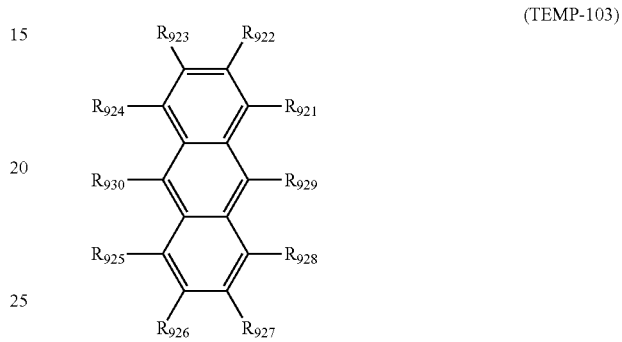
(TEMP-103)

For example, in the case where "one or more sets of adjacent two or more among $R_{921}$ to $R_{930}$ form a ring by bonding with each other", the one set of adjacent two includes a pair of $R_{921}$ and $R_{922}$, a pair of $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, and a pair of $R_{929}$ and $R_{921}$.

The "one or more sets" means that two or more sets of the adjacent two or more sets may form a ring at the same time. For example, $R_{921}$ and $R_{922}$ form a ring $Q_A$ by bonding with each other, and at the same, time $R_{925}$ and $R_{926}$ form a ring $Q_B$ by bonding with each other, the anthracene compound represented by the general formula (TEMP-103) is represented by the following general formula (TEMP-104).

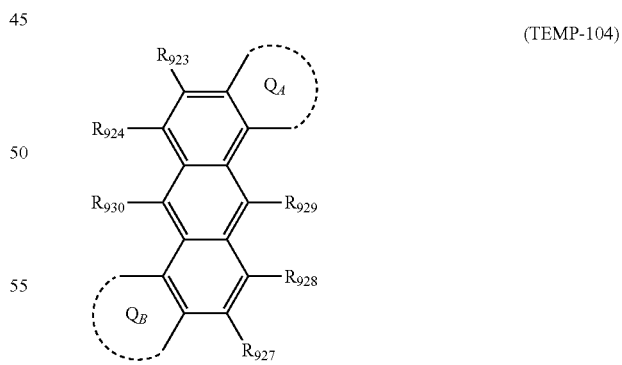
(TEMP-104)

The case where the "set of adjacent two or more" form a ring includes not only the case where the set (pair) of adjacent "two" is bonded with as in the above-mentioned examples, but also the case where the set of adjacent "three or more" are bonded with each other. For example, it means the case where $R_{921}$ and $R_{922}$ form a ring $Q_A$ by bonding with each other, and $R_{922}$ and $R_{923}$ form a ring $Q_C$ by bonding with each other, and adjacent three ($R_{921}$, $R_{922}$ and $R_{923}$) form rings by bonding with each other and together fused to the anthracene mother skeleton. In this case, the anthracene compound represented by the general formula (TEMP-103) is represented by the following general formula (TEMP-105). In the following general formula (TEMP-105), the ring $Q_A$ and the ring $Q_C$ share $R_{922}$.

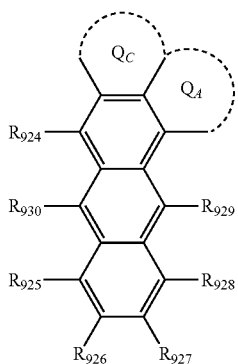

(TEMP-105)

The "monocycle" or "fused ring" formed may be a saturated ring or an unsaturated ring, as a structure of the formed ring alone. Even when the "one pair of adjacent two" forms a "monocycle" or a "fused ring", the "monocycle" or the "fused ring" may form a saturated ring or an unsaturated ring. For example, the ring $Q_A$ and the ring $Q_B$ formed in the general formula (TEMP-104) are independently a "monocycle" or a "fused ring." The ring $Q_A$ and the ring $Q_C$ formed in the general formula (TEMP-105) are "fused ring." The ring $Q_A$ and ring $Q_C$ of the general formula (TEMP-105) are fused ring by fusing the ring $Q_A$ and the ring $Q_C$ together. When the ring $Q_A$ of the general formula (TMEP-104) is a benzene ring, the ring $Q_A$ is a monocycle. When the ring $Q_A$ of the general formula (TMEP-104) is a naphthalene ring, the ring $Q_A$ is a fused ring.

The "unsaturated ring" means an aromatic hydrocarbon ring or an aromatic heterocyclic ring. The "saturated ring" means an aliphatic hydrocarbon ring, or a non-aromatic heterocyclic ring.

Specific examples of the aromatic hydrocarbon ring include a structure in which the group listed as a specific example in the specific example group G1 is terminated by a hydrogen atom.

Specific examples of the aromatic heterocyclic ring include a structure in which the aromatic heterocyclic group listed as a specific example in the example group G2 is terminated by a hydrogen atom.

Specific examples of the aliphatic hydrocarbon ring include a structure in which the group listed as a specific example in the specific example group G6 is terminated by a hydrogen atom.

The term "to form a ring" means forming a ring only with plural atoms of the mother skeleton, or with plural atoms of the mother skeleton and one or more arbitrary elements in addition. For example, the ring $Q_A$ shown in the general formula (TEMP-104), which is formed by bonding $R_{921}$ and $R_{922}$ with each other, is a ring formed from the carbon atom of the anthracene skeleton with which $R_{921}$ is bonded, the carbon atom of the anthracene skeleton with which $R_{922}$ is bonded, and one or more arbitrary elements. For example, in the case where the ring $Q_A$ is formed with $R_{921}$ and $R_{922}$, when a monocyclic unsaturated ring is formed with the carbon atom of the anthracene skeleton with which $R_{921}$ is bonded, the carbon atom of the anthracene skeleton with which $R_{922}$ is bonded, and four carbon atoms, the ring formed with $R_{921}$ and $R_{922}$ is a benzene ring.

Here, the "arbitrary element" is preferably at least one element selected from the group consisting of a carbon element, a nitrogen element, an oxygen element, and a sulfur element, unless otherwise specified in this specification. In the arbitrary element (for example, a carbon element or a nitrogen element), a bond which does not form a ring may be terminated with a hydrogen atom or the like, or may be substituted with "arbitrary substituent" described below. When an arbitrary element other than a carbon element is contained, the ring formed is a heterocyclic ring.

The number of "one or more arbitrary element(s)" constituting a monocycle or a fused ring is preferably 2 or more and 15 or less, more preferably 3 or more and 12 or less, and still more preferably 3 or more and 5 or less, unless otherwise specified in this specification.

The "monocycle" is preferable among the "monocycle" and the "fused ring", unless otherwise specified in this specification.

The "unsaturated ring" is preferable among the "saturated ring" and the "unsaturated ring", unless otherwise specified in this specification.

Unless otherwise specified in this specification, the "monocycle" is preferably a benzene ring.

Unless otherwise specified in this specification, the "unsaturated ring" is preferably a benzene ring.

Unless otherwise specified in this specification, when "one or more sets of adjacent two or more" are "bonded with each other to form a substituted or unsubstituted monocycle" or "bonded with each other to form a substituted or unsubstituted fused ring", this specification, one or more sets of adjacent two or more are preferably bonded with each other to form a substituted or unsubstituted "unsaturated ring" from plural atoms of the mother skeleton and one or more and 15 or less elements which is at least one kind selected from a carbon elements, a nitrogen element, an oxygen element, and a sulfur element.

The substituent in the case where the above-mentioned "monocycle" or "fused ring" has a substituent is, for example, an "arbitrary substituent" described below. Specific examples of the substituent which the above-mentioned "monocycle" or "fused ring" has include the substituent described above in the "Substituent described in this specification" section.

The substituent in the case where the above-mentioned "saturated ring" or "unsaturated ring" has a substituent is, for example, an "arbitrary substituent" described below. Specific examples of the substituent which the above-mentioned "monocycle" or "fused ring" has include the substituent described above in the "Substituent described in this specification" section.

The foregoing describes the case where "one or more sets of adjacent two or more form a substituted or unsubstituted monocycle by bonding with each other" and the case where "one or more sets of adjacent two or more form a substituted or unsubstituted fused ring by bonding with each other" (the case where "forming a ring by bonding with each other").

Substituent in the Case of "Substituted or Unsubstituted"

In one embodiment in this specification, the substituent (in this specification, sometimes referred to as an "arbitrary substituent") in the case of "substituted or unsubstituted" is, for example, a group selected from the group consisting of:
an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, and an unsubstituted heterocyclic group including 5 to 50 ring atoms, wherein, $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted heterocyclic group including 5 to 50 ring atoms.

When two or more $R_{901}$'s are present, the two or more $R_{901}$'s may be the same or different.

When two or more $R_{902}$'s are present, the two or more $R_{902}$'s may be the same or different.

When two or more $R_{903}$'s are present, the two or more $R_{903}$'s may be the same or different.

When two or more $R_{904}$'s are present, the two or more $R_{904}$'s may be the same or different.

When two or more $R_{905}$'s are present, the two or more $R_{905}$'s may be the same or different.

When two or more $R_{906}$'s are present, the two or more $R_{906}$'s may be the same or different.

When two or more $R_{907}$'s are present, the two or more $R_{907}$'s may be the same or different.

In one embodiment, the substituent in the case of "substituted or unsubstituted" is a group selected from the group consisting of:

an alkyl group including 1 to 50 carbon atoms, an aryl group including 6 to 50 ring carbon atoms, and a heterocyclic group including 5 to 50 ring atoms.

In one embodiment, the substituent in the case of "substituted or unsubstituted" is a group selected from the group consisting of:

an alkyl group including 1 to 18 carbon atoms, an aryl group including 6 to 18 ring carbon atoms, and a heterocyclic group including 5 to 18 ring atoms.

Specific examples of each of the arbitrary substituents include specific examples of substituent described in the section "Substituent described in this specification" above.

Unless otherwise specified in this specification, adjacent arbitrary substituents may form a "saturated ring" or an "unsaturated ring", preferably form a substituted or unsubstituted saturated 5-membered ring, a substituted or unsubstituted saturated 6-membered ring, a substituted or unsubstituted unsaturated 5-membered ring, or a substituted or unsubstituted unsaturated 6-membered ring, more preferably form a benzene ring.

Unless otherwise specified in this specification, the arbitrary substituent may further have a substituent. The substituent which the arbitrary substituent further has is the same as that of the above-mentioned arbitrary substituent.

In this specification, the numerical range represented by "AA to BB" means the range including the numerical value AA described on the front side of "AA to BB" as the lower limit and the numerical value BB described on the rear side of "AA to BB" as the upper limit.

[Organic Electroluminescence Device]

The organic EL device according to an aspect of the invention is an organic electroluminescence device containing a cathode, an anode, and an organic layer disposed between the cathode and the anode, wherein the organic layer comprises an emitting layer, a first layer, and a second layer, the first layer is disposed between the anode and the emitting layer, the second layer is disposed between the anode and the first layer, the first layer comprises a first hole-transporting material, and a second hole-transporting material, and the second layer contains an acceptor material having an affinity value in the range of 3.8 to 6.0 eV, and at least one hole-transporting material.

When the first layer contains a first hole-transporting material and a second hole-transporting material, and the second layer contains an acceptor material having an affinity value in a predetermined range and one or more hole-transporting material, an organic EL device having low drive-voltage, high luminous efficiency, and significantly improved lifetime is obtained.

Here, the one or more hole-transporting materials used in the second layer may be the same compound as or different compound from the first hole-transporting material and the second hole-transporting material used in the first layer.

In one embodiment, the second layer contains the acceptor material and two or more hole-transporting materials.

In one embodiment, one or more hole-transporting materials used in the second layer are selected from the first hole-transporting material or the second hole-transporting material used in the first layer.

In one embodiment, the two or more hole-transporting materials used in the second layer are independently selected from the first hole-transporting material and the second hole-transporting material used in the first layer.

In one embodiment, the two or more hole-transporting materials used in the second layer are the same as the first hole-transporting material and the second hole-transporting material used in the first layer, respectively.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The acceptor materials contained in the second layer may be used alone or in combination of two or more thereof.

Each of the first hole-transporting material and the second hole-transporting material contained in the first layer may be used alone or in combination of two or more thereof.

When two or more kinds of hole-transporting materials are used in the second layer and are the first hole-transporting material and the second hole-transporting material, each of the first hole-transporting material and the second hole-transporting material may be used alone or in combination of two or more thereof.

[Acceptor Material]

The acceptor material used in the second layer of the organic EL device of an aspect of the invention is a compound having an affinity value in the range of 3.8 to 6.0 eV. The affinity value of the acceptor material is preferably larger than 3.8 eV, more preferably larger than 4.2 eV, and still more preferably larger than 5.0 eV The affinity value of the acceptor material is determined by the method described in Examples.

The concentration of the acceptor material in the second layer should be adjusted as appropriate depending on the application of the resulting organic EL device, and is within the range of 0.5 to 10% by mass, preferably within the range of 0.7 to 8% by mass, and more preferably within the range of 0.9 to 6% by mass.

For example, when an organic EL device is used in a portable terminal or the like having a relatively small screen size, the concentration of the acceptor material is relatively low, and is within the range of 0.5 to 3% by mass, preferably 0.9 to 1.5% by mass. When an organic EL device is used for a television screen or the like having a large screen size, the concentration of the acceptor material is within a range of 3 to 20% by mass, preferably 4 to 8% by mass.

As the concentration of acceptor material increases, hole-injecting property increases, and the effect of extending lifetime can be expected. In addition, when a screen of a portable device is compared with a television screen or the like, a distance between pixels on the screen of the portable device is narrower. Therefore, in the portable device, when the acceptor material is used at a high concentration, there is a possibility that a lateral leak phenomenon of emission occurs, and therefore, in the portable terminal, the dope concentration is preferably low.

In one embodiment, the acceptor material is one or more compounds selected from the group consisting of a compound represented by the formula (21) described later and a compound having a ring structure represented by the formula (31) described later.

<Compound Represented by the Formula (21)>

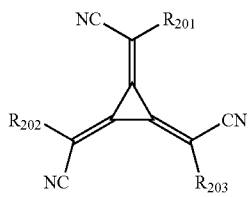

(21)

In the formula (21), $R_{201}$ to $R_{203}$ are independently an unsubstituted aryl group including 6 to 50 ring carbon atoms, an unsubstituted monovalent heterocyclic group including 5 to 50 ring atoms, an aryl group including 6 to 50 ring carbon atoms substituted with one or more electron acceptor groups, or a monovalent heterocyclic group including 5 to 50 ring atoms substituted with one or more electron acceptor groups.

In one embodiment, the acceptor material is the compound represented by the formula (21), and the electron acceptor group is one or more selected from the group consisting of a cyano group,
a fluoro group,
a trifluoromethyl group,
a chloro group, and
a bromo group.

In one embodiment, the acceptor material is a compound represented by the formula (21); and $R_{201}$ is an aryl group including 6 to 50 ring carbon atoms having either or both of a cyano group and a fluoro group as the electron acceptor group.

Specific examples of the compound represented by the formula (21) will be described below, and these are merely examples, and the compound represented by the formula (21) is not limited to the following specific examples.

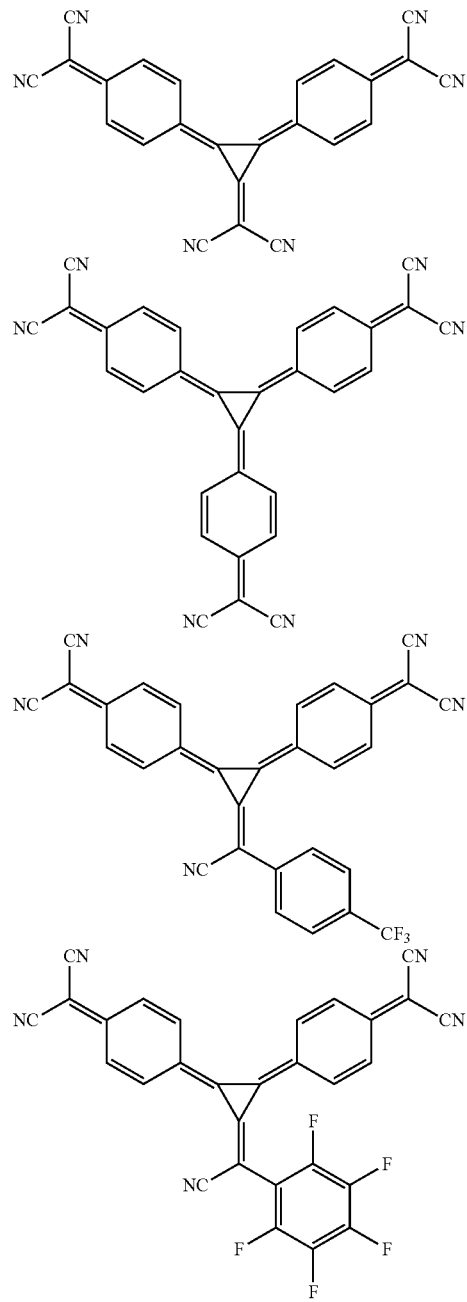

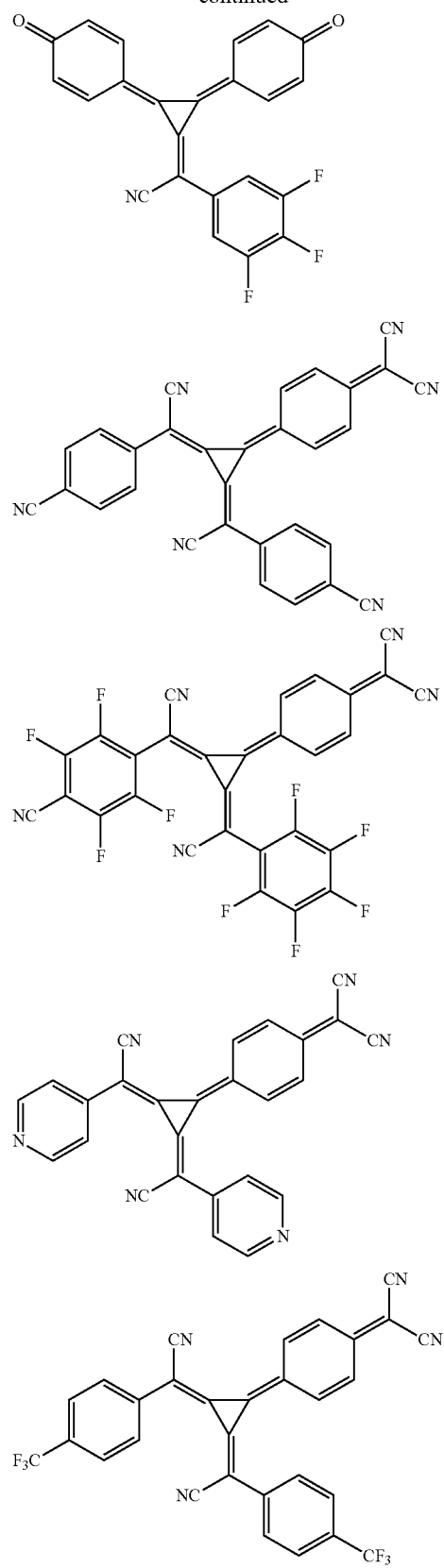
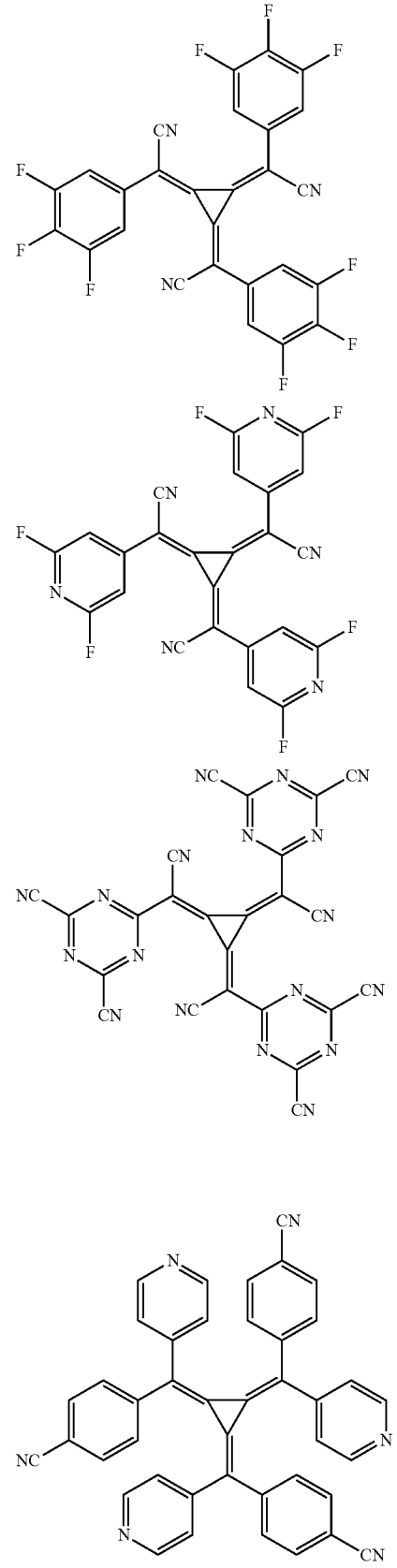

-continued

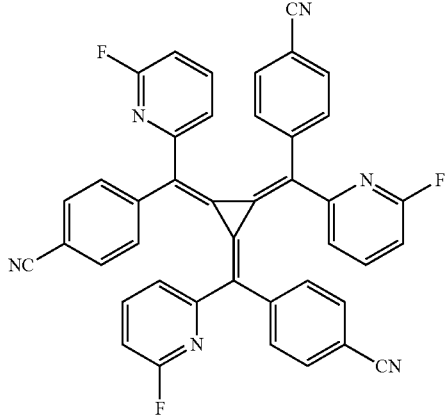

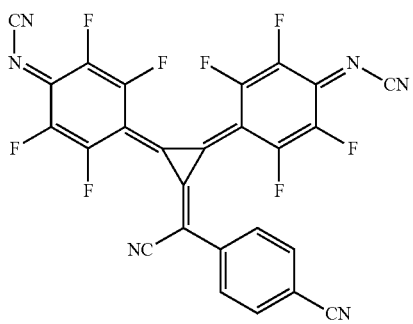

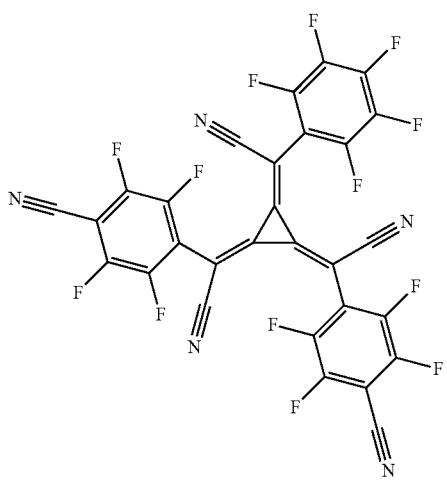

In one embodiment, the acceptor material is a compound represented by the formula (21); and
the compound represented by the formula (21) is a compound represented by the following formula (22):

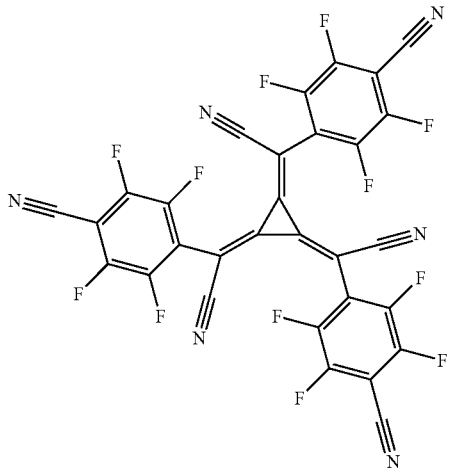

(22)

<Compound Represented by the Formula (31)>

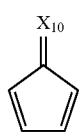

(31)

The ring structure represented by the formula (31) is fused with at least one ring structure of a substituted or unsubstituted aromatic hydrocarbon ring including 6 to 50 ring carbon atoms and a substituted or unsubstituted heterocycle including 5 to 50 ring atoms in the molecule of the compound;

the structure represented by $=X_{10}$ is selected from the group consisting of groups represented by any one of the following formulas (31-1a) to (31-1m):

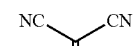

(31-1a)

(31-1b)

(31-1c)

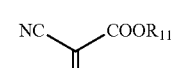

(31-1d)

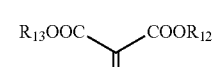

(31-1e)

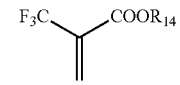

(31-1f)

-continued

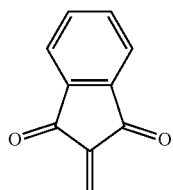 (31-1g)

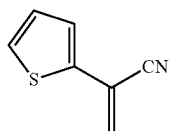 (31-1h)

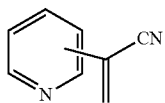 (31-1i)

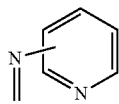 (31-1j)

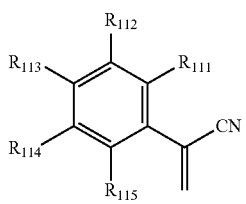 (31-1k)

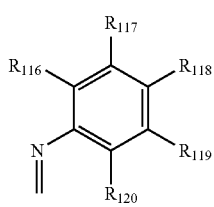 (31-1m)

wherein in the formula (31-1a) to (31-1m),
$R_{11}$ to $R_{14}$, and $R_{111}$ to $R_{120}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms.

$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{901}$ to $R_{907}$ are present, the two or more of each of $R_{901}$ to $R_{907}$ may be the same as or different from each other.

In one embodiment, the acceptor material is a compound represented by the formula (31), and
the compound having the ring structure represented by the formula (31) is a compound having a ring structure represented by the following formula (31A):

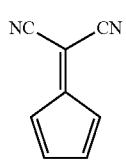 (31A)

the ring structure represented by the formula (31A) is fused with a ring structure of at least one of a substituted or unsubstituted aromatic hydrocarbon ring including 6 to 50 ring carbon atoms and a substituted or unsubstituted heterocycle including 5 to 50 ring atoms in a molecule of the compound.

In one embodiment, the substituent of the "substituted or unsubstituted" in the formulas (31) and (31A) is selected from
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, and
a substituted or unsubstituted monovalent heterocyclic group including 5 to 50 ring atoms, wherein
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{901}$ to $R_{907}$ are present, the two or more of each of $R_{901}$ to $R_{907}$ may be the same as or different from each other.

In one embodiment, the compound having the ring structure represented by the formula (31A) is one or more compounds selected from the group consisting of a compound represented by the following formula (32), a compound represented by the following formula (33), a compound represented by the following formula (34), a compound represented by the following formula (35), and a compound represented by the following formula (36).

(32)

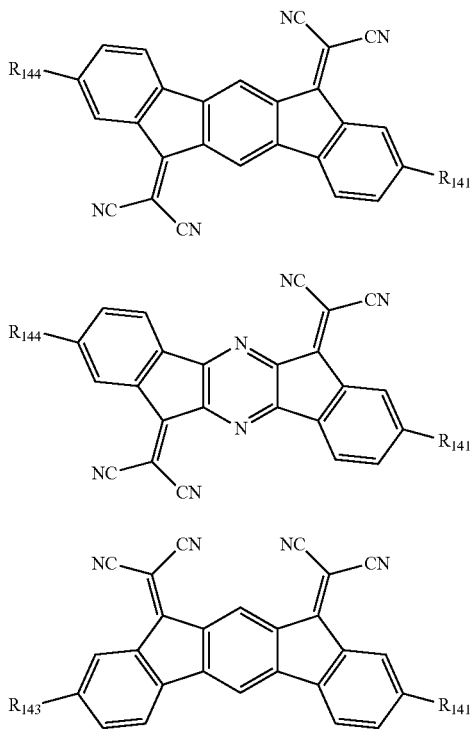

(33)

(34)

(35)

(36)

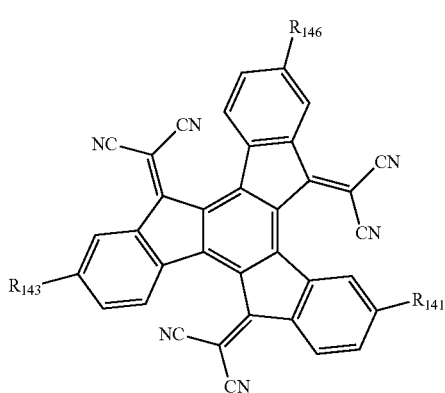

In the formulas (32) to (36), $R_{141}$, $R_{143}$, $R_{144}$, and $R_{146}$ are independently a fluorine atom, a fluoroalkyl group including 1 to 50 carbon atoms, a fluoroalkoxy group including 1 to 50 carbon atoms, a cyano group, an aromatic hydrocarbon group including 6 to 50 ring carbon atoms substituted with at least one selected from the group consisting of a fluorine atom, a fluoroalkyl group including 1 to 50 carbon atoms, a fluoroalkoxy group including 1 to 50 carbon atoms, and a cyano group, or a heterocyclic group including 5 to 30 ring atoms substituted with at least one selected from the group consisting of a fluorine atom, a fluoroalkyl group including 1 to 50 carbon atoms, a fluoroalkoxy group including 1 to 50 carbon atoms, and a cyano group.

In one embodiment, the acceptor material is the compound represented by the formula (31), and the compound having the ring structure represented by the formula (31) is the compound represented by the formula (34).

In one embodiment, the compound represented by the formula (34) is a compound represented by the following formula (34A).

(34A)

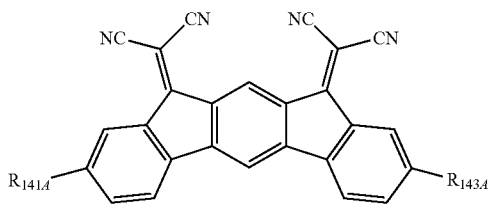

In the formula (34A), $R_{141A}$ and $R_{143A}$ are independently a fluorine atom, a fluoroalkyl group including 1 to 50 carbon atoms, a fluoroalkoxy group including 1 to 50 carbon atoms, or a cyano group.

Specific examples of the compound represented by the formula (31) will be described below, and these are merely examples, and the compound represented by the formula (31) is not limited to the following specific examples.

47
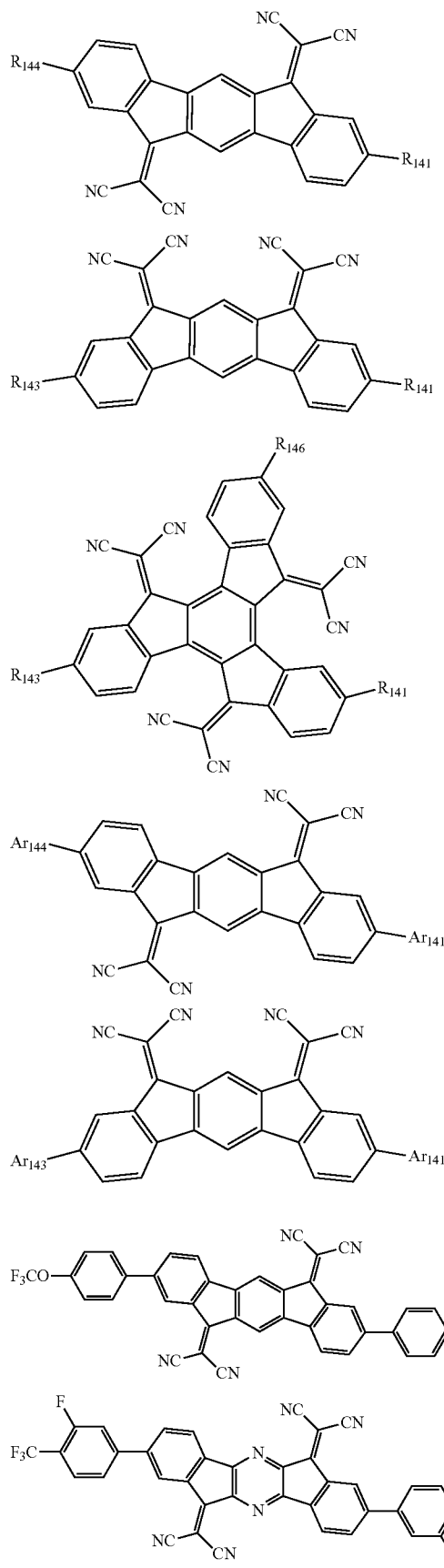
48
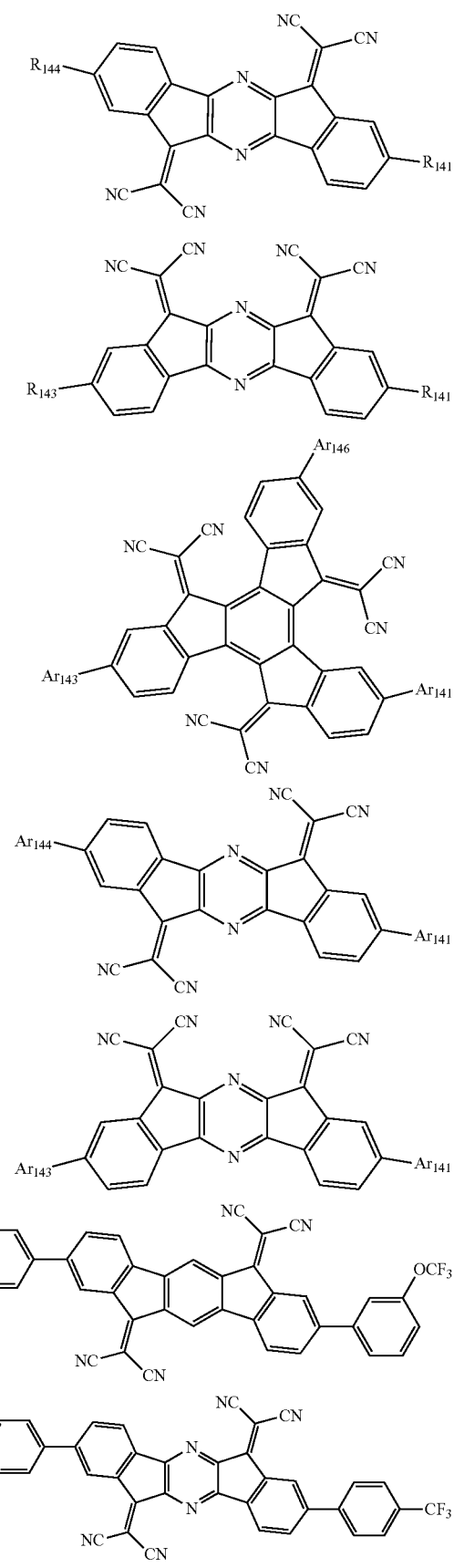

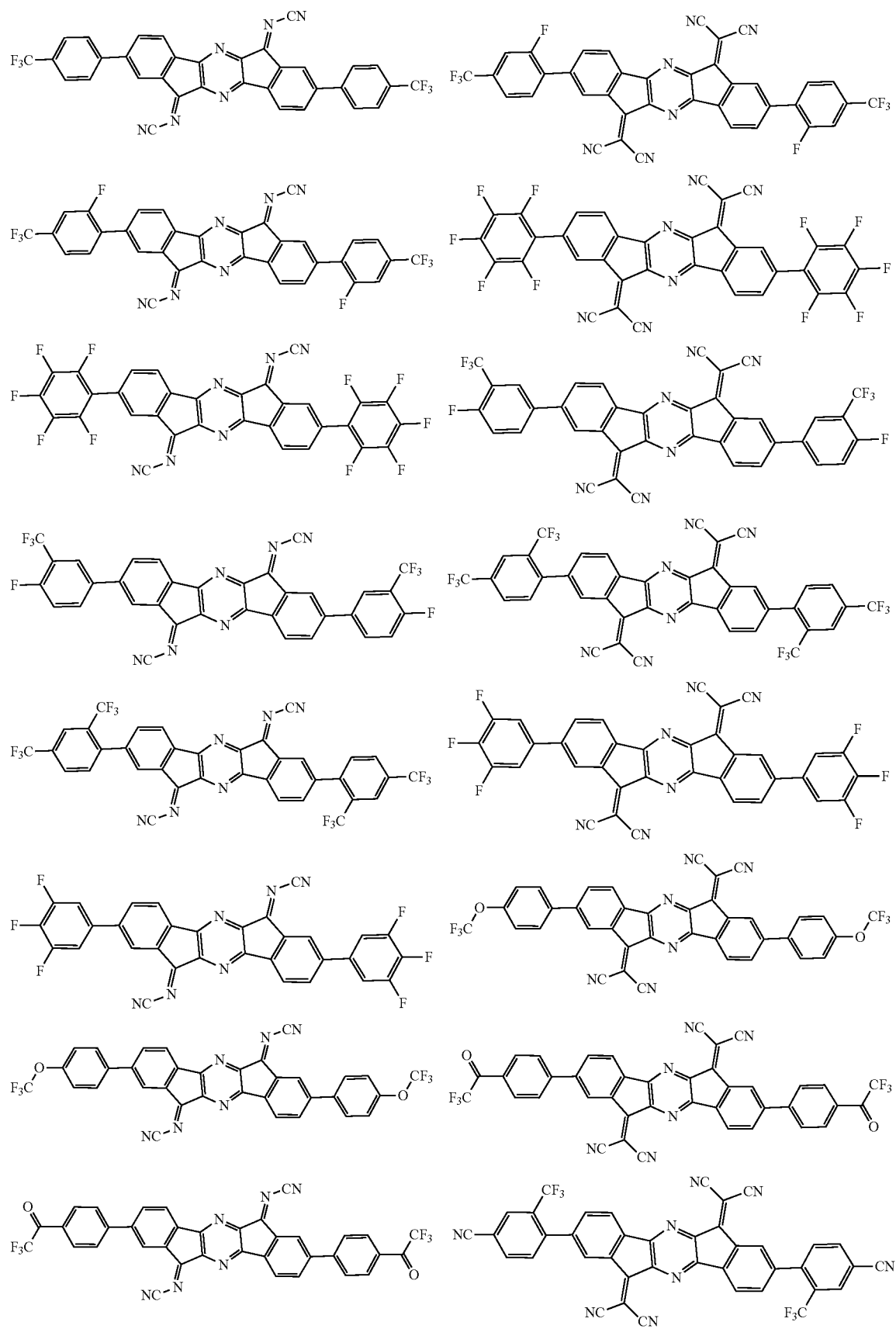

-continued
| 51 | 52 |
|---|---|
| 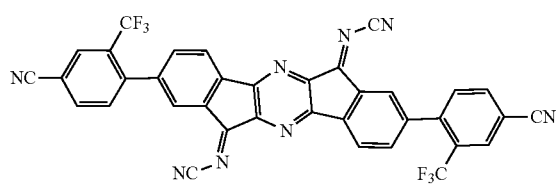 | 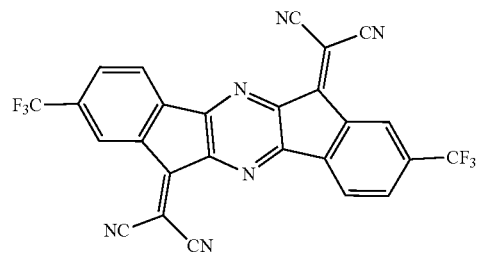 |
| 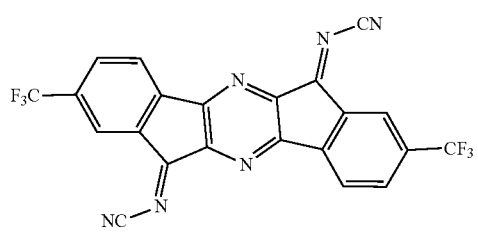 | 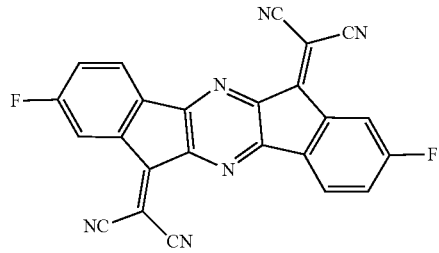 |
| 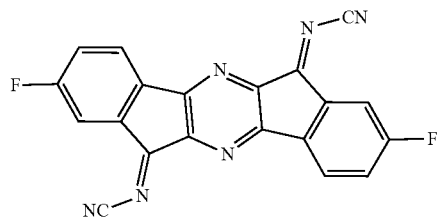 | 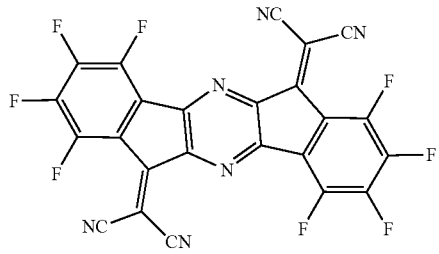 |
| 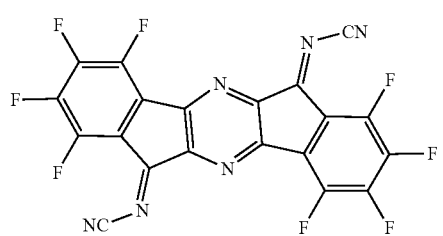 | 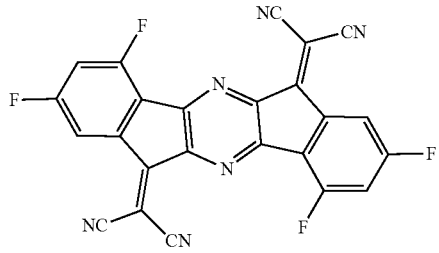 |
| 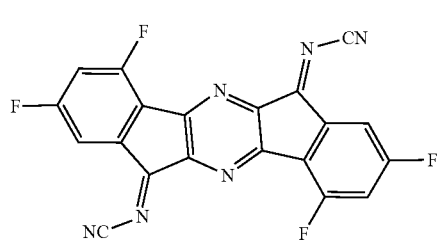 | 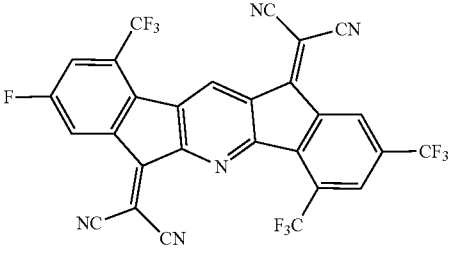 |
| 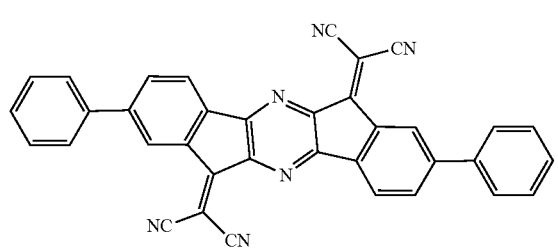 | 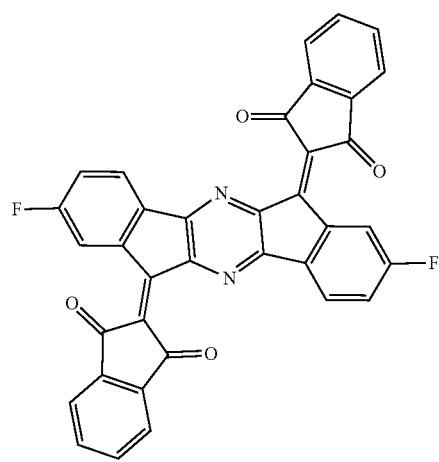 |

-continued
53
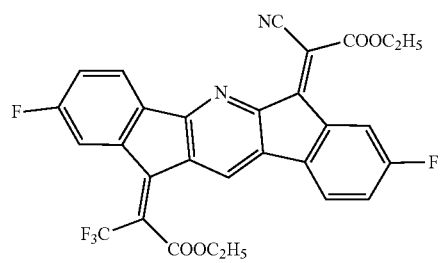
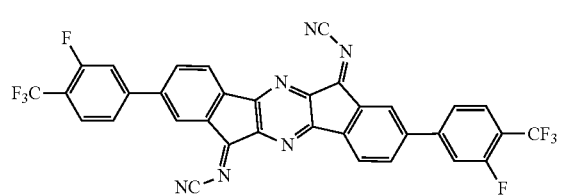
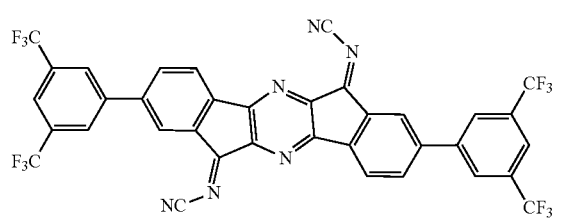
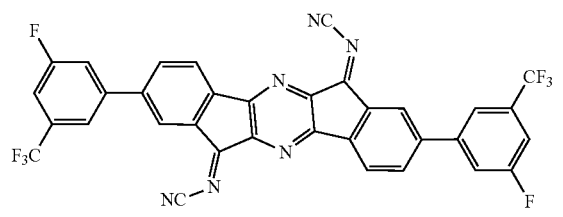
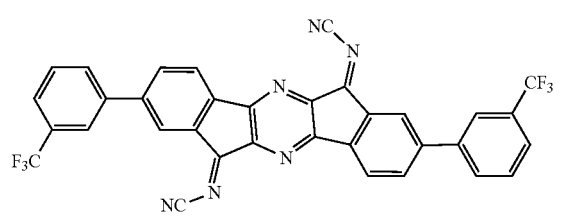
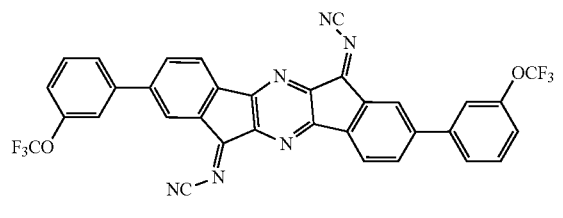
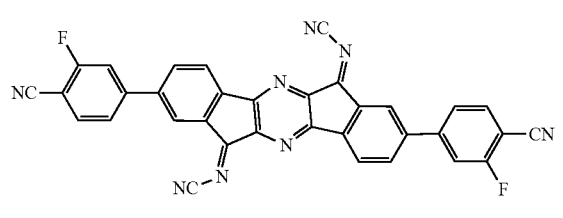
54
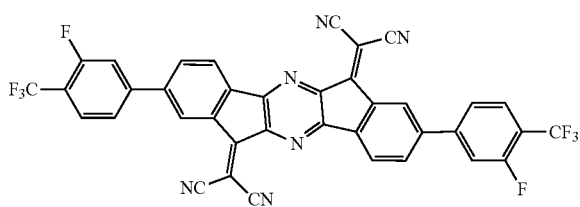
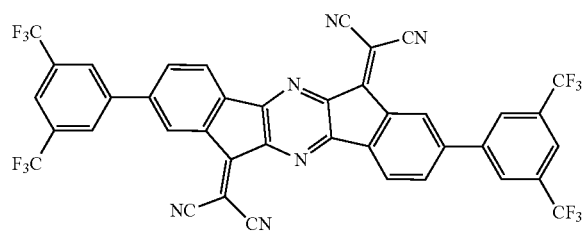
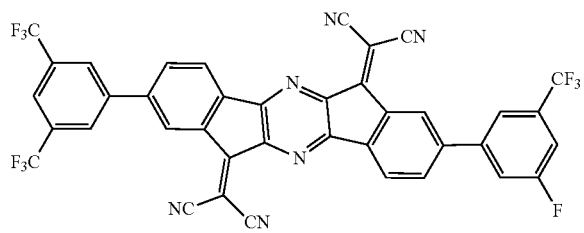
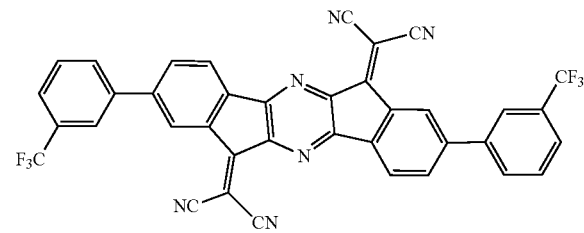
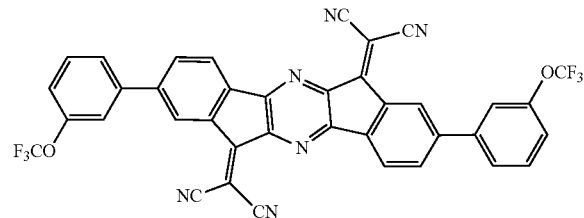
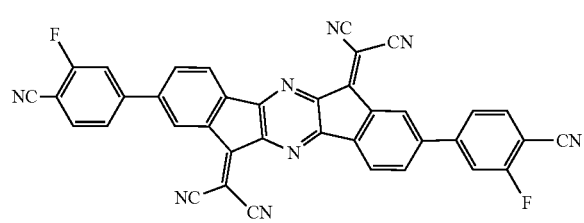
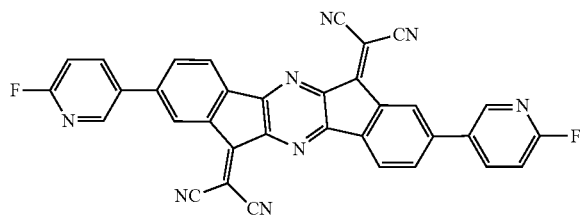

-continued
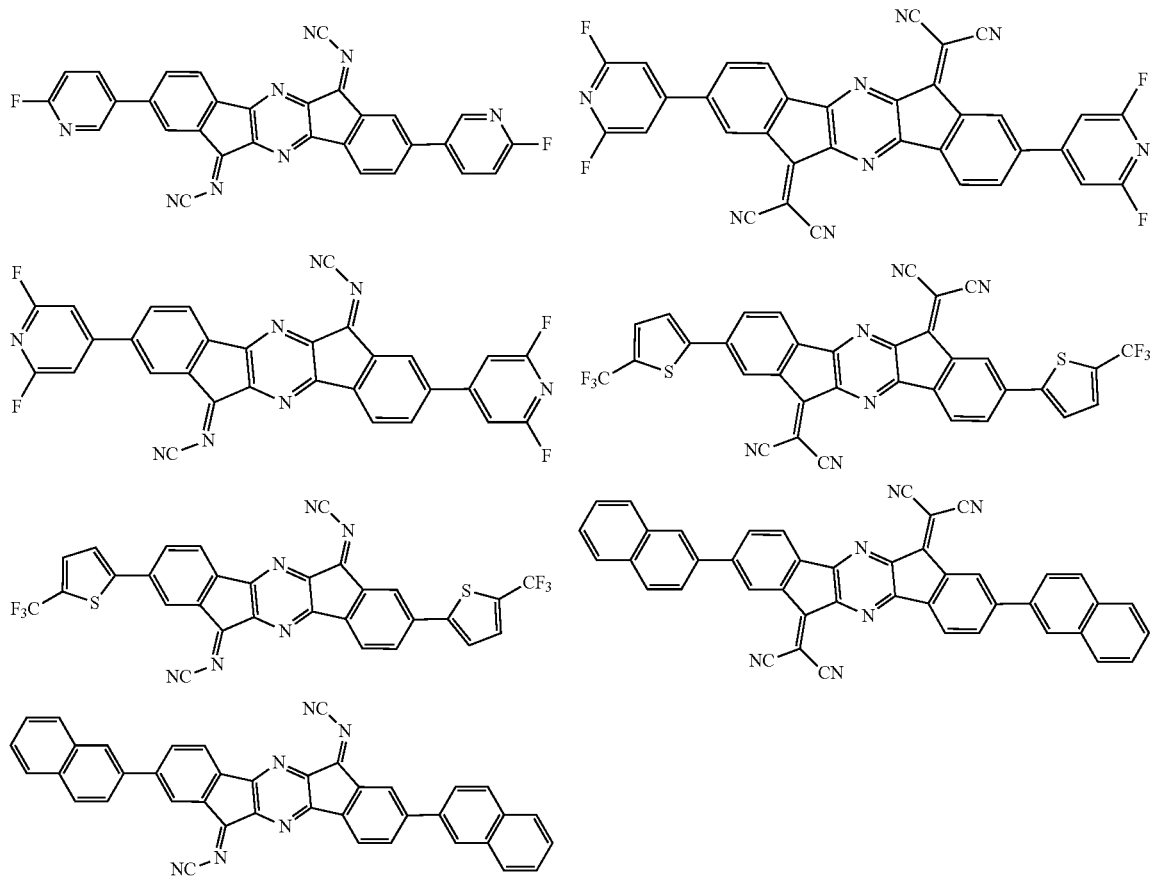
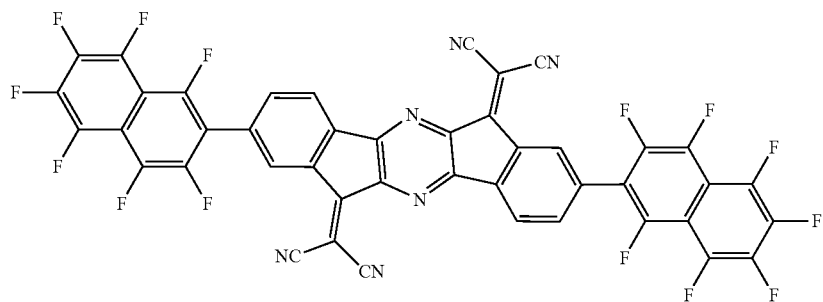
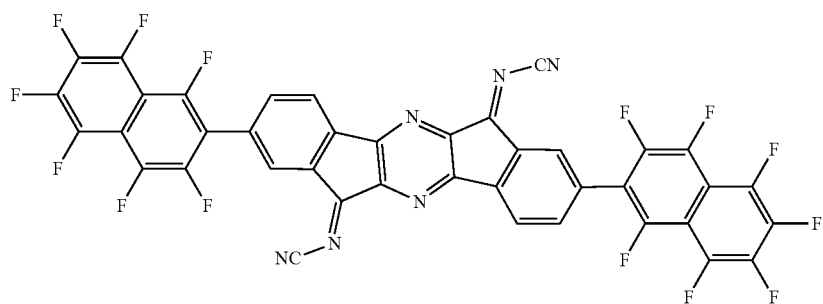

-continued
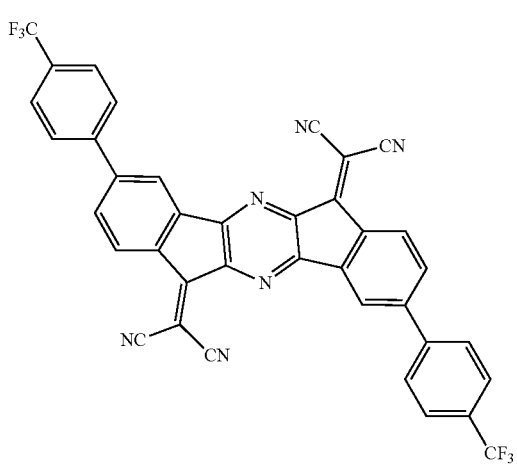
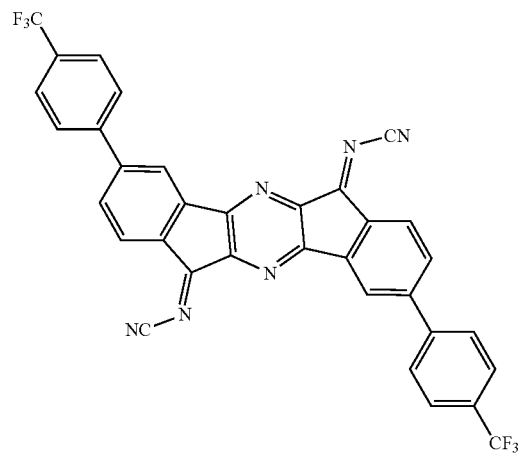
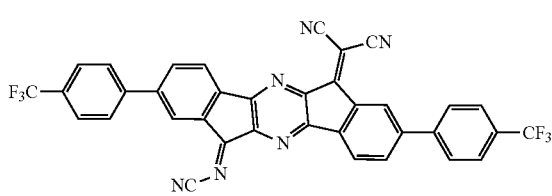
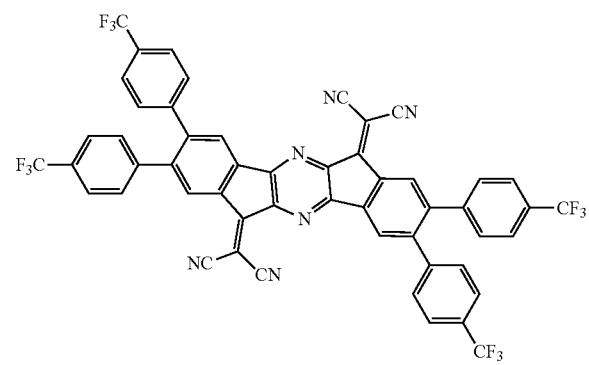
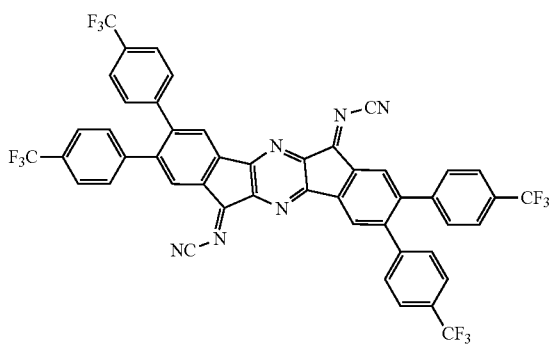
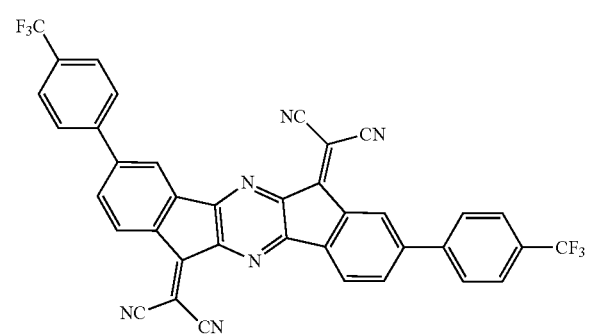
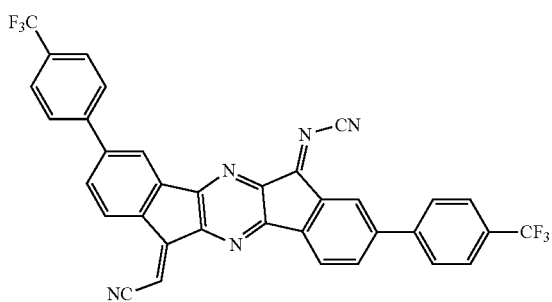
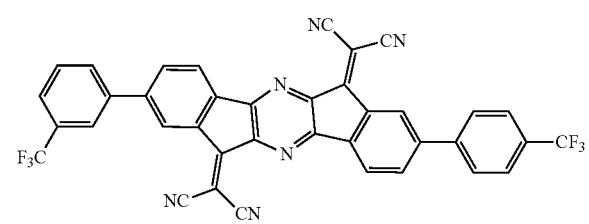
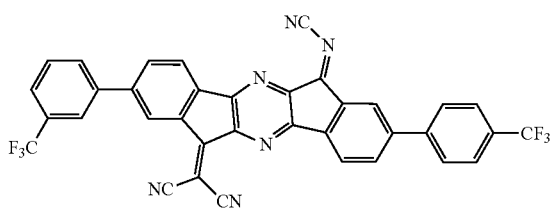
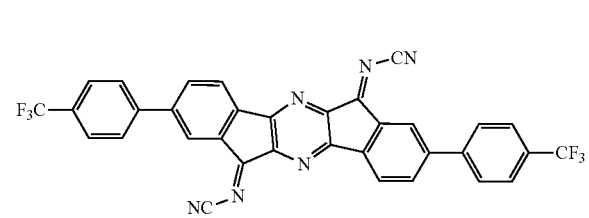

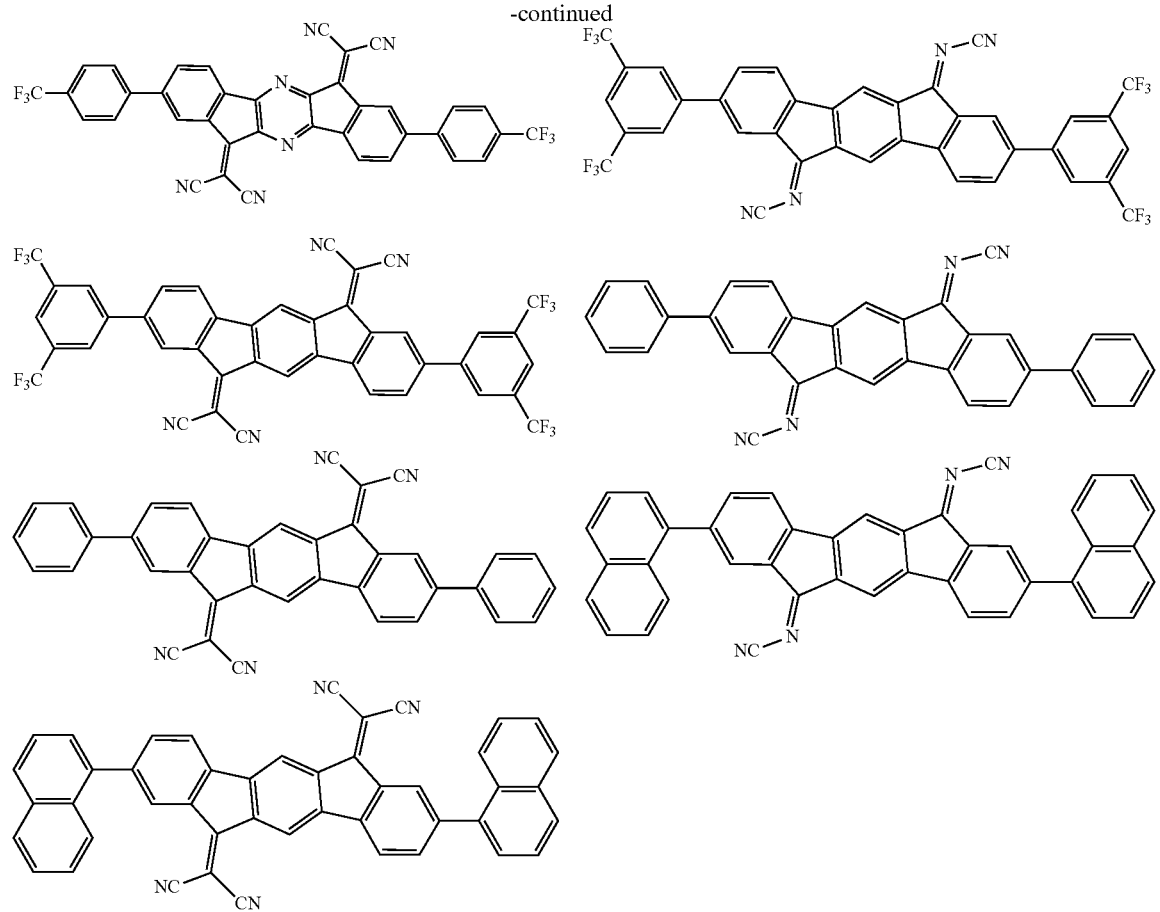
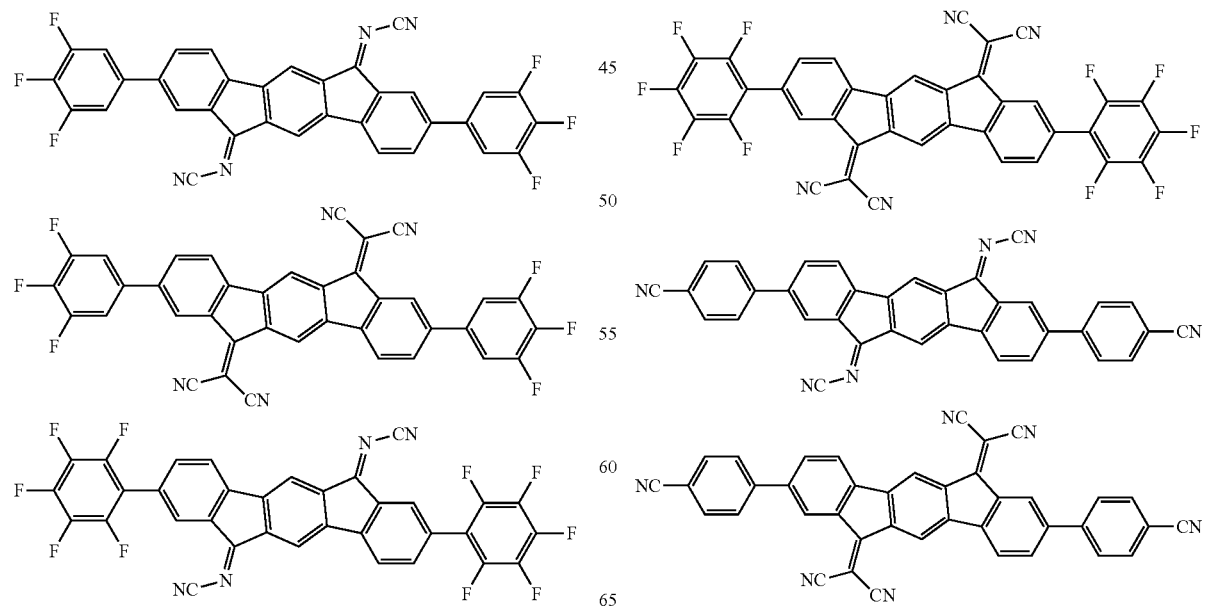

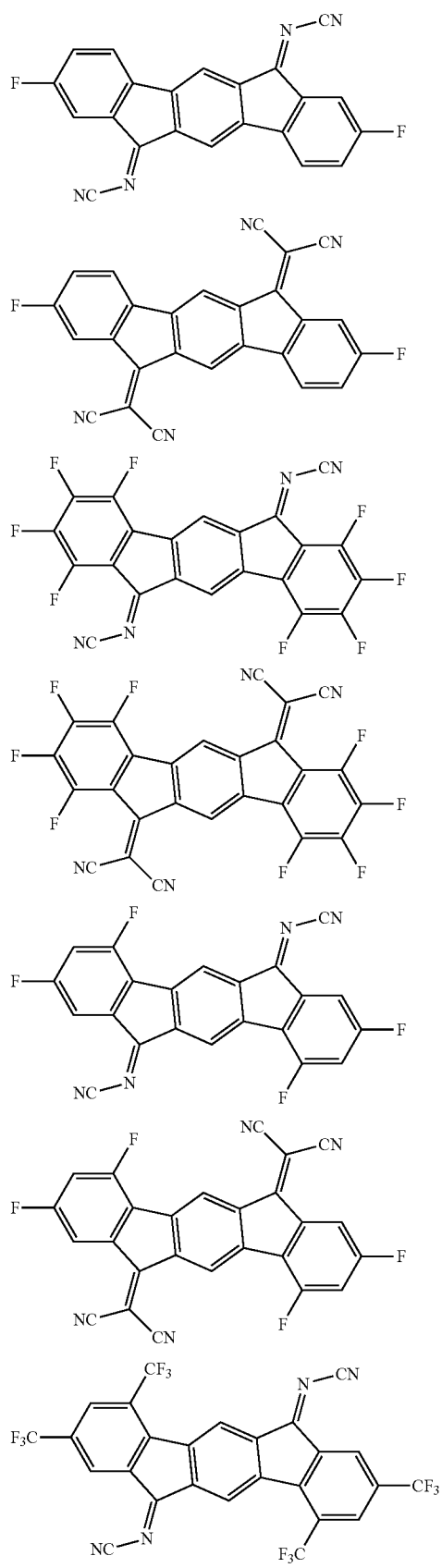
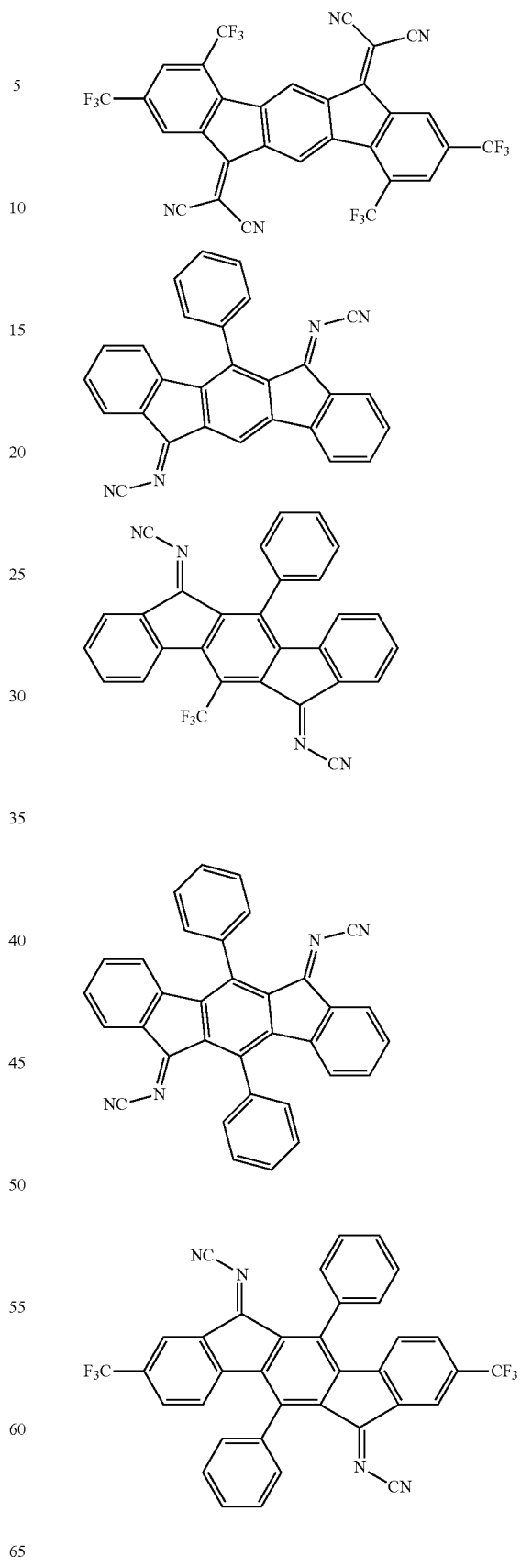

63
-continued
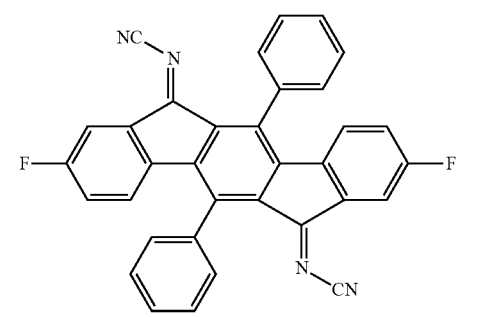
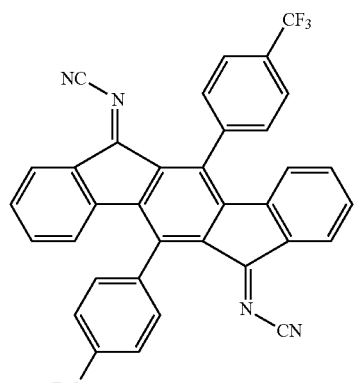
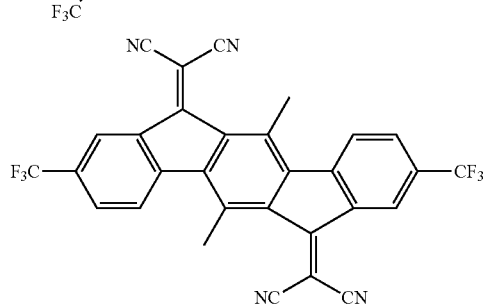
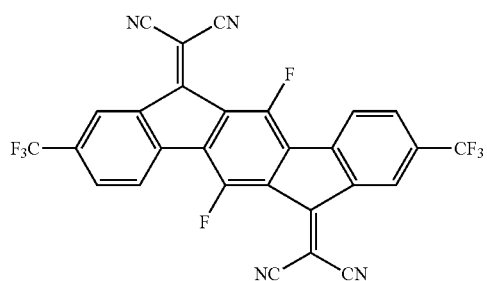
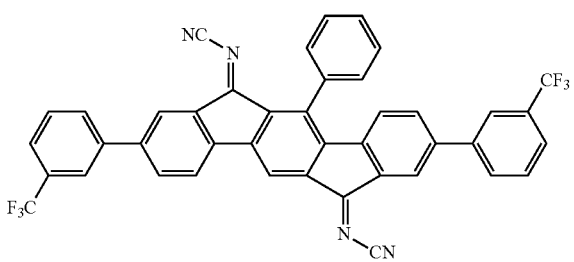
64
-continued
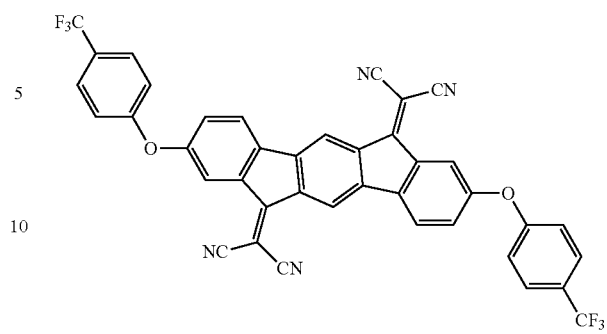
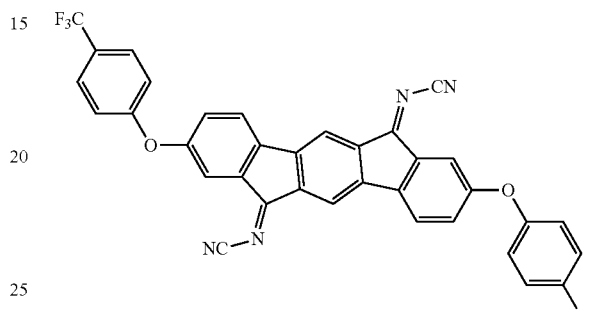
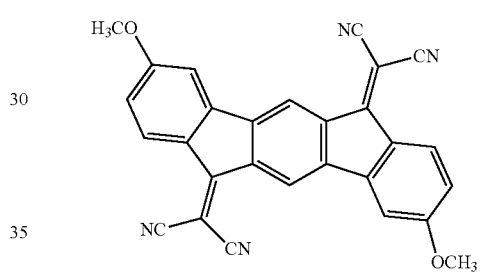
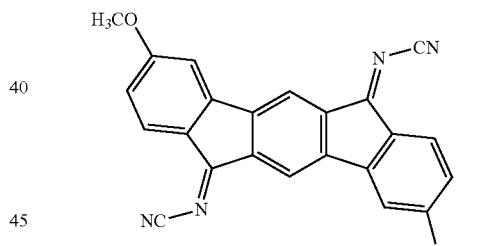
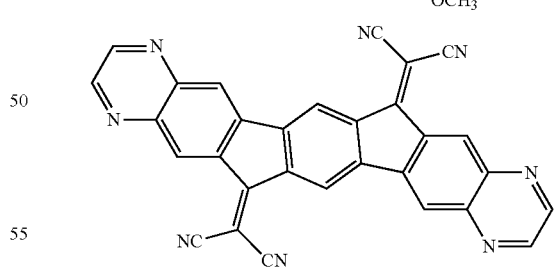
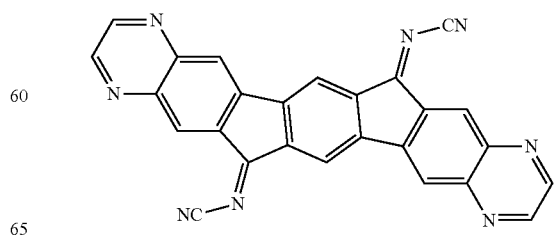

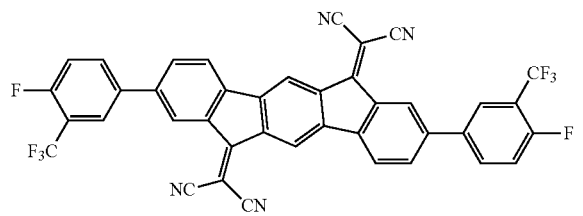
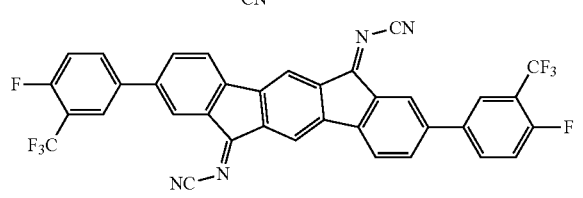
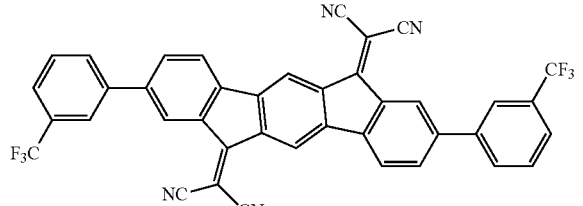
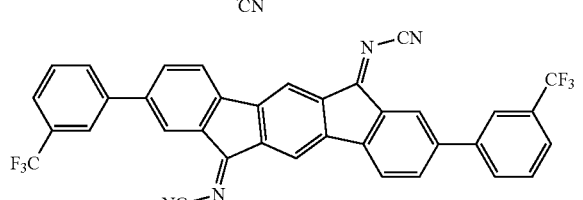
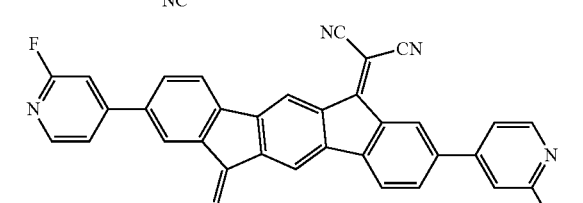
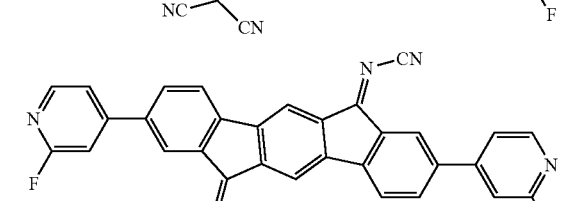
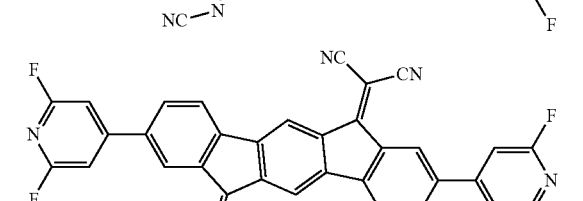
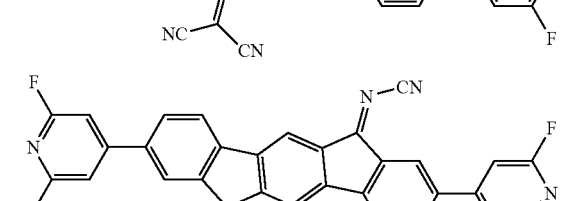
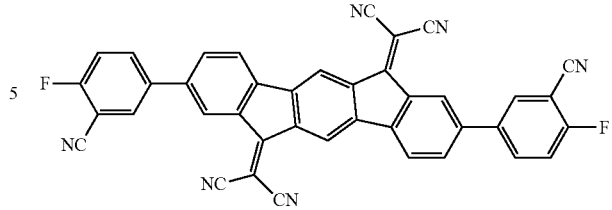
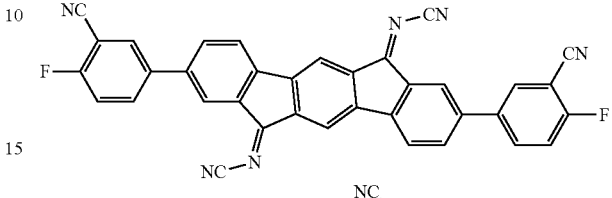
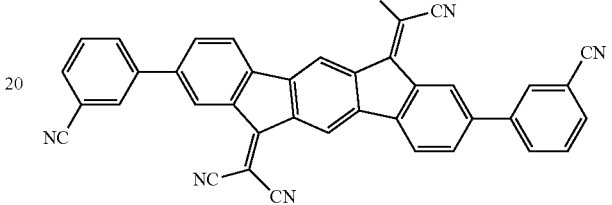
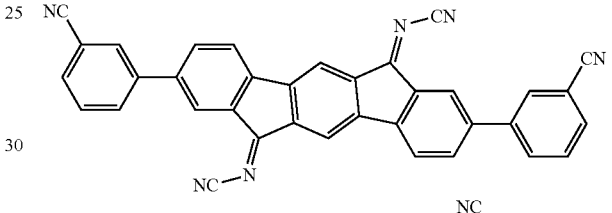
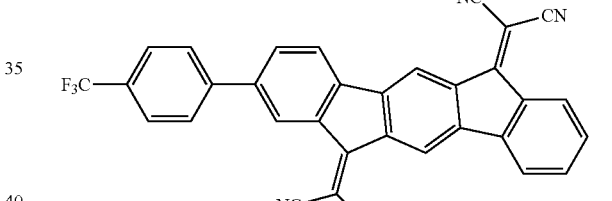
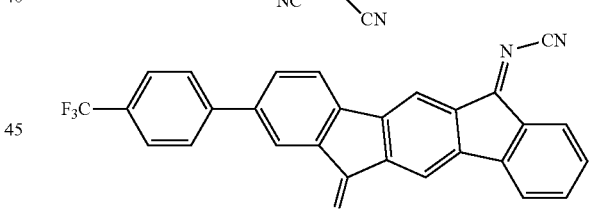
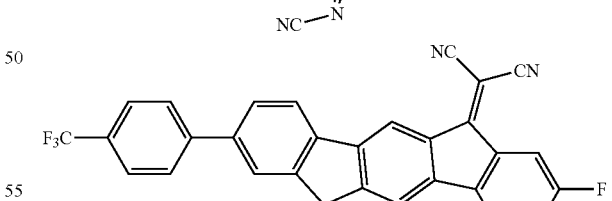
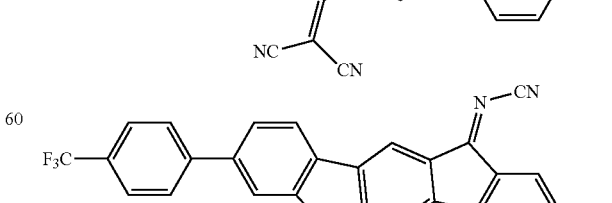
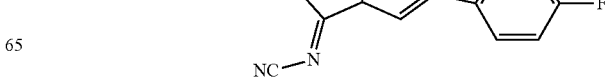

67
-continued
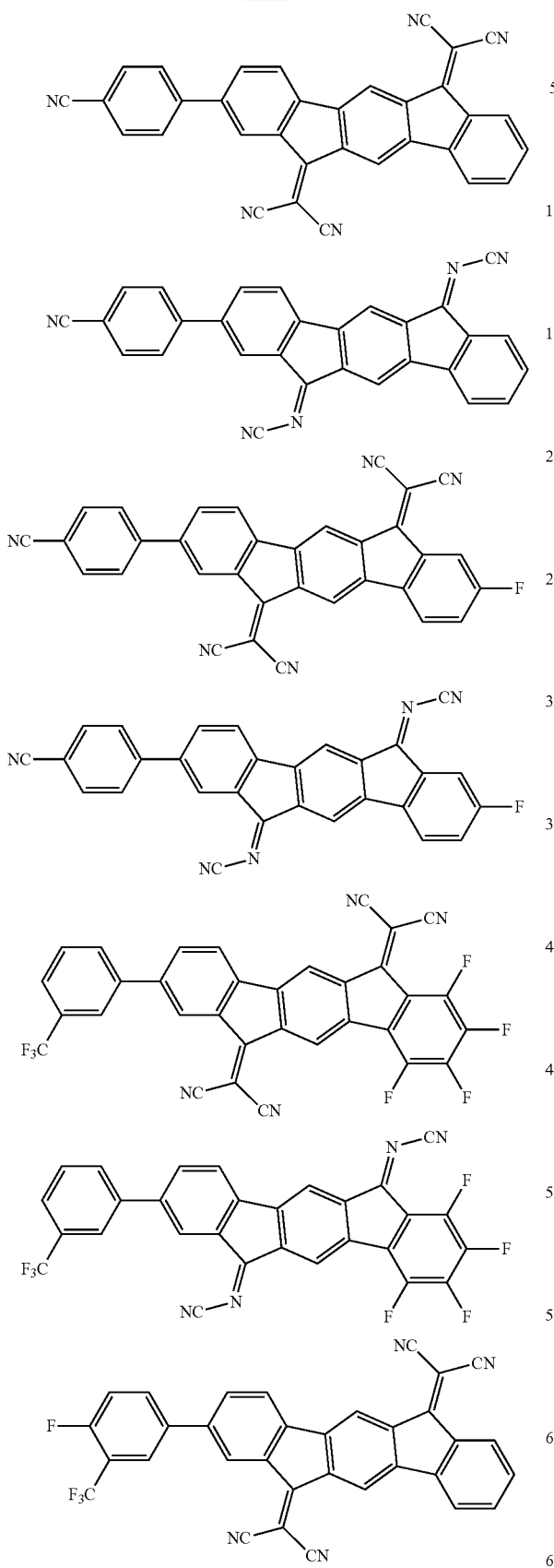
68
-continued
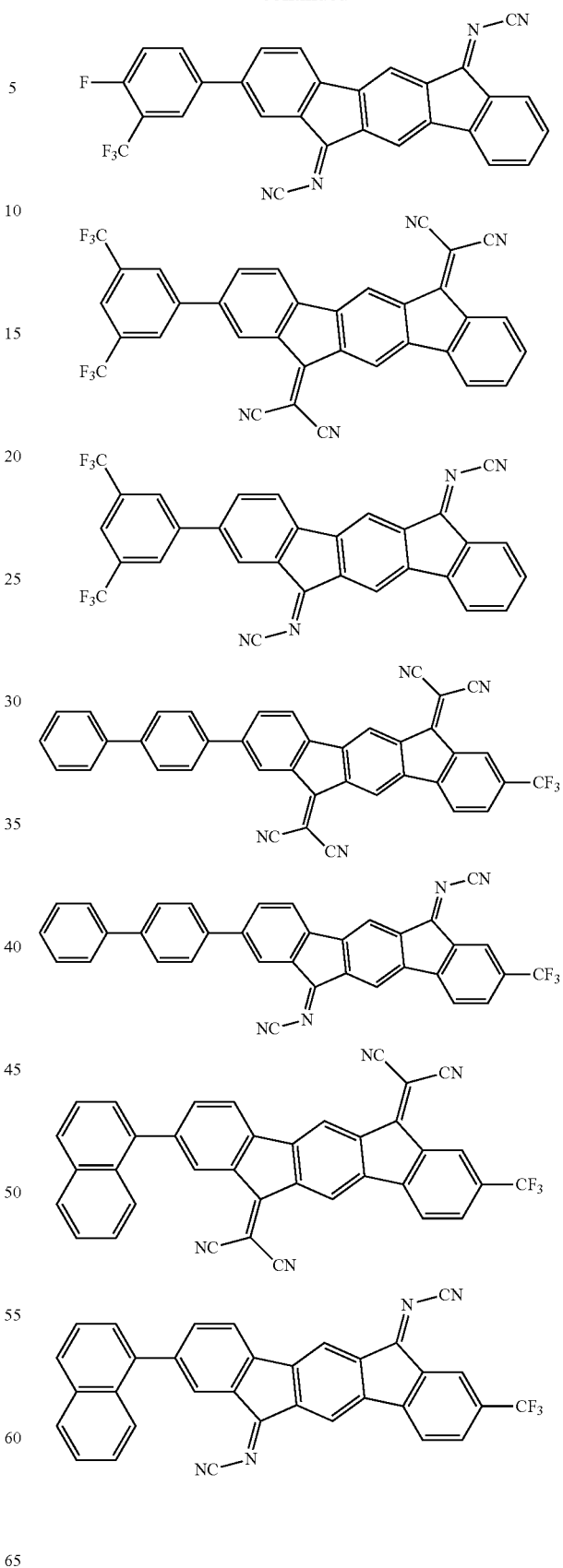

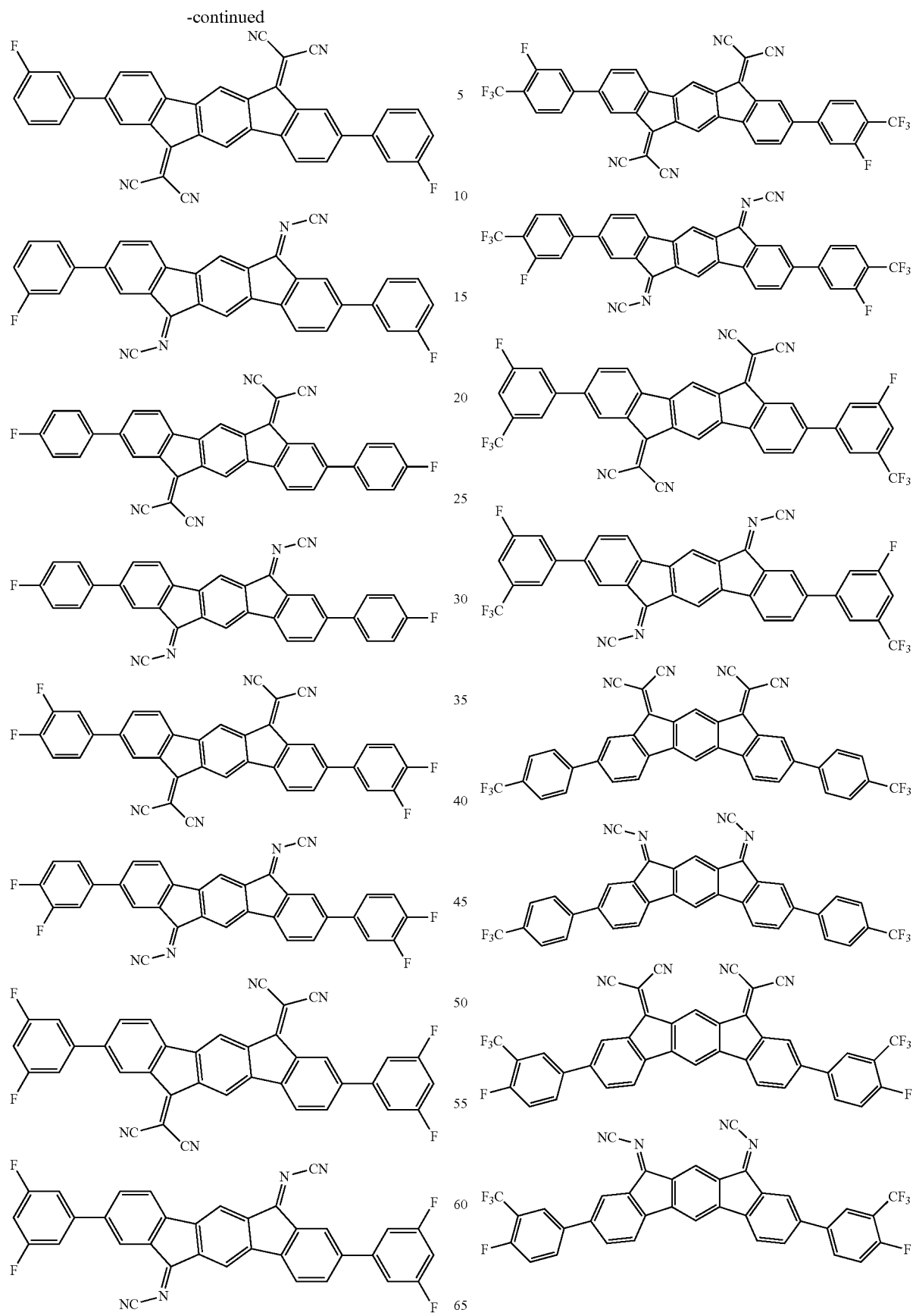

-continued
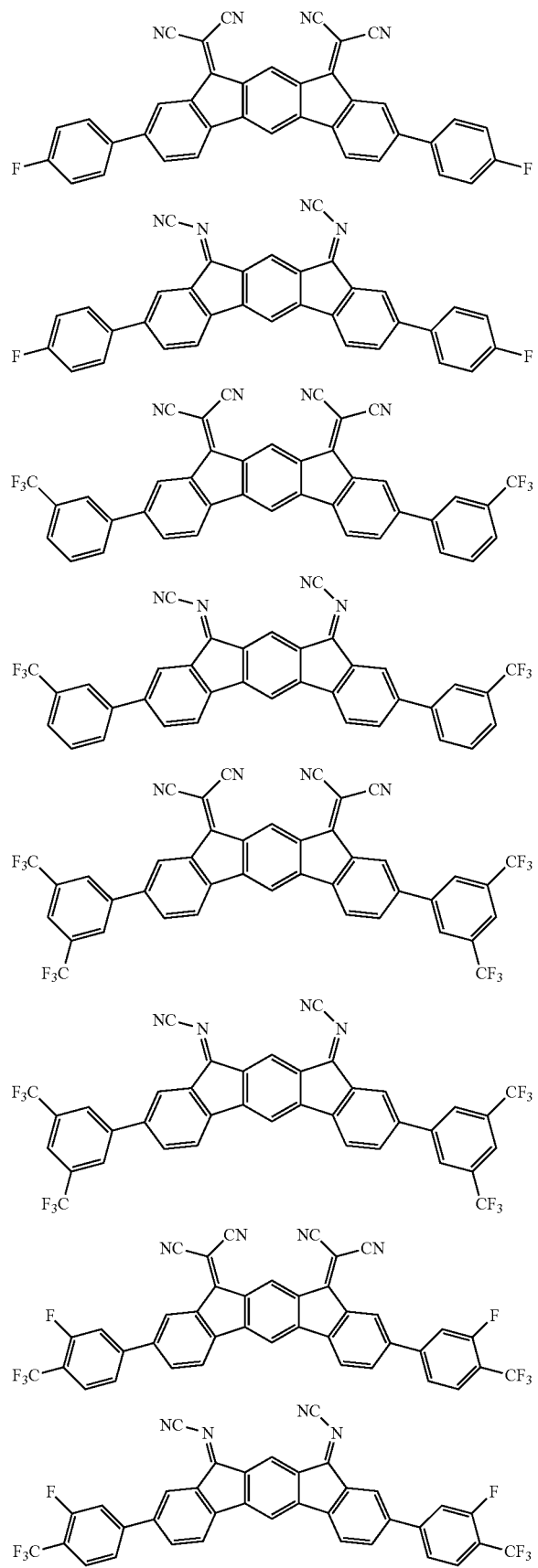
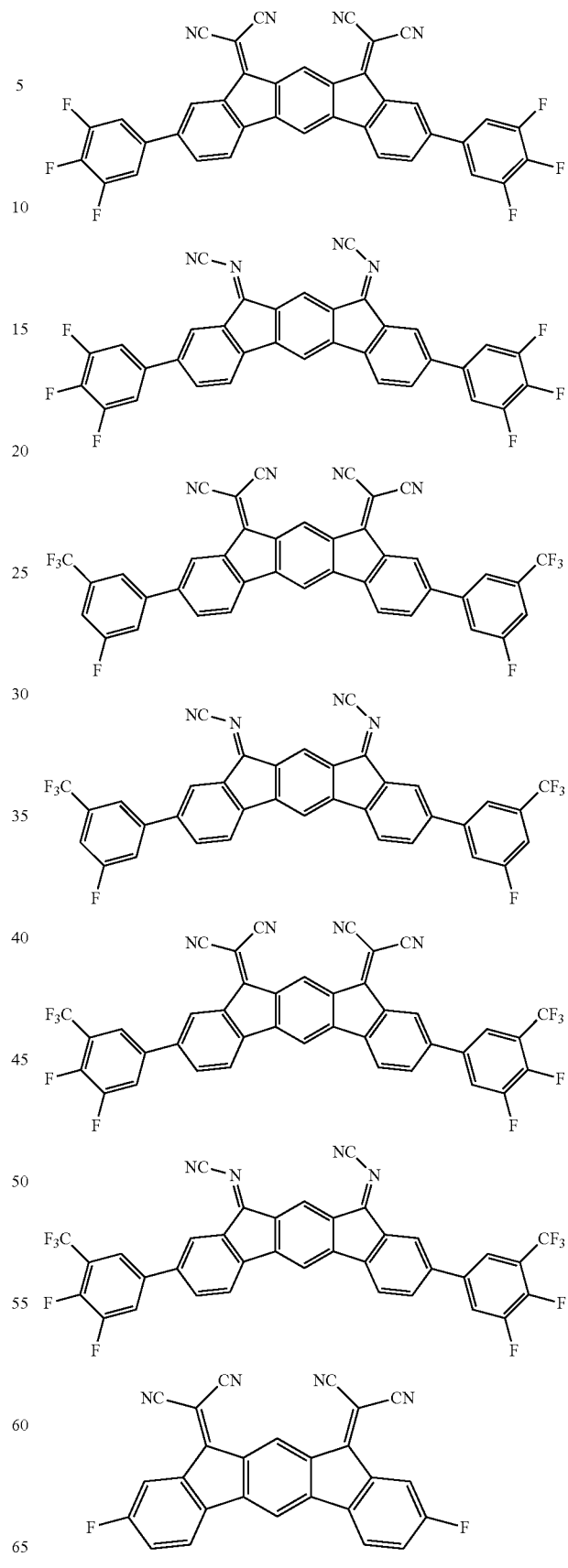

-continued
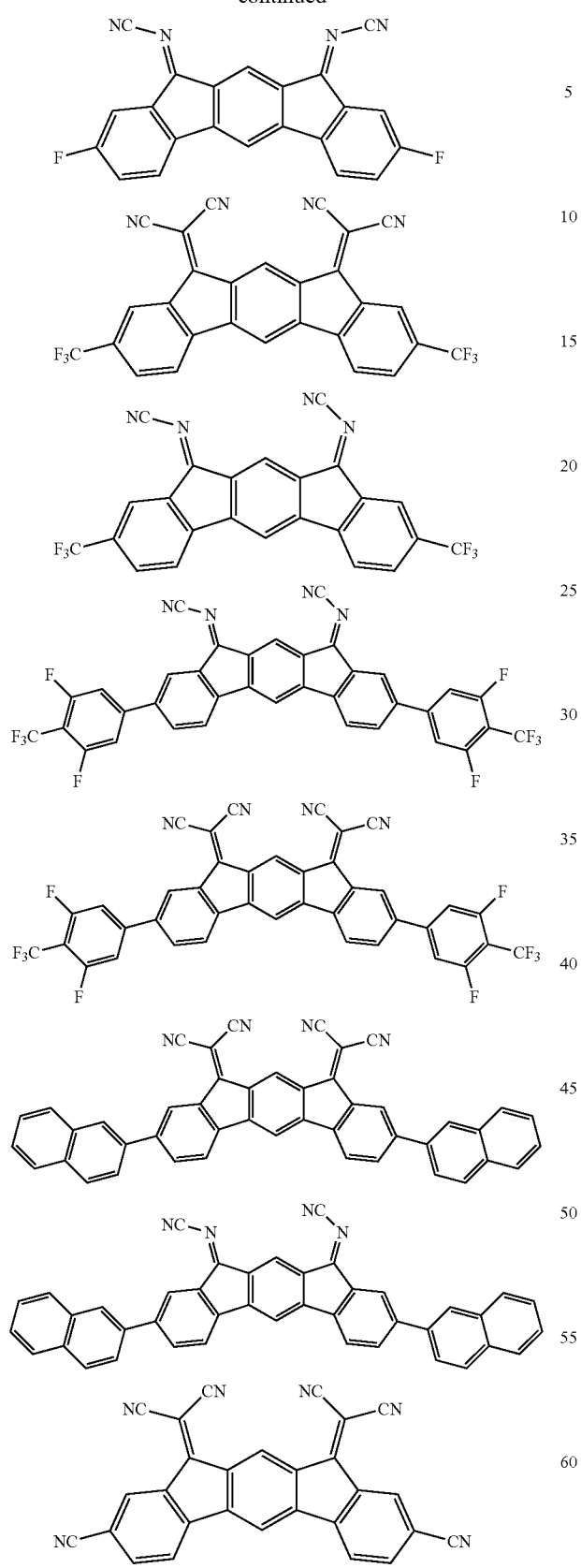
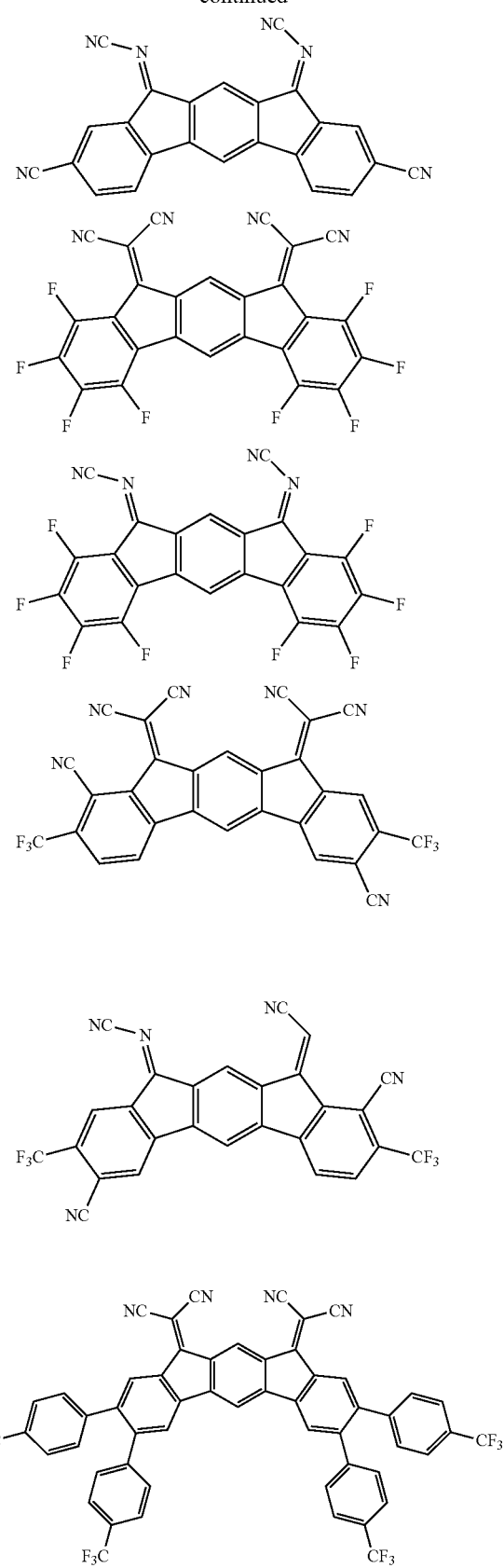

-continued
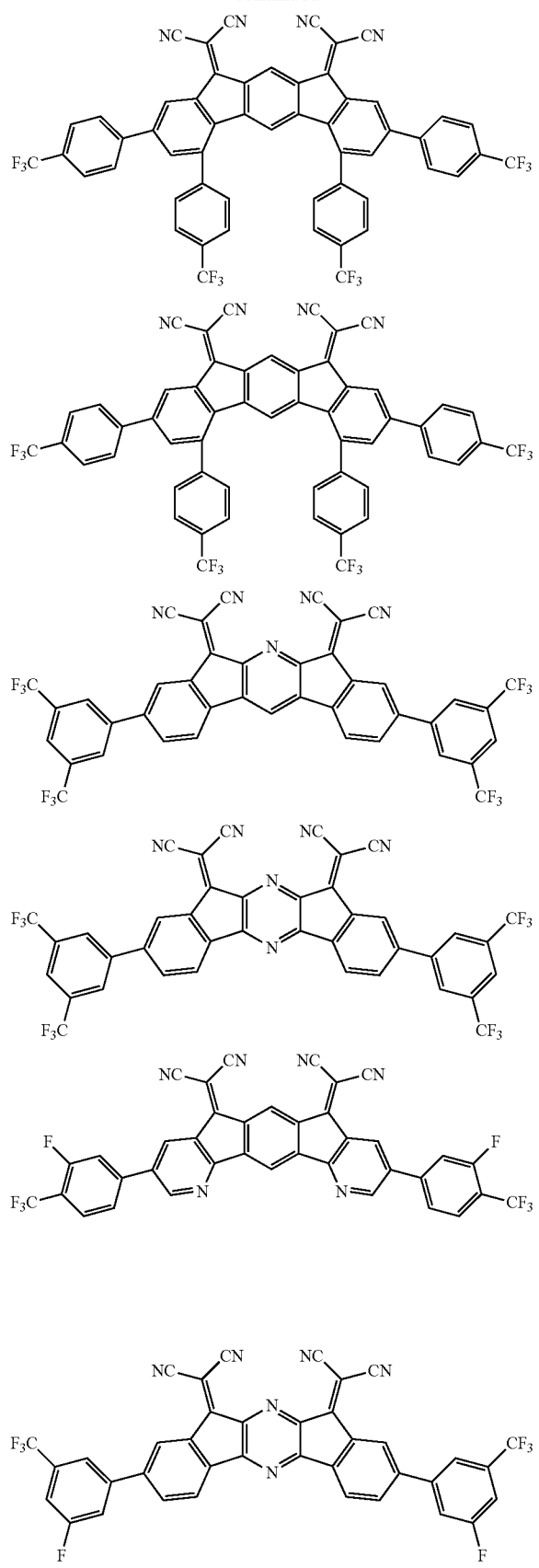
-continued
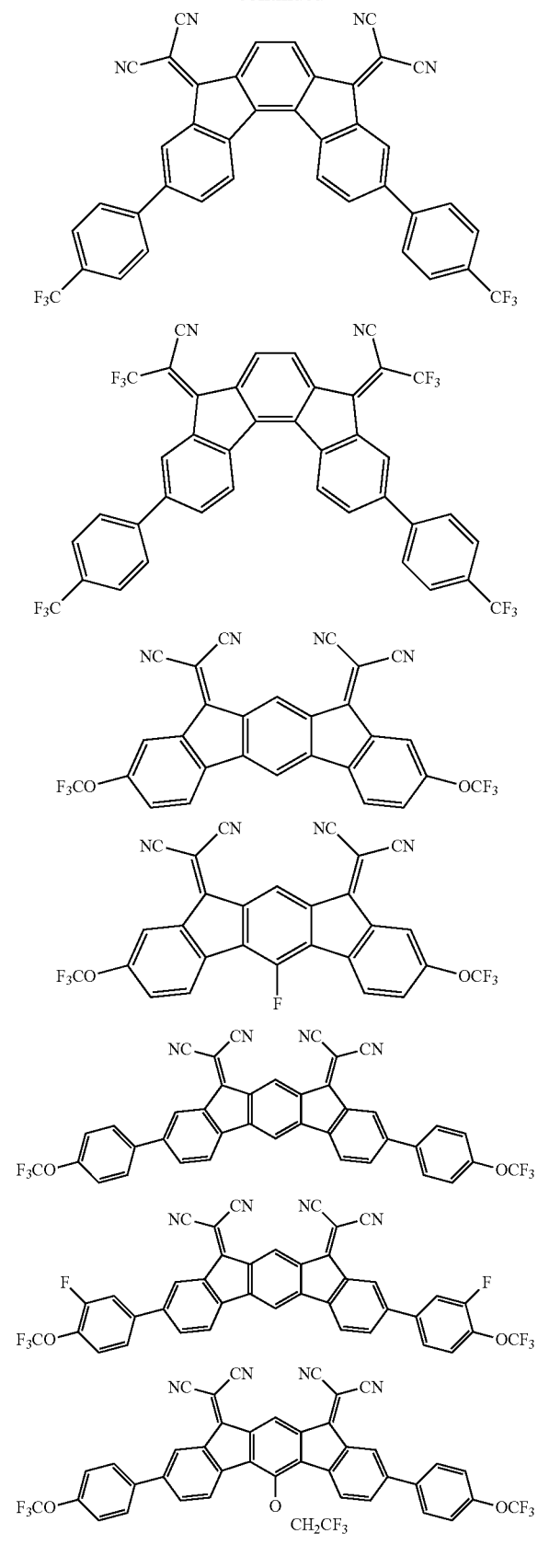

-continued
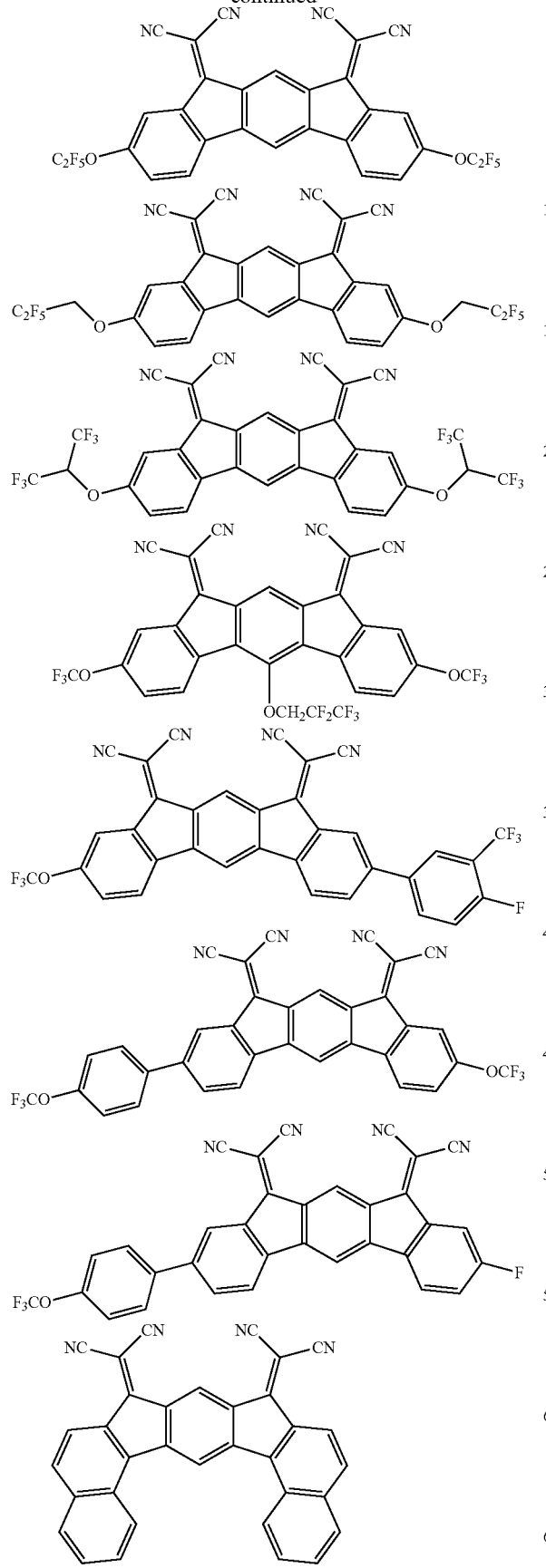
-continued
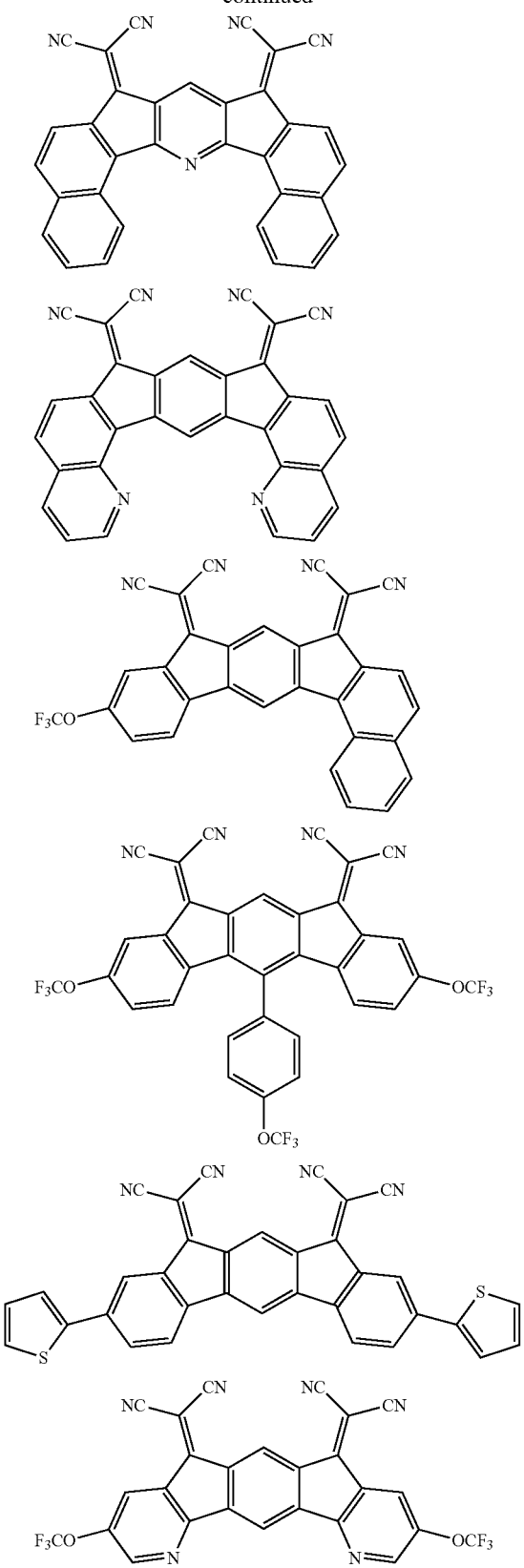

-continued

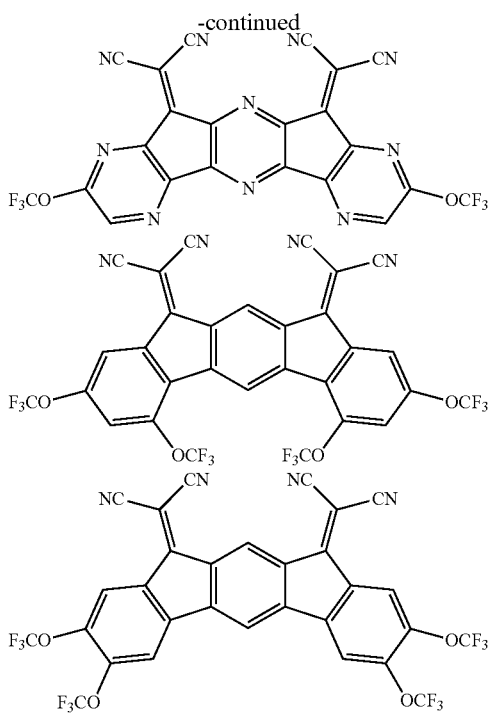

In one embodiment, the compound represented by the formula (31) is a compound represented by the following formula (34-1):

(34-1)

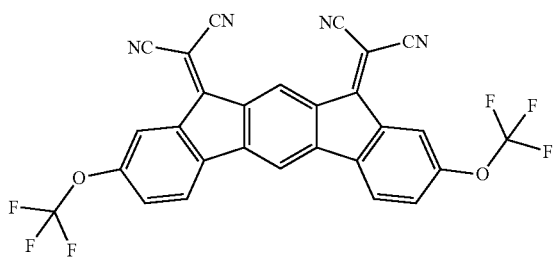

[First and Second Hole-Transporting Material]

Next, a relationship between the first and second hole-transporting materials contained in the first layer in the organic EL device according to an aspect of the invention will be described.

Here, the first hole-transporting material and the second hole-transporting material are mainly determined by the magnitude of their ionization potential, and in some cases not uniformly determined by the characteristics possessed by the compound other than the ionization potential. Some compounds may also be the first hole-transporting material and the second hole-transporting material depending on the compound combined therewith. In other words, it is relatively determined which of the two kinds of hole-transporting materials becomes the first hole-transporting material and which becomes the second hole-transporting material.

In one embodiment, the first hole-transporting material has an ionization potential value smaller than the ionization potential value of the second hole-transporting material.

The ionization potential is measured in the manner described in Examples.

The first and second hole-transporting materials used in the organic EL device of an aspect of the invention are contained in the first layer.

In one embodiment, when the second layer contains two or more hole-transporting materials, the second layer contains a first hole-transporting material and a second hole-transporting material used in the first layer.

The first hole-transporting material used in the first layer may be the same as or different from the first hole-transporting material used in the second layer. The second hole-transporting material used in the first layer may be the same as or different from the second hole-transporting material used in the second layer.

In one embodiment, the first and second hole-transporting materials used in the first layer and the first and second hole-transporting materials used in the second layer are the same, respectively.

In one embodiment, a mass ratio of the first hole-transporting material and the second hole-transporting material in the first layer is within a range of 80:20 to 20:80.

In one embodiment, a mass ratio of the first hole-transporting material and the second hole-transporting material in the first layer is within a range of 70:30 to 30:70.

In one embodiment, a mass ratio of the first hole-transporting material and the second hole-transporting material in the first layer is around 50:50.

In one embodiment, a mass ratio of the first hole-transporting material and the second hole-transporting material in the first layer and the second layer are independently within a range of 80:20 to 20:80.

<Compound Represented by the Formula (11)>

In one embodiment, the first hole-transporting material and the second hole-transporting material are independently selected from a compound represented by the following formula (11).

Also, the second layer contains at least one hole-transporting material. The hole-transporting material contained in the second layer is not particularly limited and can be selected from known hole-transporting materials, and for example, a compound represented by the following formula (11) used in the first layer can be used.

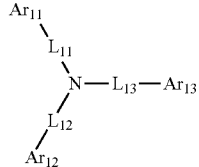

In the formula (11), two of $-L_{11}-Ar_{11}$, $-L_{12}-Ar_{12}$, and $-L_{13}-Ar_{13}$ form a substituted or unsubstituted N-carbazolyl group by bonding with each other, or do not form the N-carbazolyl group;

$L_{11}$ to $L_{13}$ which are not involved in formation of the N-carbazolyl group are independently a single bond or a linking group;

$Ar_{11}$ to $Ar_{13}$ which are not involved in formation of the N-carbazolyl group are independently a substituted or unsubstituted aryl group including 6 to 50 ring carbon atoms, a substituted or unsubstituted monovalent heterocyclic group including 5 to 60 ring atoms, or
—N(R$_{906}$)(R$_{907}$);
R$_{906}$ and R$_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of Re and R$_{907}$ are present, the two or more of each of Re and R$_{907}$ may be the same as or different from each other.

The compound represented by the formula (11) is an amine compound, and since Ar$_{11}$ to Ar$_{13}$ can be a substituted amino group (—N(R$_{906}$)(R$_{907}$)), the amine compound is not limited to a monoamine compound, and a diamine compound, a triamine compound, and the like are also included.

Further, since two of -L$_{11}$-Ar$_{11}$, -L$_{12}$-Ar$_{12}$, and -L$_{13}$-Ar$_{13}$ may form a substituted or unsubstituted N-carbazolyl group by bonding each other, a N-carbazole compound having no amino group, and an amine compound having a N-carbazolyl group are also included.

Ar$_{11}$ to Ar$_{13}$ can be a substituted or unsubstituted monovalent heterocyclic group including 5 to 50 ring atoms, and can also be an N-carbazolyl group. Accordingly, the above-mentioned monoamine compound, diamine compound, triamine compound, and the like can also be an amine compound having a N-carbazolyl group.

In one embodiment, the compounds represented by the formula (11) are independently selected from a compound represented by the formula (11-1) described later, a compound represented by the formula (11-2) described later, and a compound represented by the formula (11-3) described later.

The compound represented by the formula (11-1) described later is a monoamine compound, the compound represented by the formula (11-2) described later is a diamine compound, and the compound represented by the formula (11-3) described later is a compound having a N-carbazolyl group.

Hereinafter, compounds represented by the formulas (11-1) to (11-3) will be described.

<Compound Represented by the Formula (11-1)>

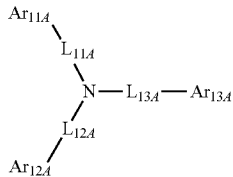

(11-1)

In the formula (11-1),
L$_{11A}$ to L$_{13A}$ are independently a single bond or a linking group;
Ar$_{11A}$ to Ar$_{13A}$ are independently
a substituted or unsubstituted aryl group including 6 to 50 ring carbon atoms, or
a substituted or unsubstituted monovalent heterocyclic group including 5 to 60 ring atoms.

<Compound Represented by the Formula (11-1B)>

In one embodiment, the compound represented by the formula (11-1) is a compound represented by the following formula (11-1B).

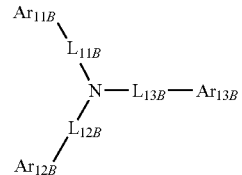

(11-1B)

In the formula (11-1B),
L$_{11B}$ to L$_{13B}$ are independently
a single bond, or
a substituted or unsubstituted arylene group including 6 to 50 ring carbon atoms;
Ar$_{11B}$ to Ar$_{13B}$ are independently
a substituted or unsubstituted aryl group including 6 to 50 ring carbon atoms, or
a substituted or unsubstituted monovalent heterocyclic group including 5 to 60 ring atoms;
substituents when L$_{11B}$ to L$_{13B}$ and Ar$_{11B}$ to Ar$_{13B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si(R$_{901}$)(R$_{902}$)(R$_{903}$),
—O—(R$_{904}$),
—S—(R$_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
R$_{901}$ to R$_{905}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of R$_{901}$ to R$_{905}$ are present, the two or more of each of R$_{901}$ to R$_{905}$ may be the same as or different from each other.

In one embodiment, Ar$_{11B}$ to Ar$_{13B}$ in the formula (11-1B) are independently selected from the group consisting of
a substituted or unsubstituted phenyl group,
a substituted or unsubstituted naphthyl group,
a substituted or unsubstituted biphenyl group,
a substituted or unsubstituted terphenyl group,
a substituted or unsubstituted anthryl group,
a substituted or unsubstituted 9,9-dialkylfluorenyl group,
a substituted or unsubstituted 9,9-diarylfluorenyl group,
a substituted or unsubstituted carbazolyl group, and
a substituted or unsubstituted dibenzofuranyl group.

In one embodiment, $L_{11A}$ to $L_{13A}$ in the formula (11-1) are independently selected from the group consisting of
a single bond,
a substituted or unsubstituted phenylene group,
a substituted or unsubstituted biphenylene group,
a substituted or unsubstituted naphthylene group,
a substituted or unsubstituted terphenylene group,
Substituted or unsubstituted anthrylene groups, and
a substituted or unsubstituted dibenzofuranylene group.

In one embodiment, $L_{11B}$ to $L_{13B}$ in the formula (11-1B) are independently selected from the group consisting of
a single bond,
a substituted or unsubstituted phenylene group,
a substituted or unsubstituted biphenylene group,
a substituted or unsubstituted naphthylene group,
a substituted or unsubstituted terphenylene group, and
a substituted or unsubstituted anthrylene group.

In one embodiment, $Ar_{11B}$ to $Ar_{13B}$ in the formula (11-1B) are independently selected from the group consisting of
an unsubstituted phenyl group,
an unsubstituted biphenyl group,
an unsubstituted terphenyl group,
an unsubstituted 9,9-dialkylfluorenyl group,
an unsubstituted 9,9-diarylfluorenyl group, and
a substituted or unsubstituted carbazolyl group; and
$L_{11B}$ to $L_{13B}$ are independently selected from the group consisting of
a single bond,
an unsubstituted phenylene group, and
an unsubstituted biphenylene group.

<Compound Represented by the Formula (11-1C)>

In one embodiment, the compound represented by the formula (11-1) is a compound represented by the following formula (11-1C). The compound represented by the following formula (11-1C) is a monoamine compound having no carbazolyl group and having only one disubstituted amino group.

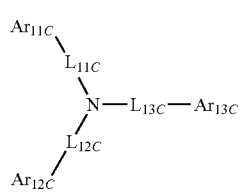

(11-1C)

In the formula (11-1C),
$L_{11C}$ to $L_{13C}$ are independently
a single bond, or
a substituted or unsubstituted arylene group including 6 to 50 ring carbon atoms;
$Ar_{11C}$ to $Ar_{13C}$ are independently
a substituted or unsubstituted aryl group including 6 to 50 ring carbon atoms, or
a substituted or unsubstituted monovalent heterocyclic group including 5 to 60 ring atoms, provided that a substituted or unsubstituted carbazolyl group is excluded;
substituents when $L_{11C}$ to $L_{13C}$, and $Ar_{11C}$ to $Ar_{13C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms, provided that a substituted or unsubstituted carbazolyl group is excluded;
$R_{901}$ to $R_{905}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms, provided that a substituted or unsubstituted carbazolyl group is excluded; and when two or more of each of $R_{901}$ to $R_{905}$ are present, the two or more of each of $R_{901}$ to $R_{905}$ may be the same as or different from each other.

<Compound Represented by the Formula (11-2)>

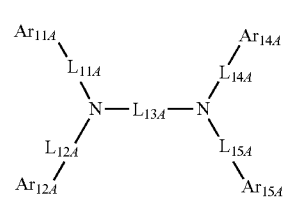

(11-2)

In the formula (11-2),
$L_{13A}$ is a linking group;
$L_{11A}$, $L_{12A}$, $L_{14A}$, and $L_{15A}$ are independently a single bond or a linking group; and
$Ar_{11A}$, $Ar_{12A}$, $Ar_{14A}$, and $Ar_{15A}$ are independently
a substituted or unsubstituted aryl group including 6 to 50 ring carbon atoms, or
a substituted or unsubstituted monovalent heterocyclic group including 5 to 60 ring atoms.

<Compound Represented by the Formula (11-2B)>

In one embodiment, the compound represented by the formula (11-2) is a compound represented by the formula (11-2B) below.

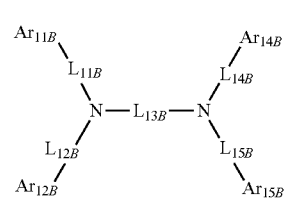

(11-2B)

In the formula (11-2B),
$L_{13B}$ is a substituted or unsubstituted arylene group including 6 to 50 ring carbon atoms;

$L_{11B}$, $L_{12B}$, $L_{14B}$, and $L_{15B}$ are independently
a single bond, or
a substituted or unsubstituted arylene group including 6 to 50 ring carbon atoms;
$Ar_{11B}$, $Ar_{12B}$, $Ar_{14B}$, and $Ar_{15B}$ are independently
a substituted or unsubstituted aryl group including 6 to 50 ring carbon atoms, or
a substituted or unsubstituted monovalent heterocyclic group including 5 to 60 ring atoms;
substituents when $L_{11B}$ to $L_{15B}$, $Ar_{11B}$, $Ar_{12B}$, $Ar_{14B}$, and $Ar_{15B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{905}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{901}$ to $R_{905}$ are present, the two or more of each of $R_{901}$ to $R_{905}$ may be the same as or different from each other.

In one embodiment, $L_{13B}$ in the formula (11-2B) is selected from the group consisting of
a substituted or unsubstituted phenylene group,
a substituted or unsubstituted biphenylene group,
a substituted or unsubstituted terphenylene group, and
a substituted or unsubstituted 9,9-dialkylfluorenylene group.

In one embodiment, $L_{11B}$, $L_{12B}$, $L_{14B}$, and $L_{15B}$ in the formula (11-2B) are independently selected from the group consisting of
a single bond,
a substituted or unsubstituted phenylene group,
a substituted or unsubstituted biphenyldiyl group, and
a substituted or unsubstituted terphenylene group.

In one embodiment, $Ar_{11B}$, $Ar_{12B}$, $Ar_{14B}$, and $Ar_{15B}$ in the formula (11-2B) are independently selected from the group consisting of
a substituted or unsubstituted phenyl group,
a substituted or unsubstituted naphthyl group,
a substituted or unsubstituted biphenyl group,
a substituted or unsubstituted terphenyl group,
a substituted or unsubstituted anthryl group,
a substituted or unsubstituted 9,9-dialkylfluorenyl group,
a substituted or unsubstituted 9,9-diarylfluorenyl group,
a substituted or unsubstituted carbazolyl group,
a substituted or unsubstituted dibenzofuranyl group, and
a substituted or unsubstituted thienyl group.

In one embodiment, in the formula (11-2B),
$L_{13B}$ is
a substituted or unsubstituted biphenyldiyl group,
$L_{11B}$, $L_{12B}$, $L_{14B}$, and $L_{15B}$ are independently selected from the group consisting of
a single bond,
an unsubstituted phenylene group,
an unsubstituted biphenylene group; and
$Ar_{11B}$, $Ar_{12B}$, $Ar_{14B}$, and $Ar_{15B}$ are independently
an unsubstituted phenyl group,
an unsubstituted naphthyl group,
an unsubstituted biphenyl group,
an unsubstituted terphenyl group,
an unsubstituted anthryl group,
an unsubstituted 9,9-dialkylfluorenyl group,
an unsubstituted 9,9-diarylfluorenyl group,
an unsubstituted carbazolyl group,
an unsubstituted dibenzofuranyl group, and
a substituted or unsubstituted thienyl group.

<Compound Represented by the Formula (11-3)>

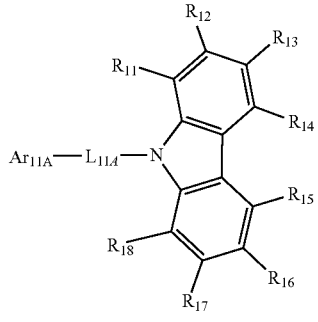

In the formula (11-3),
$L_{11A}$ is a single bond or a linking group;
$Ar_{11A}$ is
a substituted or unsubstituted aryl group including 6 to 50 ring carbon atoms, or
a substituted or unsubstituted monovalent heterocyclic group including 5 to 50 ring atoms;
one or more sets of adjacent two or more of $R_{11}$ to $R_{18}$ form a substituted or unsubstituted, saturated or unsaturated ring by bonding with each other, or do not form the ring;
$R_{11}$ to $R_{18}$ which do not form the ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;

$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{901}$ to $R_{907}$ are present, the two or more of each of $R_{901}$ to $R_{907}$ may be the same as or different from each other.

<Compound Represented by the Formula (11-3B)>

In one embodiment, the compound represented by the formula (11-3) is a compound represented by the following formula (11-3B). The compound represented by the following formula (11-3B) is a compound having at least one carbazolyl group and having one or more disubstituted amino groups or not having a disubstituted amino group.

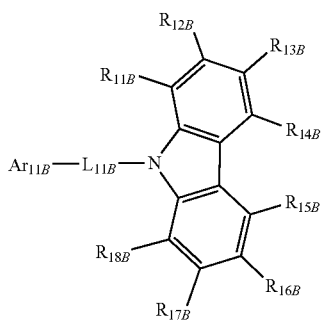

(11-3B)

In the formula (11-3B),
$L_{11B}$ is
a single bond, or
a substituted or unsubstituted arylene group including 6 to 50 ring carbon atoms;
$Ar_{11B}$ is
a substituted or unsubstituted aryl group including 6 to 50 ring carbon atoms, or
a substituted or unsubstituted monovalent heterocyclic group including 5 to 50 ring atoms;
$R_{11B}$ to $R_{18B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;

$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11B}$, $Ar_{11B}$, and $R_{11B}$ to $R_{18B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{905}$ are as defined above.

In one embodiment, $L_{11B}$ in the formula (11-3B) is selected from the group consisting of
a single bond,
a substituted or unsubstituted phenylene group,
a substituted or unsubstituted biphenyldiyl group,
a substituted or unsubstituted dibenzofuranylene group.
In one embodiment, $Ar_{11B}$ in the formula (11-3B) is selected from the group consisting of
a substituted or unsubstituted phenyl group,
a substituted or unsubstituted biphenyl group, or
a substituted or unsubstituted dibenzofuranyl group.
In one embodiment, $Ar_{11B}$ in the formula (11-3B) is
a substituted or unsubstituted phenyl group.
In one embodiment, $R_{11B}$ to $R_{18B}$ in the formula (11-3B) are independently
a hydrogen atom, or
a substituted or unsubstituted phenyl group.
In one embodiment, $L_{11B}$ in the formula (11-3B) is selected from the group consisting of
an unsubstituted phenylene group,
a substituted or unsubstituted biphenylene group, and
a substituted or unsubstituted dibenzofuranylene group;
$Ar_{11B}$ is selected from the group consisting of
a substituted or unsubstituted phenyl group,
a substituted or unsubstituted biphenylene group; and
$R_{11B}$ to $R_{18B}$ are independently
a hydrogen atom, or
a substituted or unsubstituted phenyl group.
In one embodiment, the linking group in the formulas (11) and (11-1) to (11-3) is
a substituted or unsubstituted arylene group including 6 to 50 ring carbon atoms, or
a substituted or unsubstituted divalent heterocyclic group including 5 to 50 ring atoms.
In one embodiment, $Ar_{11A}$ to $Ar_{15A}$ in the formulas (11-1) to (11-3) are independently selected from the group consisting of a substituted or unsubstituted phenyl group,
a substituted or unsubstituted biphenyl group,
a substituted or unsubstituted terphenyl group,
a substituted or unsubstituted fluorenyl group,
a substituted or unsubstituted spirofluorenyl group,
a substituted or unsubstituted naphthyl group,
a substituted or unsubstituted anthryl group,
a substituted or unsubstituted carbazolyl group, and
a substituted or unsubstituted dibenzofuranyl group.

<Compound Represented by the Formula (11-3C)>

In one embodiment, the compound represented by the formula (11-3) is a compound represented by the following formula (11-3C). The compound represented by the following formula (11-3C) is a monoamine compound having a carbazolyl group and having one disubstituted amino group.

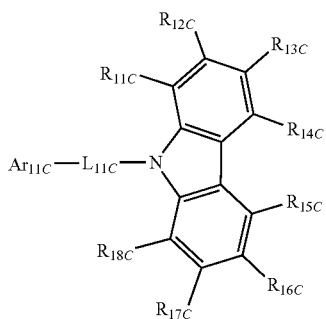

(11-3C)

In the formula (11-3C), $L_{11C}$ is a single bond or a linking group;

$Ar_{11C}$ is
a substituted or unsubstituted aryl group including 6 to 50 ring carbon atoms, or
a substituted or unsubstituted monovalent heterocyclic group including 5 to 50 ring atoms;
one or more sets of adjacent two or more of $R_{11C}$ to $R_{18C}$ form a substituted or unsubstituted, saturated or unsaturated ring by bonding with each other, or do not form the ring;

$R_{11C}$ to $R_{18C}$ which do not form the ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—$Si(R_{901})(R_{902})(R_{903})$,
—$O$—$(R_{904})$,
—$S$—$(R_{905})$,
—$N(R_{906})(R_{907})$,
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;

$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11C}$, $Ar_{11C}$, and $R_{11C}$ to $R_{18C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—$N(R_{906})(R_{907})$,
—$Si(R_{901})(R_{902})(R_{903})$,
—$O$—$(R_{904})$,
—$S$—$(R_{905})$,
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;

$R_{901}$ to $R_{905}$ are as defined above; and
provided that the sum of the number of —$N(R_{906})(R_{907})$'s which are $R_{11C}$ to $R_{18C}$ and the number of substituents —$N(R_{906})(R_{907})$ possessed by $Ar_{11C}$, $L_{11C}$, and $R_{11C}$ to $R_{18C}$ is 1.

<Compound Represented by the Formula (11-3D)>

In one embodiment, the compound represented by the formula (11-3) is a compound represented by the following formula (11-3D). The compound represented by the following formula (11-3D) is a monoamine compound having a substituent containing one disubstituted amino group at the 3rd position of a carbazolyl group.

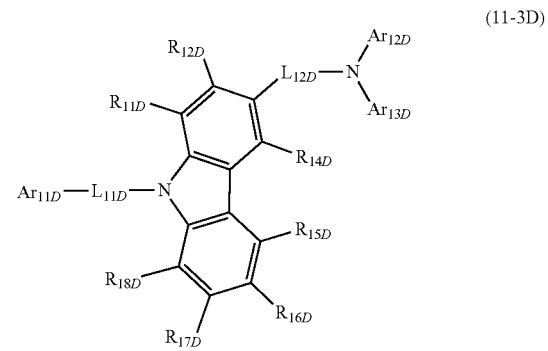

(11-3D)

In the formula (11-3D), $L_{11D}$ and $L_{12D}$ are independently
a single bond, or
a substituted or unsubstituted arylene group including 6 to 50 ring carbon atoms;

$Ar_{11D}$ to $Ar_{13D}$ are independently
a substituted or unsubstituted aryl group including 6 to 50 ring carbon atoms, or
a substituted or unsubstituted monovalent heterocyclic group including 5 to 50 ring atoms;

$R_{11D}$, $R_{12D}$, and $R_{14D}$ to $R_{18D}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
  $R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
  substituents when $L_{11D}$, $L_{12D}$, $Ar_{11D}$ to $Ar_{13D}$, $R_{11D}$, $R_{12D}$, and $R_{14D}$ to $R_{18D}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
  $R_{901}$ to $R_{905}$ are as defined above.
  In one embodiment, in the first layer, one of the first hole-transporting material and the second hole-transporting material is one or more selected from the compounds represented by the formula (11-3C), and
    the other is one or more selected from the compounds represented by the formula (11) other than the compound represented by the formula (11-3C).
  In one embodiment, in the first layer, one of the first hole-transporting material and the second hole-transporting material is one or more selected from the compounds represented by the formula (11-1C), and
    the other is one or more selected from the compounds represented by the formula (11-3D).
  In one embodiment, the second layer contains one selected from
    the acceptor material, and
    the compound represented by the formula (11-3B).
  In one embodiment, the second layer contains one selected from
    the acceptor material, and
    the compound represented by the formula (11-3D).
  In one embodiment, the second layer contains
    the acceptor material,
    one or more selected from the compounds represented by the formula (11-3B), and
    one or more of the compounds represented by the formula (11) other than the compound represented by the formula (11-3B).
  In one embodiment, the second layer contains
    the acceptor material,
    one or more selected from the compounds represented by the formula (11-3D), and
    one or more of the compounds represented by the formula (11) other than the compound represented by the formula (11-3D).
  In one embodiment, in the first layer, one of the first hole-transporting material and the second hole-transporting material is one or more selected from the compounds represented by the formula (11-3C),
    the other is one or more selected from the compounds represented by the formula (11), other than the compound represented by the formula (11-3C), and
    the second layer contains one selected from
    the acceptor material, and
    the compound represented by the formula (11-3B).
  In one embodiment, in the first layer, one of the first hole-transporting material and the second hole-transporting material is one or more selected from the compounds represented by the formula (11-3C),
    the other is one or more selected from the compounds represented by the formula (11), other than the compound represented by the formula (11-3C), and
    the second layer contains one selected from
    the acceptor material, and
    the compound represented by the formula (11-3D).
  In one embodiment, in the first layer, one of the first hole-transporting material and the second hole-transporting material is one or more selected from the compounds represented by the formula (11-3C),
    the other is one or more selected from the compounds represented by the formula (11), other than the compound represented by the formula (11-3C), and
    the second layer contains
    the acceptor material,
    one or more selected from the compound represented by the formula (11-3B), and
    one or more compounds represented by the formula (11) other than the compound represented by the formula (11-3B).
  In one embodiment, in the first layer, one of the first hole-transporting material and the second hole-transporting material is one or more selected from the compounds represented by the formula (11-1C),
    the other is a compound represented by the formula (11-3D), and
    the second layer contains
    the acceptor material,
    one or more selected from the compounds represented by the formula (11-3D), and
    one or more compounds represented by the formula (11) other than the compound represented by the formula (11-3D).

In one embodiment, the substituent of the "substituted or unsubstituted" in the formulas (11) and (11-1) to (11-3) is selected from

- a substituted or unsubstituted alkyl group including 1 to 50 carbon atoms,
- a substituted or unsubstituted alkenyl group including 2 to 50 carbon atoms,
- a substituted or unsubstituted alkynyl group including 2 to 50 carbon atoms,
- a substituted or unsubstituted cycloalkyl group including 3 to 50 ring carbon atoms,
- —Si($R_{901}$)($R_{902}$)($R_{903}$),
- —O—($R_{904}$),
- —S—($R_{905}$),
- —N($R_{906}$)($R_{907}$),
- a halogen atom, a cyano group, a nitro group,
- a substituted or unsubstituted aryl group including 6 to 50 ring carbon atoms, and
- a substituted or unsubstituted monovalent heterocyclic group including 5 to 50 ring atoms, wherein
- $R_{901}$ to $R_{907}$ are independently
- a hydrogen atom,
- a substituted or unsubstituted alkyl group including 1 to 50 carbon atoms,
- a substituted or unsubstituted cycloalkyl group including 3 to 50 ring carbon atoms,
- a substituted or unsubstituted aryl group including 6 to 50 ring carbon atoms, or
- a substituted or unsubstituted monovalent heterocyclic group including 5 to 50 ring atoms; and when two or more of each of $R_{901}$ to $R_{907}$ are present, the two or more of each of $R_{901}$ to $R_{907}$ may be the same as or different from each other.

Specific examples of the compound represented by the formula (11) will be described below, and these are merely examples, and the compound represented by the formula (11) is not limited to the following specific examples.

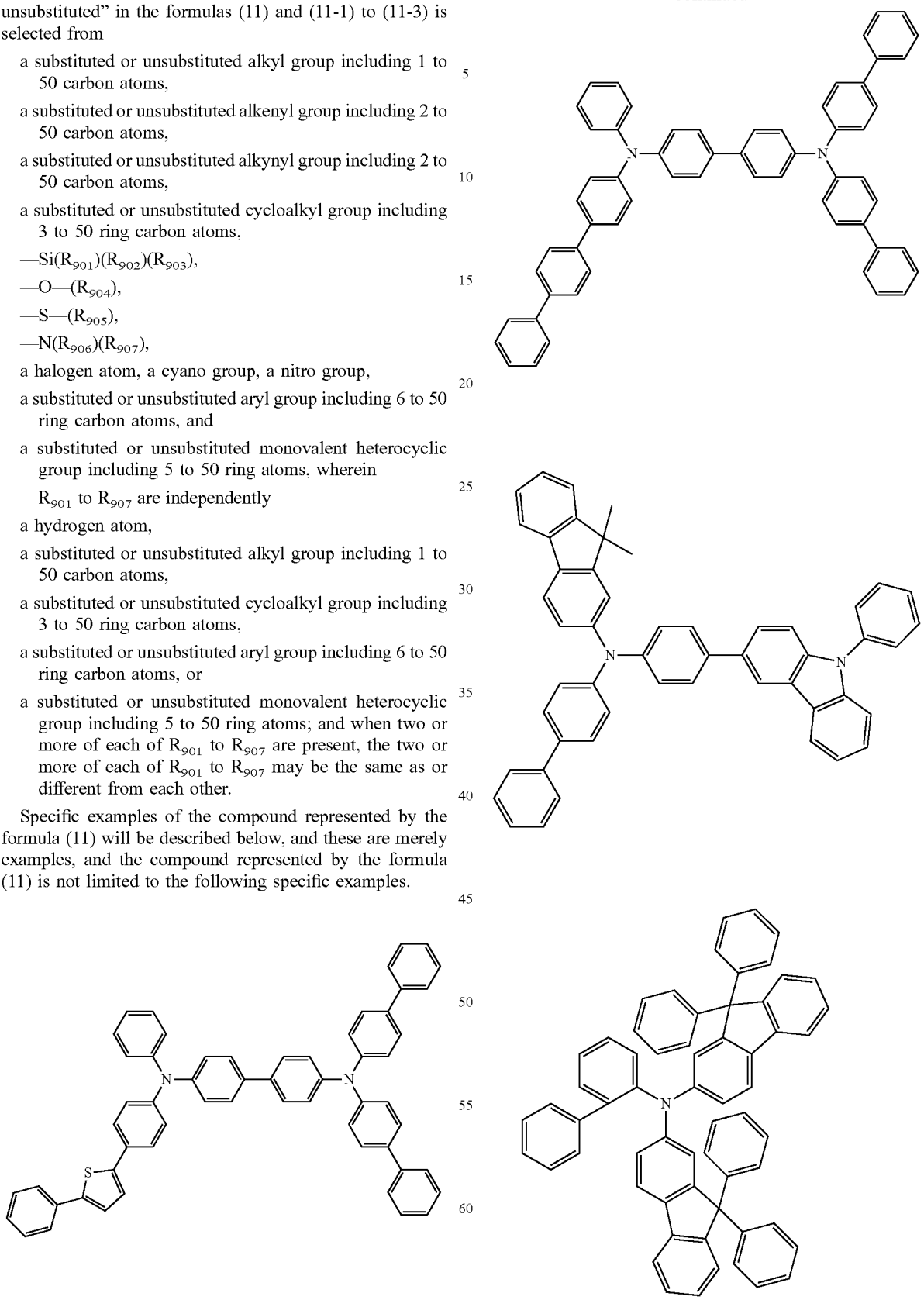

95
-continued
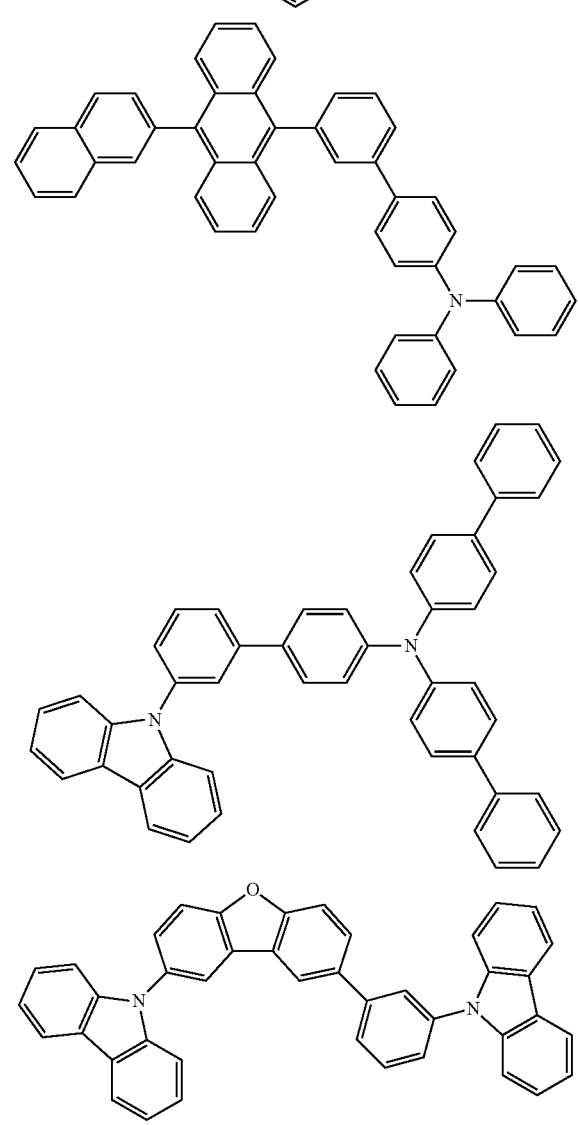
96
-continued
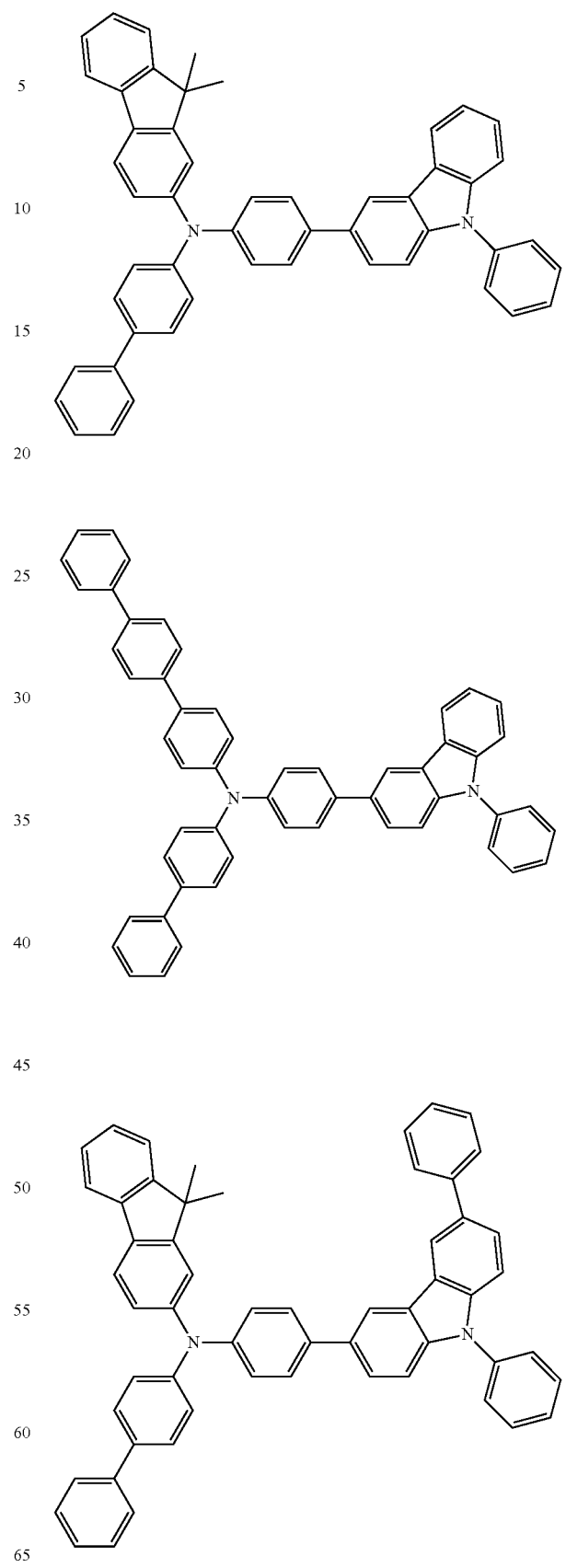

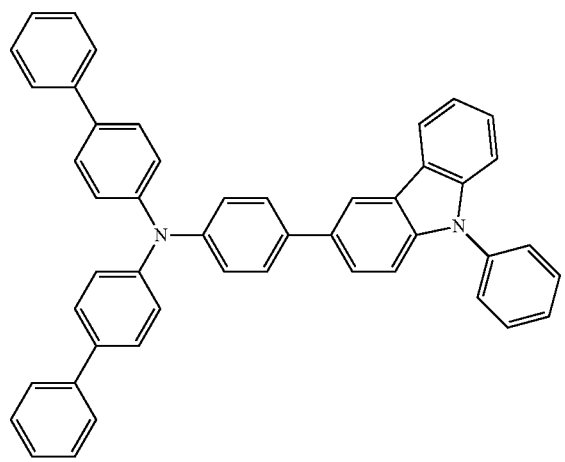
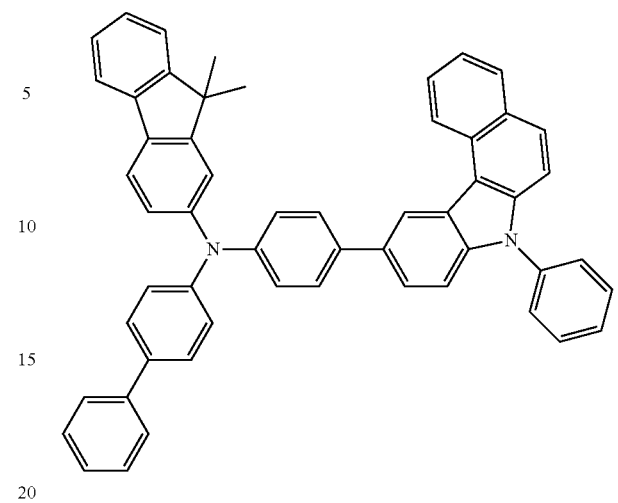
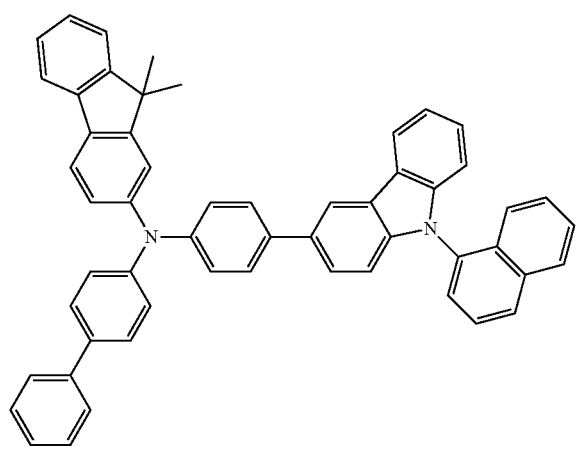
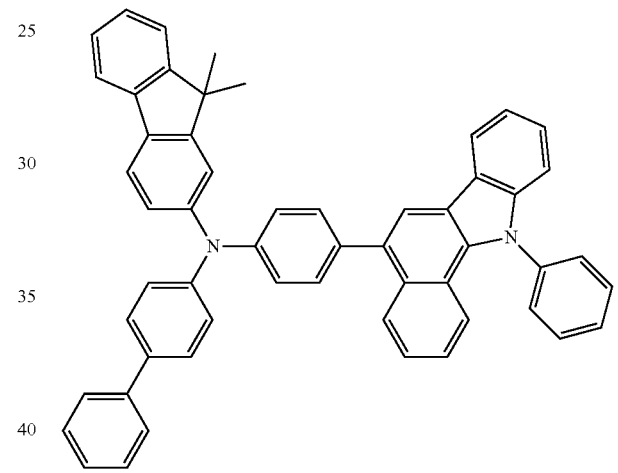
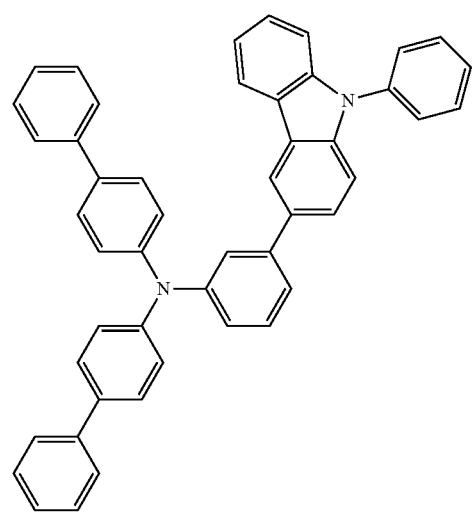

99
-continued
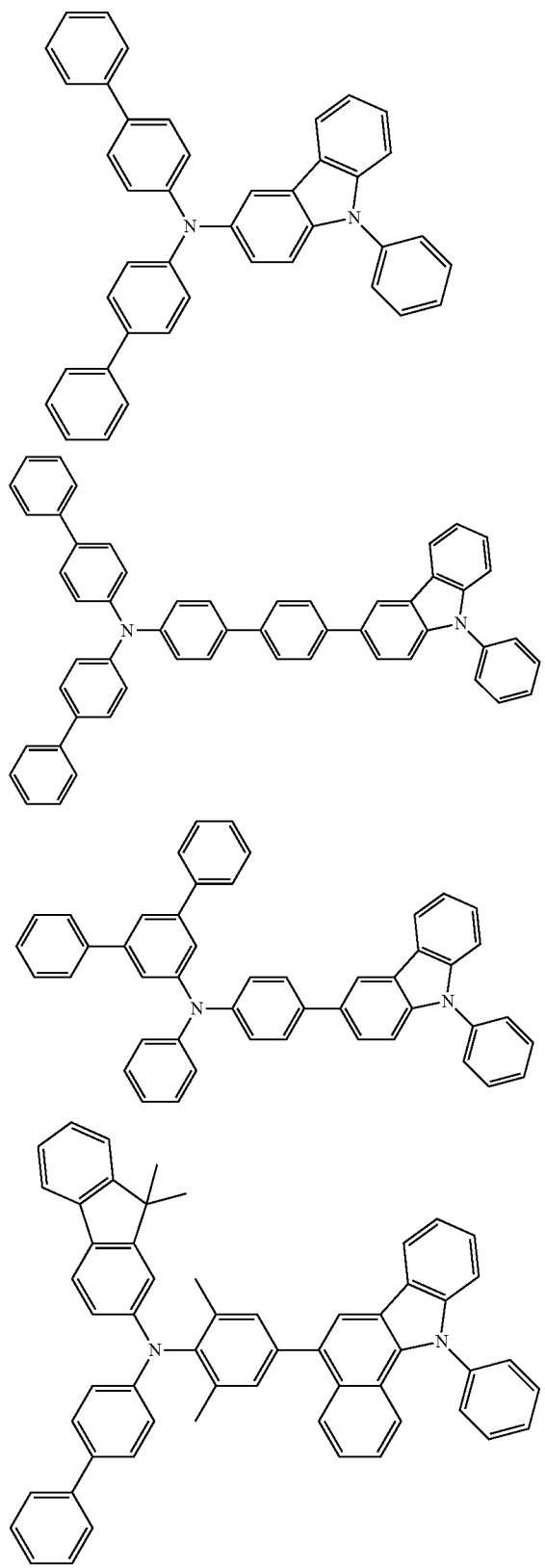
100
-continued
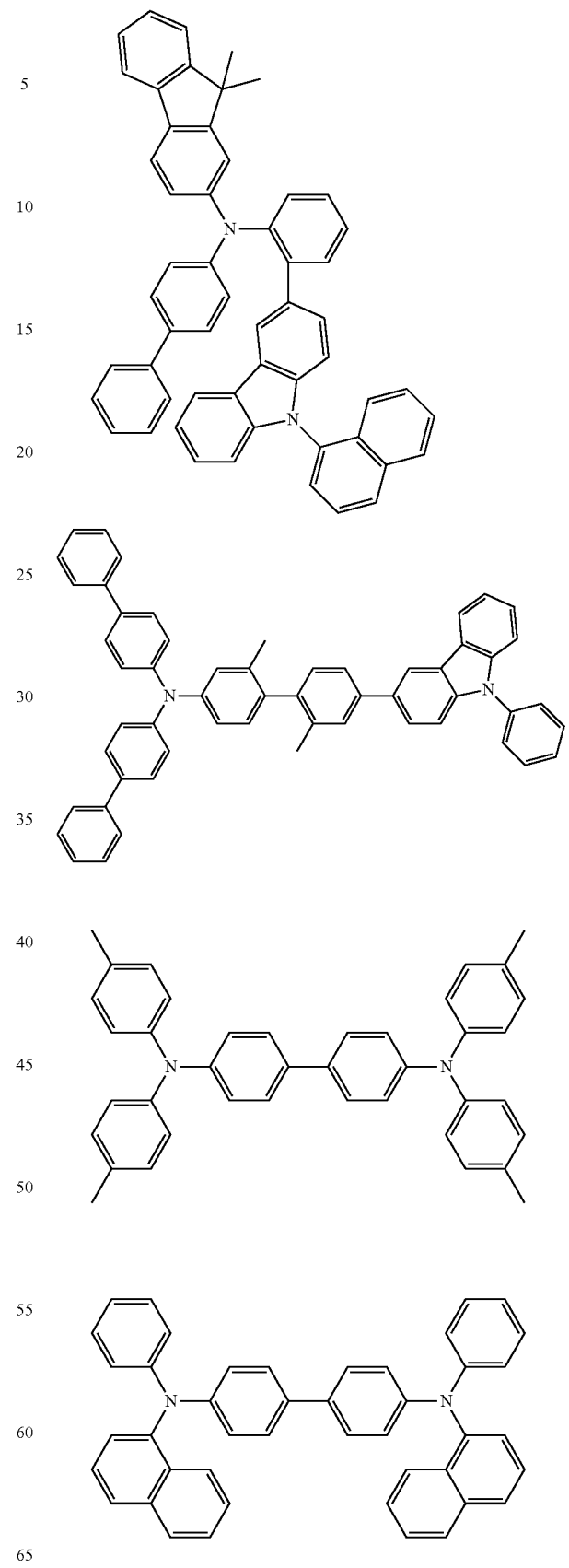

101
-continued
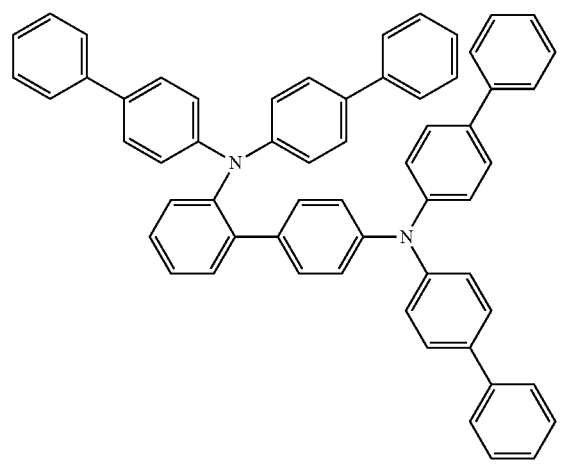
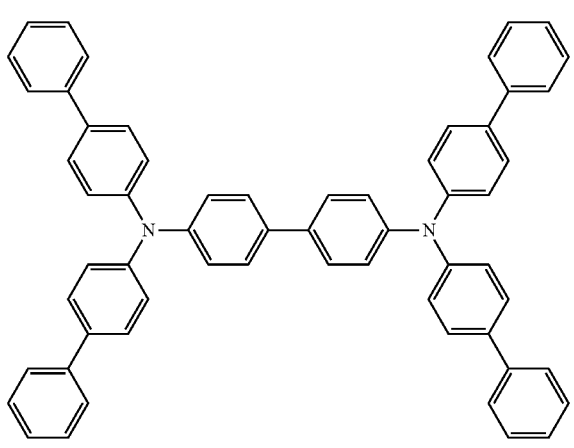
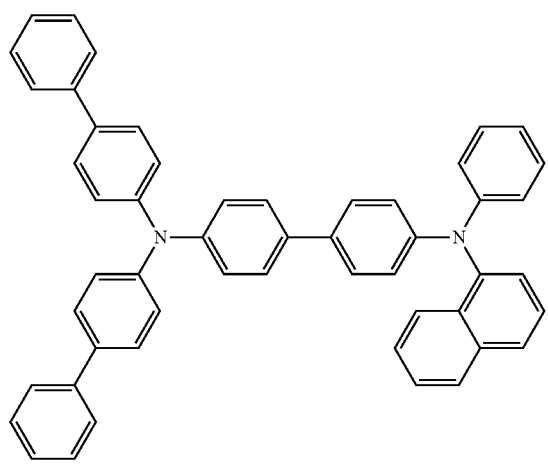
102
-continued
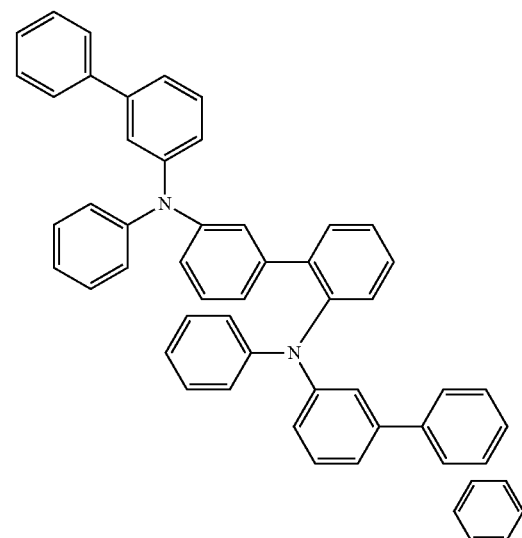
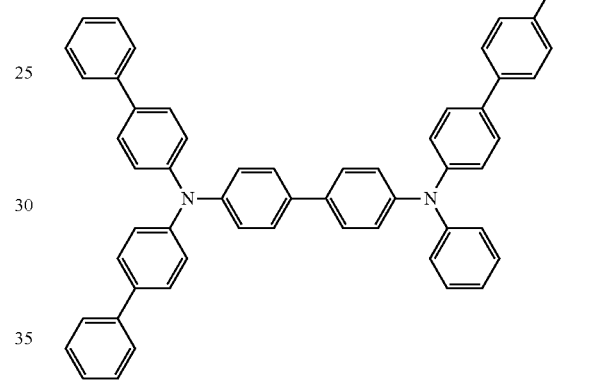
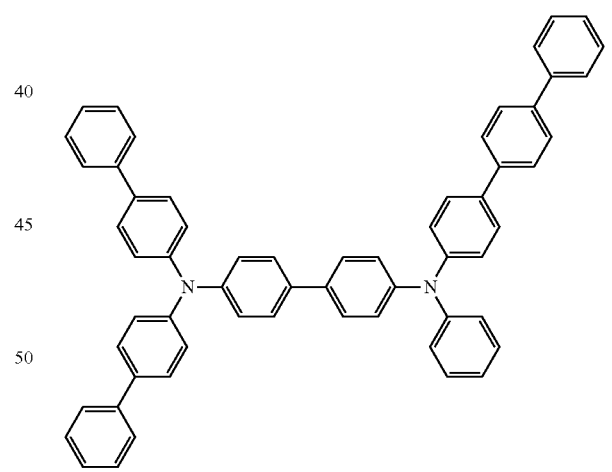
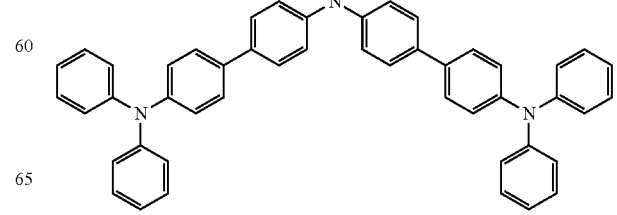

103
-continued
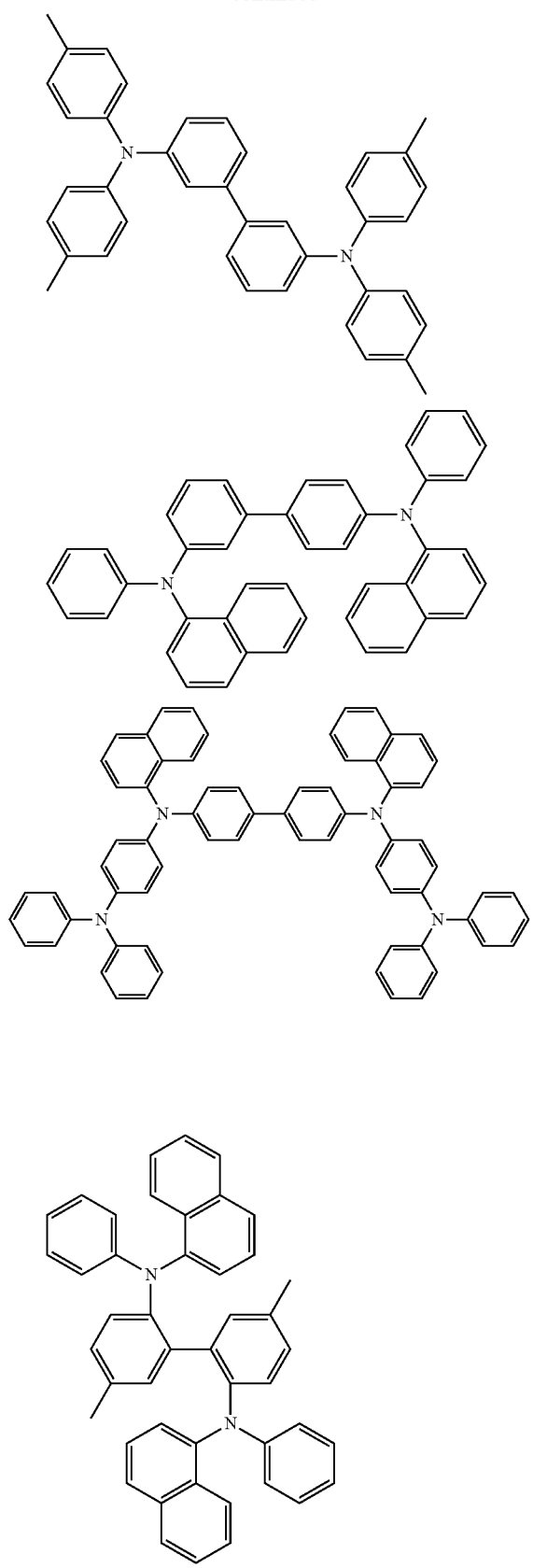
104
-continued
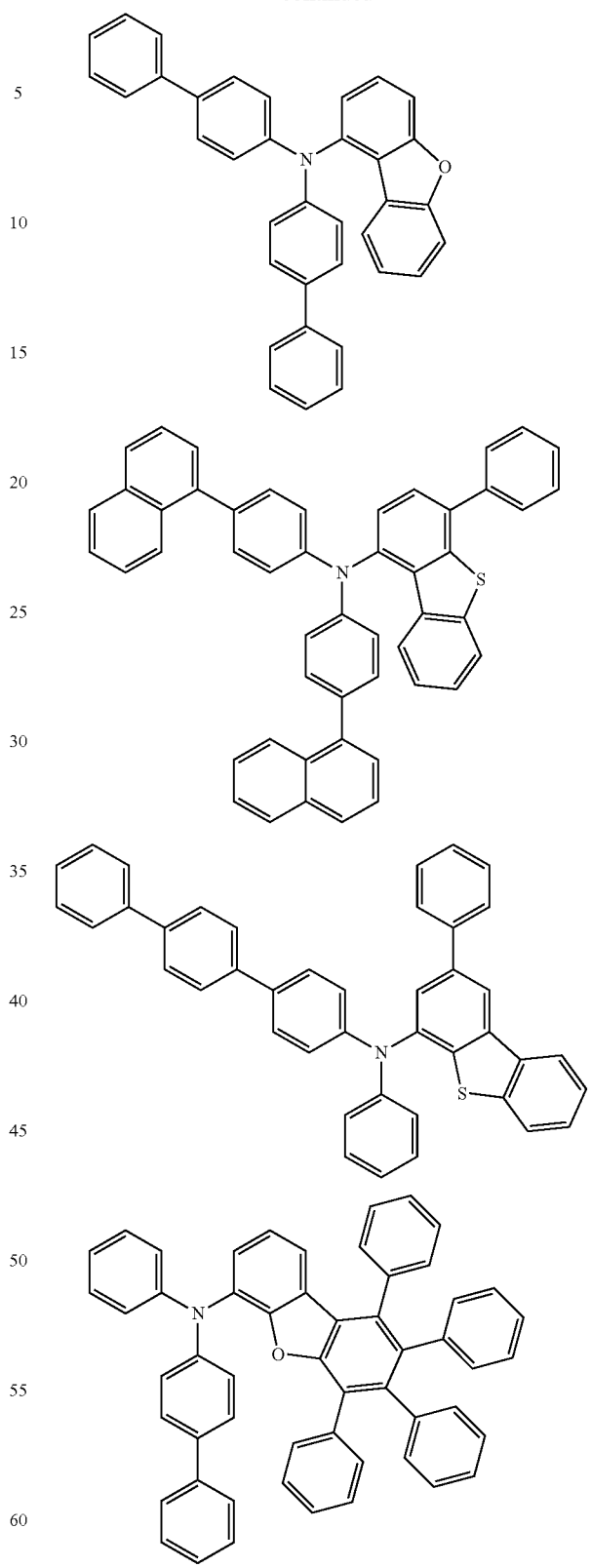

105
-continued
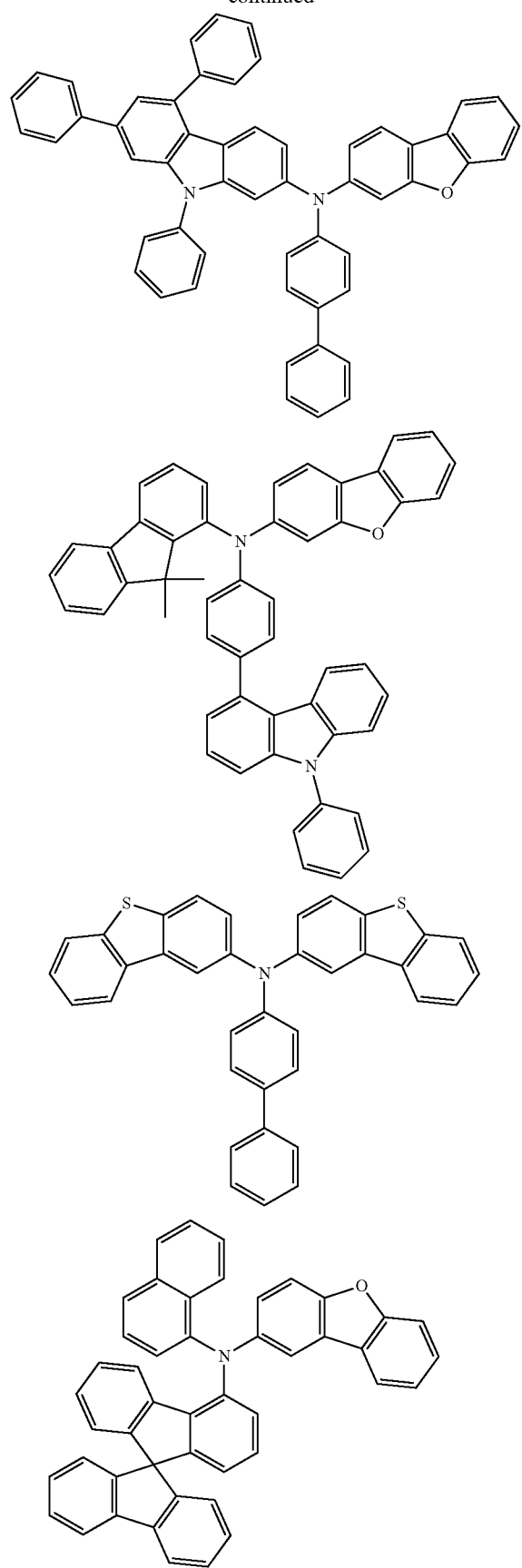
106
-continued
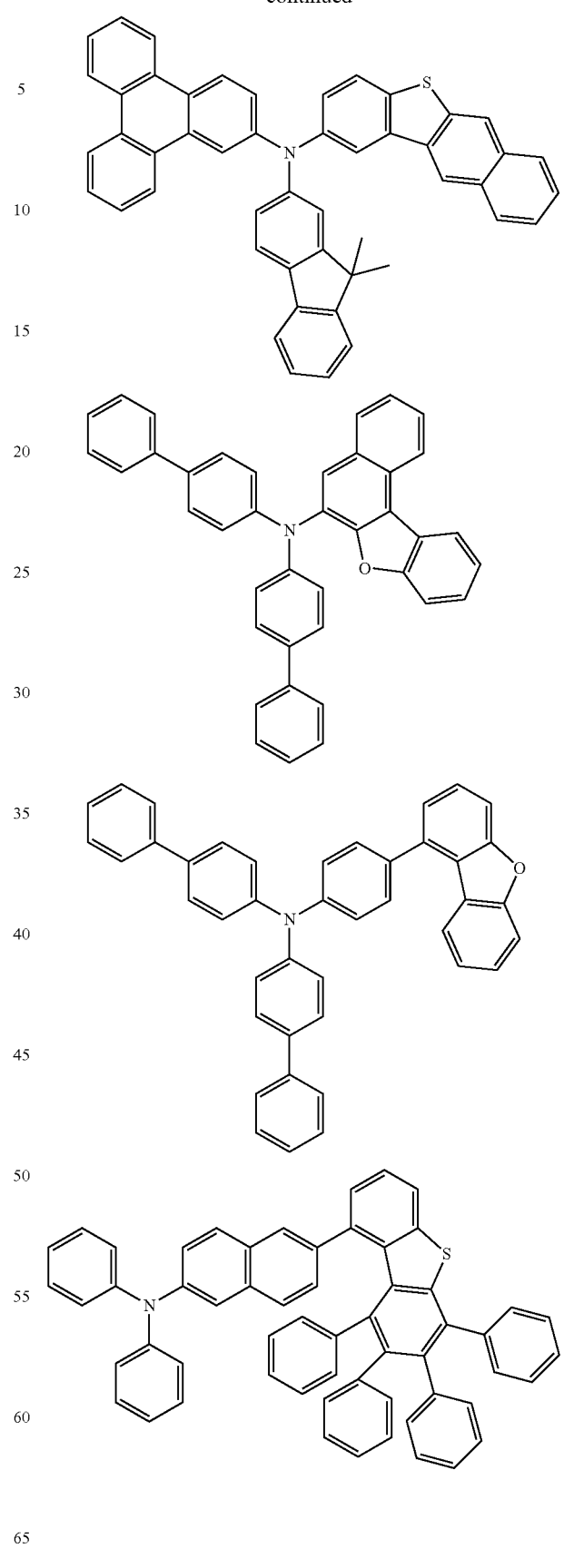

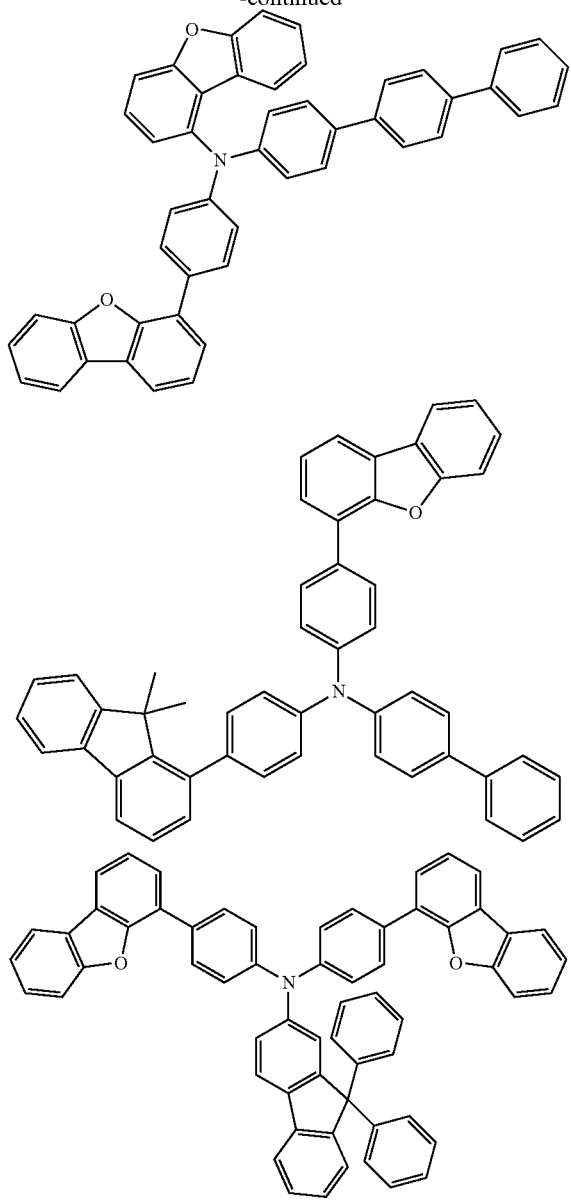

Known materials and device configurations may be applied to the organic EL device according to an aspect of the invention as long as the effect of the invention is not impaired, except that the first layer contains the first hole-transporting material and the second hole-transporting material, and the second layer contains the first hole-transporting material, the second hole-transporting material, and the acceptor material.

Parts which can be used in the organic EL device according to an aspect of the invention, materials for forming respective layers, other than the above-mentioned compounds, and the like, will be described later.

(Substrate)

A substrate is used as a support of an emitting device. As the substrate, glass, quartz, plastic or the like can be used, for example. Further, a flexible substrate may be used. The "flexible substrate" means a bendable (flexible) substrate, and specific examples thereof include a plastic substrate formed of polycarbonate, polyvinyl chloride, or the like.

(Anode)

For the anode formed on the substrate, metals, alloys, electrically conductive compounds, mixtures thereof, and the like, which have a large work function (specifically 4.0 eV or more) are preferably used. Specific examples thereof include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, specific examples thereof include gold (Au), platinum (Pt), a nitride of a metallic material (for example, titanium nitride), and the like.

(Hole-Injecting Layer)

The hole-injecting layer is a layer containing a substance having a high hole-injecting property. As such a substance having high hole-injecting property molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (oligomers, dendrimers, polymers, etc.) can be given. The hole-injecting layer may also contain the hole-transporting material, the first hole-transporting material, and/or the second hole-transporting material.

(Hole-Transporting Layer)

The hole-transporting layer is a layer containing a substance having a high hole-transporting property. In addition to the first hole-transporting material and the second hole-transporting material, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, a substance other than the above-described substances may be used as long as the substance has a higher hole-transporting property in comparison with an electron-transporting property. It should be noted that the layer containing the substance having high hole-transporting property may be not only a single layer, but also a layer in which two or more layers formed of the above-described substances are stacked.

(Guest Material for Emitting Layer)

The emitting layer is a layer containing a substance having a high emitting property, and various materials can be used for forming it. For example, as the substance having a high emitting property, a fluorescent compound which emits fluorescence or a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, pyrene derivatives, styrylamine derivatives, chrysene derivatives, fluoranthene derivatives, fluorene derivatives, diamine derivatives, triarylamine derivatives, and the like can be used. As a green fluorescent emitting material which can be used for an emitting layer, aromatic amine derivatives and the like can be used. As a red fluorescent emitting material which can be used for an emitting layer, tetracene derivatives, diamine derivatives and the like can be used.

As a blue phosphorescent emitting material which can be used for an emitting layer, metal complexes such as iridium complexes, osmium complexes, platinum complexes and the like are used. As a green phosphorescent emitting material which can be used for an emitting layer, iridium complexes and the like are used. As a red phosphorescent emitting material which can be used for an emitting layer, metal complexes such as iridium complexes, platinum complexes, terbium complexes, europium complexes and the like are used.

(Host Material for Emitting Layer)

The emitting layer may have a constitution in which the substance having a high emitting property (guest material) is dispersed in another substance (host material). As a substance for dispersing the substance having a high emitting property, a variety of substances can be used, and it is preferable to use a substance having a higher lowest unoccupied orbital level (LUMO level) and a lower highest occupied orbital level (HOMO level) than the substance having a high emitting property.

As a material (host material) for dispersing the substance having a high emitting property, 1) a metal complex such as an aluminum complex, a beryllium complex, or a zinc complex, 2) a heterocyclic compound such as an oxadiazole derivative, a benzimidazole derivative, or a phenanthroline derivative, 3) a fused aromatic compound such as a carbazole derivative, an anthracene derivative, a phenanthrene derivative, a pyrene derivative, or a chrysene derivative, and 3) an aromatic amine compound such as a triarylamine derivative or a fused polycyclic aromatic amine derivative are used.

(Electron-Transporting Layer)

An electron-transporting layer is a layer that comprises a substance having a high electron-transporting property. For the electron-transporting layer, 1) metal complexes such as aluminum complexes, beryllium complexes, zinc complexes, or the like; 2) heteroaromatic complexes such as imidazole derivatives, benzimidazole derivatives, azine derivatives, carbazole derivatives, phenanthroline derivatives, or the like; and 3) polymer compounds can be used.

(Electron-Injecting Layer)

An electron-injecting layer is a layer which contains a substance having a high electron-injecting property. For the electron-injecting layer, a compound which can be used in the electron-transporting layer described above, lithium (Li), ytterbium (Yb), lithium fluoride (LiF), cesium fluoride (CsF), calcium fluoride (CaF$_2$), metal complex compounds such as 8-hydroxyquinolinolato-lithium (Liq), alkali metals such as lithium oxide (LiO$_x$); alkaline earth metals or compounds thereof can be used.

(Cathode)

For the cathode, metals, alloys, electrically conductive compounds, mixtures thereof, and the like having a small work function (specifically, 3.8 eV or lower) are preferably used. Specific examples of such a cathode material include elements belonging to Group 1 or Group 2 of the Periodic Table of the Elements, i.e., alkali metals such as lithium (Li) and cesium (Cs), alkaline earth metals such as magnesium (Mg), calcium (Ca) and strontium (Sr), and alloys containing these metals (e.g., MgAg and AlLi); rare earth metals such as europium (Eu) and ytterbium (Yb), and alloys containing these metals.

In the organic EL device according to an aspect of the invention, the methods for forming the respective layers are not particularly limited. A conventionally-known method for forming each layer according to a vacuum deposition process, a spin coating process or the like can be used. Each layer such as the emitting layer can be formed by a known method such as a vacuum deposition process, a molecular beam deposition process (MBE process), or an application process such as a dipping process, a spin coating process, a casting process, a bar coating process, or a roll coating process, using a solution prepared by dissolving the material in a solvent.

In the organic EL device according to an aspect of the invention, the thickness of each layer is not particularly limited, but is generally preferable that the thickness be in the range of several nm to 1 µm in order to suppress defects such as pinholes, to suppress applied voltages to be low, and to improve luminous efficiency.

[Electronic Apparatus]

The electronic apparatus according to an aspect of the invention is characterized in that the organic EL device according to an aspect of the invention is equipped with.

Specific examples of the electronic apparatus include display components such as an organic EL panel module, and the like; display devices for a television, a cellular phone, a personal computer, and the like; and emitting devices such as a light, a vehicular lamp, and the like.

EXAMPLES

Hereinafter, Examples according to the invention will be described. The invention is not limited in any way by these Examples.

<Compounds>

The compounds represented by the formula (21) used for fabricating the organic EL devices of Examples 1 to 24 and Comparative Examples 1 to 16 are shown below.

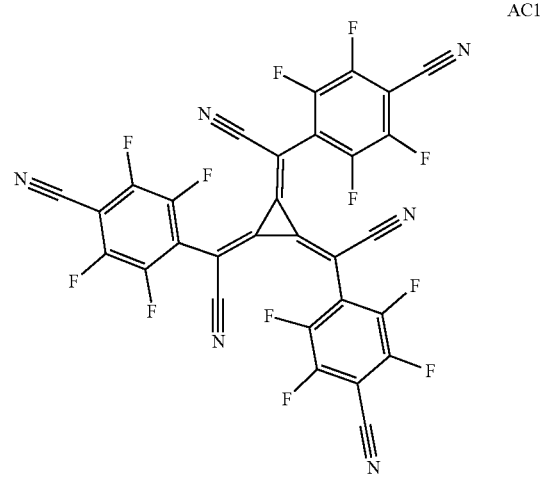 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

AC1

The hole-transporting materials used for fabricating the organic EL devices of Examples 1 to 24 and Comparative Examples 1 to 16 are shown below.

HT1
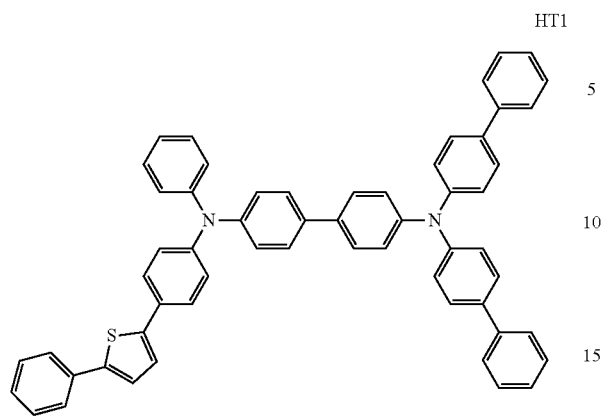
HT4
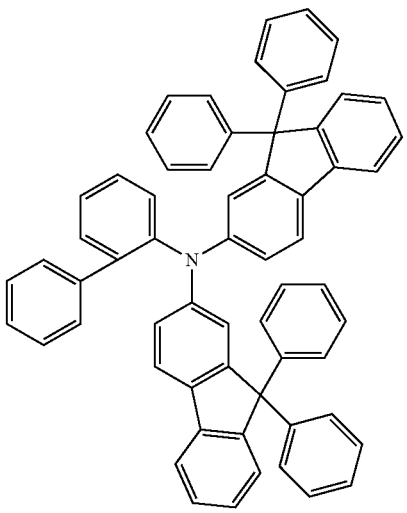
HT2
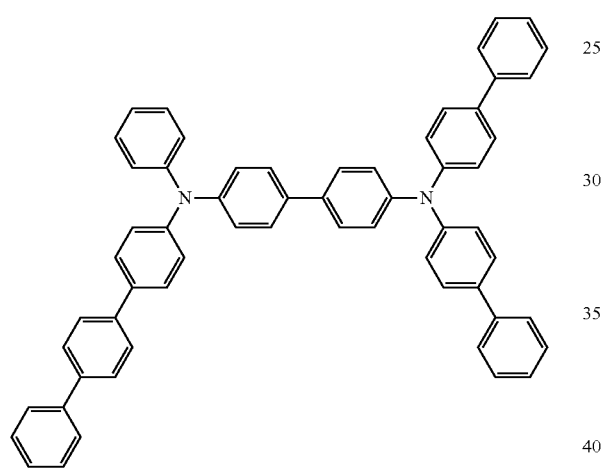
HT5
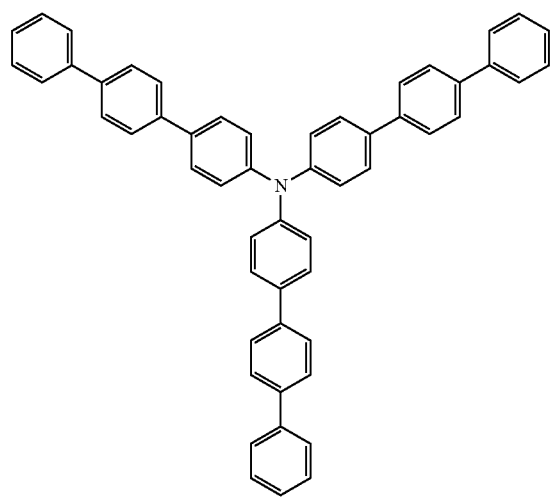
HT3
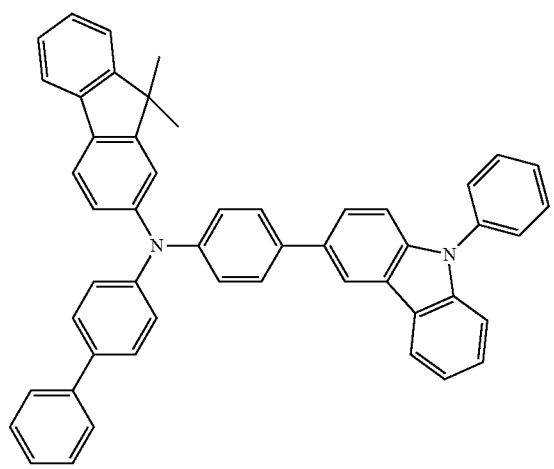
HT6
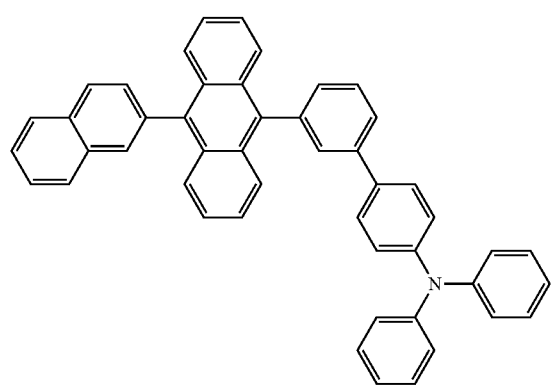

-continued

HT7
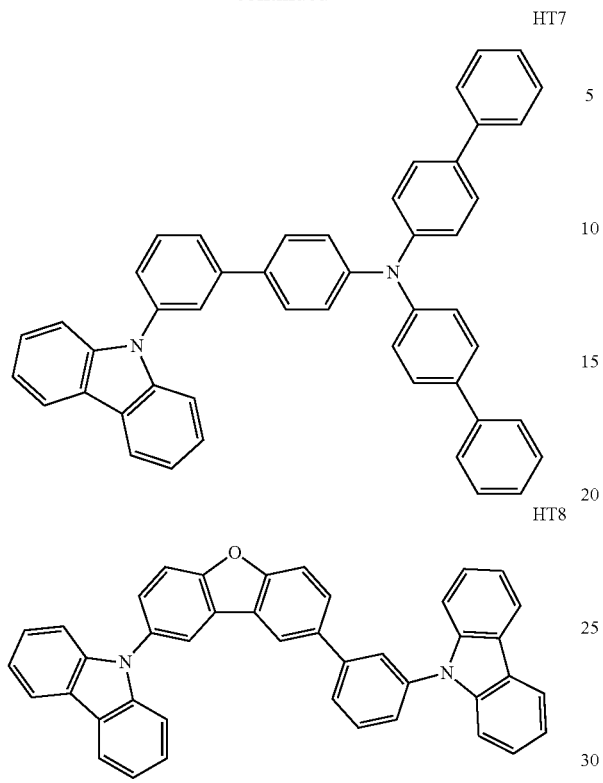

HT8

The other compounds used for fabricating the organic EL devices of Examples 1 to 24 and Comparative Examples 1 to 16 are shown below

EBL

BH

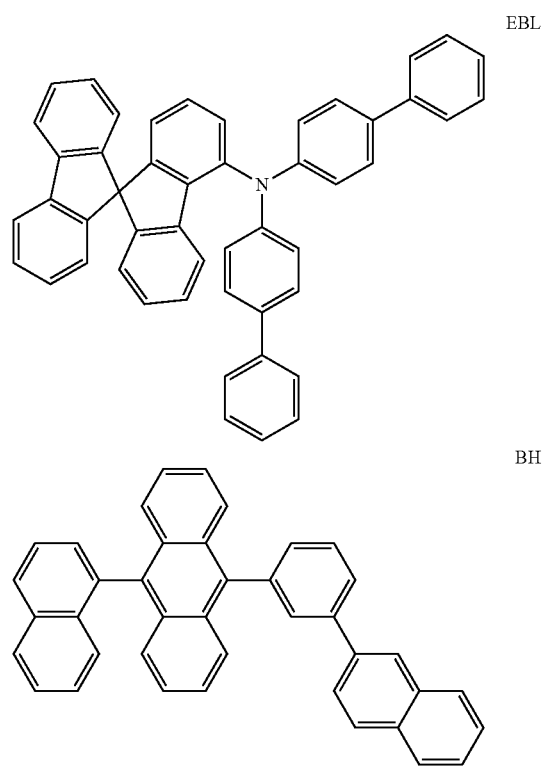

-continued

BD

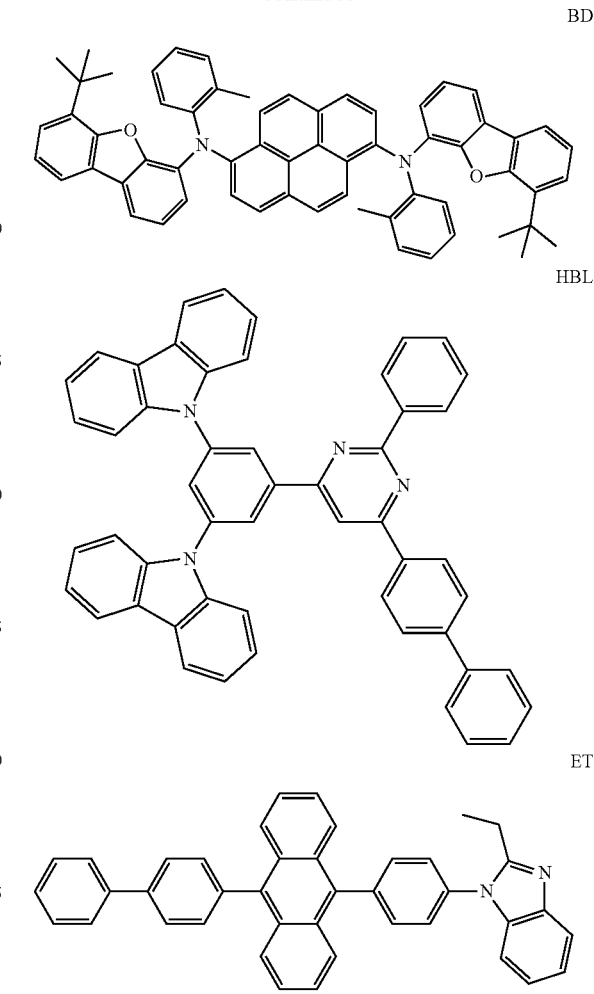

HBL

ET

The affinity value of the Compound AC1 was determined as follows, and found to be 5.5 eV.

Affinity Af was calculated by the following and subsequent formula:

$$Af = -1.19 \times (Ere - Efc) - 4.78 \text{ eV}$$

wherein
Ere: first reduction potential (DPV, Negative scan)
Efc: first oxidation potential of ferrocene (DPV, Positive scan), (ca. +0.55 V vs Ag/AgCl)

The redox potential was measured by a differential pulse voltammetry (DPV) method using an electrochemical analyzer (manufactured by ALS Co., Ltd.: CHI630B).

N,N-dimethylformamide (DMF) was used as solvent, and the sample concentration was set to 1.0 mmol/L. Tetrabuthylammmonium hexafluorophosphate (TBHP) (100 mmol/L) was used as the supporting electrolyte. Glassy carbon and Pt were used as the working electrode and the counter electrode, respectively. (Reference document) M. E. Thompson, et. al., Organic Electronics, 6 (2005), p. 11-20, Organic Electronics, 10 (2009), p. 515-520

The ionization potential (Ip) (eV) of the hole-transporting material described above is determined as follows, and is shown in Table 1 below.

The ionization potential (Ip) denotes an energy required to remove electrons from a compound of a host material for ionization, and is, for example, a value measured by an Ultraviolet Photoemission Yield Spectroscometer (AC-3, Riken Keiki Co., Ltd.). In Examples, Ip was measured using an Atmospheric Photoemission Yield Spectroscometer (Riken Keiki Co., Ltd.: AC-3). Specifically, a material was irradiated with light, and the quantity of electrons generated by charge-separation was measured.

TABLE 1

| Hole-transporting material | Ionization potential (eV) |
|---|---|
| HT1 | 5.49 |
| HT2 | 5.54 |
| HT3 | 5.48 |
| HT4 | 5.61 |
| HT5 | 5.64 |
| HT6 | 5.96 |
| HT7 | 5.72 |
| HT8 | 6.05 |

<Fabrication of Organic EL Device 1>

An organic EL device was fabricated and evaluated as follows.

Example 1

A 25 mm×75 mm×1.1 mm-thick glass substrate with an ITO transparent electrode (anode) (manufactured by GEO-MATEC Co., Ltd.) was subjected to ultrasonic cleaning in isopropyl alcohol for 5 minutes, and then subjected to UV-ozone cleaning for 30 minutes. The thickness of the ITO film was 130 nm. The glass substrate with a transparent electrode line after being washed was mounted onto a substrate holder of a vacuum vapor deposition apparatus, and Compound HT1, Compound HT3, and Compound AC1 (acceptor material) were co-deposited on a surface on a side on which the transparent electrode line was formed so that a proportion of Compound HT1: Compound HT3: Compound AC1 became 69.5% by mass: 29.5% by mass: 1% by mass to form a hole-injecting layer (second layer) having a thickness of 5 nm.

Next, on the hole-injecting layer, Compound HT1 (first hole-transporting material) and Compound HT3 (second hole-transporting material) were co-deposited in a proportion of 70% by mass: 30% by mass to form a hole-transporting layer (first layer) having a thickness of 80 nm.

Then, on this hole-transporting layer, Compound EBL was deposited to form an electron-blocking layer (second hole-transporting layer) having a thickness of 10 nm.

Next, on this electron-blocking layer, Compound BH (host material) and Compound BD1 (dopant material) were co-deposited to be 2% by mass in a proportion of Compound BD1 to form an emitting layer having a thickness of 25 nm.

Next, Compound HBL was deposited on this emitting layer to form a first electron-transporting layer having a thickness of 10 nm.

Next, Compound ET was deposited on this first electron-transporting layer to form a second electron-transporting layer having a thickness of 15 nm.

Next, lithium fluoride (LiF) was deposited on this second electron-transporting layer to form an electron-injecting electrode (cathode) having a thickness of 1 nm.

Then, on this electron-injecting electrode, metal aluminum (Al) was deposited to form a metal Al cathode having a thickness of 80 nm.

The device configuration of the organic EL device of Example 1 is shown in a simplified style as follows.

ITO(130)/HT1:HT3:AC1(5, 69.5%:29.5%:1%)/HT1:HT3(80, 70%:30%)/EBL(10)/BH:BD1(25, 98%:2%)/HBL(10)/ET(15)/LiF(1)/Al(80)

The numerical values in parentheses indicate the thickness of the film (unit: nm). Also, in parentheses, the numerical values shown in terms of the percentage indicate the proportion (% by mass) of hole-transporting material (first hole-transporting material, second hole-transporting material) in the layer, and the percentage of dopant material (mass %).

<Evaluation of Organic EL Device>

The driving-voltage V of the resulting organic EL device (eV), the external quantum efficiency EQE (%) and the device lifetime LT95 (hr) were determined by the following methods.

Drive-Voltage V (eV)

Initial characteristics of the obtained organic EL devices were measured by DC (direct current)-constant current 10 mA/cm$^2$ driving at room temperature. The measurement results of the driving voltage are shown in Table 2.

External Quantum Efficiency EQE (%)

Voltage was applied to the resulting organic EL device, so that the current density was 10 mA/cm$^2$, and the EL emission spectrum was measured by a spectral radiance meter CS-1000 (Konica Minolta Corporation). External quantum efficiency EQE (%) was calculated from the obtained spectral radiance spectrum.

Device Lifetime LT95 (Hr)

Voltage was applied to the resulting organic EL device to be 50 mA/cm$^2$, and the time until the luminance became 95% of the initial luminance (LT95@50 mA/cm$^2$) was measured, and the result was shown in Table 2 as LT95 (hr).

Examples 2 to 16 and 21 to 24

Each of the organic EL devices was fabricated and evaluated in the same manner as in Example 1, except that the first and second hole-transporting materials described in Tables 2 to 17 below were used for the hole-injecting layer and the hole-transporting layer. Results are shown in Tables 3 to 17.

Comparative Example 1 to 8

Each of the organic EL devices was fabricated and evaluated in the same manner as in Example 1, except that the hole-transporting material described in Tables 2 to 17 below was used for the hole-injecting layer and the hole-transporting layer. Results are shown in Tables 2 to 17.

TABLE 2

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 1 | 1% | HT1:HT3 | 6.7 | 8.9 | 166 |
| Comparative Example 1 | 1% | HT1 | 6.2 | 8.7 | 58 |

TABLE 2-continued

|  | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Comparative Example 3 | 1% | HT3 | 7.2 | 9.2 | 49 |

TABLE 3

|  | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 2 | 1% | HT1:HT4 | 6.5 | 8.8 | 171 |
| Comparative Example 1 | 1% | HT1 | 6.2 | 8.7 | 58 |
| Comparative Example 4 | 1% | HT4 | >20 | 5.5 | 71 |

TABLE 4

|  | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 3 | 1% | HT1:HT5 | 6.6 | 8.8 | 136 |
| Comparative Example 1 | 1% | HT1 | 6.2 | 8.7 | 58 |
| Comparative Example 5 | 1% | HT5 | 10.9 | 7.2 | 3 |

TABLE 5

|  | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 4 | 1% | HT1:HT6 | 6.5 | 8.8 | 143 |
| Comparative Example 1 | 1% | HT1 | 6.2 | 8.7 | 58 |
| Comparative Example 6 | 1% | HT6 | 16.1 | 4.5 | 1 |

TABLE 6

|  | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 5 | 1% | HT1:HT7 | 7.8 | 8.7 | 140 |
| Comparative Example 1 | 1% | HT1 | 6.2 | 8.7 | 58 |
| Comparative Example 7 | 1% | HT7 | 18.9 | 4.6 | 1 |

TABLE 7

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 6 | 1% | HT1:HT8 | 8.3 | 8.6 | 147 |
| Comparative Example 1 | 1% | HT1 | 6.2 | 8.7 | 58 |
| Comparative Example 8 | 1% | HT8 | 18.9 | 1.8 | 1 |

TABLE 8

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 7 | 1% | HT2:HT3 | 6.7 | 8.9 | 176 |
| Comparative Example 2 | 1% | HT2 | 6.2 | 8.7 | 76 |
| Comparative Example 3 | 1% | HT3 | 7.2 | 9.2 | 49 |

TABLE 9

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 8 | 1% | HT2:HT4 | 6.6 | 8.8 | 181 |
| Comparative Example 2 | 1% | HT2 | 6.2 | 8.7 | 76 |
| Comparative Example 4 | 1% | HT4 | >20 | 5.5 | 71 |

TABLE 10

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 9 | 1% | HT2:HT5 | 6.8 | 8.9 | 138 |
| Comparative Example 2 | 1% | HT2 | 6.2 | 8.7 | 76 |
| Comparative Example 5 | 1% | HT5 | 10.9 | 7.2 | 3 |

TABLE 11

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 10 | 1% | HT2:HT6 | 6.8 | 9.0 | 151 |
| Comparative Example 2 | 1% | HT2 | 6.2 | 8.7 | 76 |
| Comparative Example 6 | 1% | HT6 | 16.1 | 4.5 | 1 |

TABLE 12

|  | Acceptor material concentration of the second layer (mass %) | Hole-transporting material of the first layer and the second layer | V (50 mA/cm²) | EQE (10 mA/cm²) | LT95 (50 mA/cm²) |
| --- | --- | --- | --- | --- | --- |
| Example 11 | 1% | HT2:HT7 | 8.3 | 8.9 | 142 |
| Comparative Example 2 | 1% | HT2 | 6.2 | 8.7 | 76 |
| Comparative Example 7 | 1% | HT7 | 18.9 | 4.6 | 1 |

TABLE 13

|  | Acceptor material concentration of the second layer (mass %) | Hole-transporting material of the first layer and the second layer | V (50 mA/cm²) | EQE (10 mA/cm²) | LT95 (50 mA/cm²) |
| --- | --- | --- | --- | --- | --- |
| Example 12 | 1% | HT2:HT8 | 9.0 | 8.6 | 138 |
| Comparative Example 2 | 1% | HT2 | 6.2 | 8.7 | 76 |
| Comparative Example 8 | 1% | HT8 | 18.9 | 1.8 | 1 |

TABLE 14

|  | Acceptor material concentration of the second layer (mass %) | Hole-transporting material of the second layer | Hole-transporting material of the first layer | V (50 mA/cm²) | EQE (10 mA/cm²) | LT95 (50 mA/cm²) |
| --- | --- | --- | --- | --- | --- | --- |
| Example 13 | 1% | HT3:HT5 | HT3:HT5 | 7.6 | 9.2 | 138 |
| Example 21 | 1% | HT3 | HT3:HT5 | 7.3 | 9.2 | 132 |
| Comparative Example 3 | 1% | HT3 | HT3 | 7.2 | 9.2 | 49 |
| Comparative Example 5 | 1% | HT5 | HT5 | 10.9 | 7.2 | 3 |

TABLE 15

|  | Acceptor material concentration of the second layer (mass %) | Hole-transporting material of the second layer | Hole-transporting material of the first layer | V (50 mA/cm²) | EQE (10 mA/cm²) | LT95 (50 mA/cm²) |
| --- | --- | --- | --- | --- | --- | --- |
| Example 14 | 1% | HT3:HT6 | HT3:HT6 | 7.5 | 9.3 | 133 |
| Example 22 | 1% | HT3 | HT3:HT6 | 7.3 | 9.3 | 130 |
| Comparative Example 3 | 1% | HT3 | HT3 | 7.2 | 9.2 | 49 |
| Comparative Example 6 | 1% | HT6 | HT6 | 16.1 | 4.5 | 1 |

TABLE 16

|  | Acceptor material concentration of the second layer (mass %) | Hole-transporting material of the second layer | Hole-transporting material of the first layer | V (50 mA/cm²) | EQE (10 mA/cm²) | LT95 (50 mA/cm²) |
| --- | --- | --- | --- | --- | --- | --- |
| Example 15 | 1% | HT3:HT7 | HT3:HT7 | 8.7 | 9.3 | 138 |
| Example 23 | 1% | HT3 | HT3:HT7 | 7.5 | 9.3 | 135 |

TABLE 16-continued

| | Acceptor material concentration of the second layer (mass %) | Hole-transporting material of the second layer | Hole-transporting material of the first layer | V (50 mA/cm$^2$) | EQE (10 mA/cm$^2$) | LT95 (50 mA/cm$^2$) |
|---|---|---|---|---|---|---|
| Comparative Example 3 | 1% | HT3 | HT3 | 7.2 | 9.2 | 49 |
| Comparative Example 7 | 1% | HT7 | HT7 | 18.9 | 4.6 | 1 |

TABLE 17

| | Acceptor material concentration of the second layer (mass %) | Hole-transporting material of the second layer | Hole-transporting material of the first layer | V (50 mA/cm$^2$) | EQE (10 mA/cm$^2$) | LT95 (50 mA/cm$^2$) |
|---|---|---|---|---|---|---|
| Example 16 | 1% | HT3:HT8 | HT3:HT8 | 8.9 | 9.2 | 133 |
| Example 24 | 1% | HT3 | HT3:HT8 | 7.6 | 9.2 | 133 |
| Comparative Example 3 | 1% | HT3 | HT3 | 7.2 | 9.2 | 49 |
| Comparative Example 8 | 1% | HT8 | HT8 | 18.9 | 1.8 | 1 |

From the results of Tables 2 to 17, it can be seen that the devices of Examples 1 to 16 in which two kinds of hole-transporting materials are used for the first layer (hole-transporting layer) and the second layer (hole-injecting layer) and an acceptor material having a specific affinity value is added to the second layer (hole-injecting layer) have a remarkably improved lifetime compared with the devices of Comparative Examples 1 to 8 in which only one of the two kinds of materials is used.

Further, in the devices of Comparative Example using only the first hole-transporting material in each Examples, the drive-voltage is lower than the device of Example, the external quantum efficiency EQE is comparable, and the device lifetime is short. In the device of Comparative Example using only the second hole-transporting material in each Examples, the driving voltage is higher than the device of Examples, the external quantum efficiency EQE is low, the device lifetime is also short.

However, by combining the first hole-transporting material and the second hole-transporting material and being contained in the first layer (hole-transporting layer) and the second layer (hole-injecting layer), it can be seen that the device having an excellent external quantum efficiency EQE and remarkably improved device lifetime is obtained.

<Fabrication of Organic EL Device 2>

Examples 17 to 20

Each of the organic EL devices was fabricated and evaluated in the same manner as in Example 1, except that the concentration of the acceptor material AC1 in the second layer was set to 5% by mass and the first and second hole-transporting materials shown in Tables 18 to 21 below were used. Results are shown in Tables 18 to 21.

Comparative Examples 9 to 13

Each of the organic EL devices was fabricated and evaluated in the same manner as in Example 1, except that the concentration of the acceptor material AC1 in the second layer was set to 5% by mass and the hole-transporting material shown in Tables 18 to 21 below was used. Results are shown in Tables 18 to 21.

TABLE 18

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 17 | 5% | HT4:HT5 | 4.9 | 8.1 | 152 |
| Comparative Example 9 | 5% | HT4 | 4.8 | 7.5 | 143 |
| Comparative Example 10 | 5% | HT5 | 5.3 | 7.9 | 143 |

TABLE 19

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 18 | 5% | HT4:HT6 | 4.8 | 8.1 | 190 |
| Comparative Example 9 | 5% | HT4 | 4.8 | 7.5 | 143 |
| Comparative Example 11 | 5% | HT6 | 6.1 | 7.9 | 171 |

TABLE 20

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 19 | 5% | HT4:HT7 | 5.0 | 7.9 | 190 |
| Comparative Example 9 | 5% | HT4 | 4.8 | 7.5 | 143 |
| Comparative Example 12 | 5% | HT7 | 7.7 | 7.1 | 190 |

TABLE 21

| | Acceptor material concentration of the second layer (mass %) | Hole-transporting material of the first layer and the second layer | V (50 mA/cm$^2$) | EQE (10 mA/cm$^2$) | LT95 (50 mA/cm$^2$) |
|---|---|---|---|---|---|
| Example 20 | 5% | HT4:HT8 | 4.9 | 7.7 | 190 |
| Comparative Example 9 | 5% | HT4 | 4.8 | 7.5 | 143 |
| Comparative Example 13 | 5% | HT8 | 15.9 | 5.7 | 3 |

From the results of Tables 18 to 21, it can be seen that, when the concentration of the acceptor material AC1 of the second layer (hole-injecting layer) is increased to 5% by mass, the drive-voltage is lowered and the device lifetime is further improved by using Compound HT4 as the first hole-transporting material, which is used as the second hole-transporting material in Examples 2 and 8.

Note that Comparative Example 12 has LT95 of 190 hr, and the device lifetime is equivalent to that of Example 19, but the voltage V is high and the efficiency EQE is inferior. It can be seen that Example 19 is a well-balanced device with excellent voltage V, efficiency EQE, and device lifetime.

A schematic configuration of an organic EL device will be described with reference to the FIGURE.

The organic EL device 1 contains a substrate 2, an anode 3, a cathode 10, and an organic layer 4 disposed between the anode 3 and the cathode 10, and the organic layer 4 contains an emitting layer 5. A first layer (hole-transporting layer) 6 is disposed between the anode 3 and the emitting layer 5, and further, a second layer (hole-injecting layer) 7 is disposed between the anode 3 and the first layer (hole-transporting layer) 6. An electron-injecting layer and an electron-transporting layer (not shown in the FIGURE) may be formed between the emitting layer 5 and the cathode 10. An electron-blocking layer (not shown in the FIGURE) may be provided on the anode 3 side of the emitting layer 5, and a hole-blocking layer (not shown in the FIGURE) may be provided on the cathode 10 side of the emitting layer 5. Due to such a configuration, electrons or holes are confined in the emitting layer 5, whereby efficiency of formation of excitons in the emitting layer 5 can be further enhanced.

The invention claimed is:

1. An organic electroluminescence device comprising a cathode, an anode, and an organic layer disposed between the cathode and the anode, wherein
   the organic layer comprises an emitting layer, a first layer, and a second layer,
   the first layer is disposed between the anode and the emitting layer,
   the second layer is disposed between the anode and the first layer,
   the first layer comprises a first hole-transporting material, and a second hole-transporting material, and
   the second layer comprises an acceptor material having an affinity value in the range of 3.8 to 6.0 eV,
   one or more compounds selected from compounds represented by one of the following formulas (11-3B) and (11-3D), and
   one or more compounds represented by the following formula (11) other than the compound represented by the following formula (11-3B) or (11-3D):

(11-3B)

wherein in the formula (11-3B),
$L_{11B}$ is
a single bond, or
a substituted or unsubstituted arylene group including 6 to 50 ring carbon atoms;
$Ar_{11B}$ is
a substituted or unsubstituted aryl group including 6 to 50 ring carbon atoms, or
a substituted or unsubstituted monovalent heterocyclic group including 5 to 50 ring atoms;
$R_{11B}$ to $R_{18B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11B}$, $Ar_{11B}$, and $R_{11B}$ to $R_{18B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{905}$ are as defined above;

(11-3D)

wherein in the formula (11-3D),
$L_{11D}$ and $L_{12D}$ are independently
a single bond, or
a substituted or unsubstituted arylene group including 6 to 50 ring carbon atoms;
$Ar_{11D}$ to $Ar_{13D}$ are independently
a substituted or unsubstituted aryl group including 6 to 50 ring carbon atoms, or
a substituted or unsubstituted monovalent heterocyclic group including 5 to 50 ring atoms;
$R_{11D}$, $R_{12D}$, and $R_{14D}$ to $R_{18D}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;

substituents when $L_{11D}$, $L_{12D}$, $Ar_{11D}$ to $Ar_{13D}$, $R_{11D}$, $R_{12D}$, and $R_{14D}$ to $R_{18D}$ have substituents are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),
—O—($R_{904}$),
—S—($R_{905}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{905}$ are as defined above;

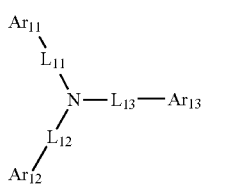

(11)

wherein in the formula (11), two of -$L_{11}$-$Ar_{11}$, -$L_{12}$-$Ar_{12}$, and -$L_{13}$-$Ar_{13}$ form a substituted or unsubstituted N-carbazolyl group by bonding with each other, or do not form the N-carbazolyl group;

$L_{11}$ to $L_{13}$ which are not involved in formation of the N-carbazolyl group are independently a single bond or a linking group;

$Ar_{11}$ to $Ar_{13}$ which are not involved in formation of the N-carbazolyl group are independently a substituted or unsubstituted aryl group including 6 to 50 ring carbon atoms, a substituted or unsubstituted monovalent heterocyclic group including 5 to 60 ring atoms, or

—N($R_{906}$)($R_{907}$);

$R_{906}$ and $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{906}$ and $R_{907}$ are present, the two or more of each of $R_{906}$ and $R_{907}$ may be the same as or different from each other.

2. The organic electroluminescence device according to claim 1, wherein the acceptor material is one or more compounds selected from the group consisting of a compound represented by the following formula (21) and a compound having a ring structure represented by the following formula (31):

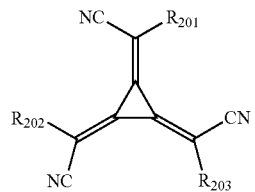

(21)

wherein in the formula (21), $R_{201}$ to $R_{203}$ are independently an unsubstituted aryl group including 6 to 50 ring carbon atoms, an unsubstituted monovalent heterocyclic group including 5 to 50 ring atoms, an aryl group including 6 to 50 ring carbon atoms substituted with one or more electron acceptor groups, or a monovalent heterocyclic group including 5 to 50 ring atoms substituted with one or more electron acceptor groups;

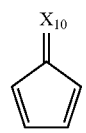

(31)

the ring structure represented by the formula (31) is fused with at least one ring structure of a substituted or unsubstituted aromatic hydrocarbon ring including 6 to 50 ring carbon atoms and a substituted or unsubstituted heterocycle including 5 to 50 ring atoms in the molecule of the compound;

the structure represented by =$X_{10}$ is selected from the group consisting of groups represented by any one of the following formulas (31-1a) to (31-1m):

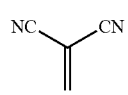

(31-1a)

(31-1b)

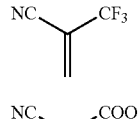

(31-1c)

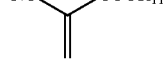

(31-1d)

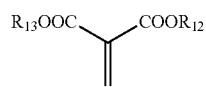

(31-1e)

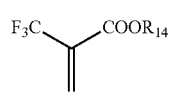

(31-1f)

-continued (31-1g)
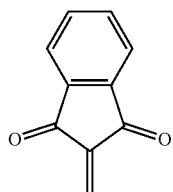

(31-1h)
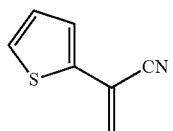

(31-1i)
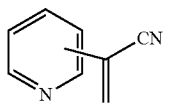

(31-1j)
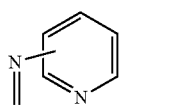

(31-1k)
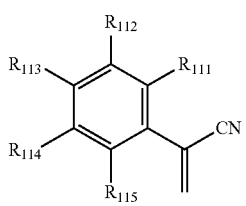

(31-1m)
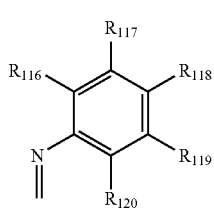

wherein in the formulas (31-1a) to (31-1m),
$R_{11}$ to $R_{14}$ and $R_{111}$ to $R_{120}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{901}$ to $R_{907}$ are present, the two or more of each of $R_{901}$ to $R_{907}$ may be the same as or different from each other.

3. The organic electroluminescence device according to claim 2, wherein the acceptor material is the compound represented by the formula (21), and
the electron acceptor group is one or more selected from the group consisting of
a cyano group,
a fluoro group,
a trifluoromethyl group,
a chloro group, and
a bromo group.

4. The organic electroluminescence device according to claim 2, wherein the acceptor material is the compound represented by the formula (21); and
$R_{201}$ is an aryl group including 6 to 50 ring carbon atoms having either or both of a cyano group and a fluoro group as the electron acceptor group.

5. The organic electroluminescence device according to claim 2, wherein the acceptor material is the compound represented by the formula (21); and
the compound represented by the formula (21) is a compound represented by the following formula (22)

(22)
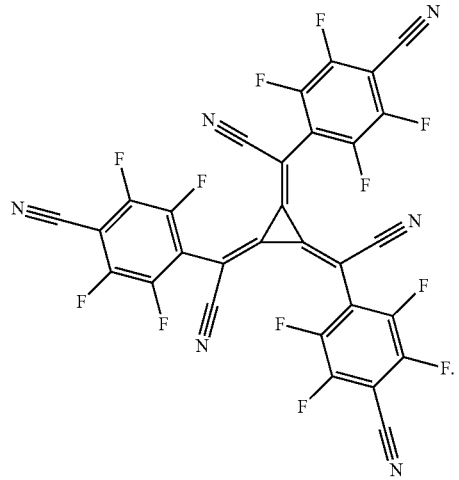

6. The organic electroluminescence device according to claim 2, wherein the acceptor material is the compound represented by the formula (31); and
the compound having the ring structure represented by the formula (31) is a compound having a ring structure represented by the following formula (31A):

(31A)
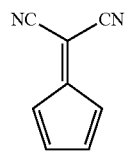

the ring structure represented by the formula (31A) is fused with a ring structure of at least one of a substituted or unsubstituted aromatic hydrocarbon ring including 6 to 50 ring carbon atoms and a substituted or unsubstituted heterocycle including 5 to 50 ring atoms in a molecule of the compound.

7. The organic electroluminescence device according to claim 6, wherein the compound having the ring structure represented by the formula (31A) is one or more compounds selected from the group consisting of a compound represented by the following formula (32), a compound represented by the following formula (33), a compound represented by the following formula (34), a compound represented by the following formula (35), and a compound represented by the following formula (36):

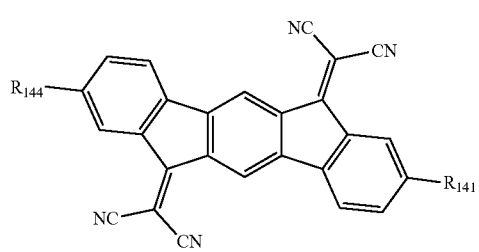
(32)

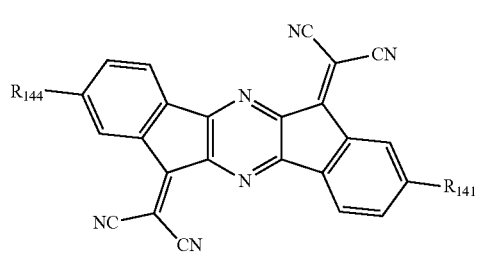
(33)

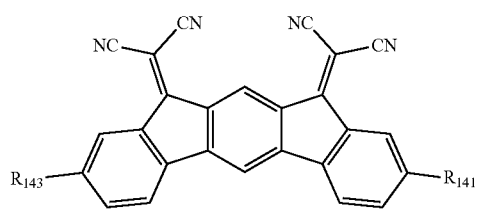
(34)

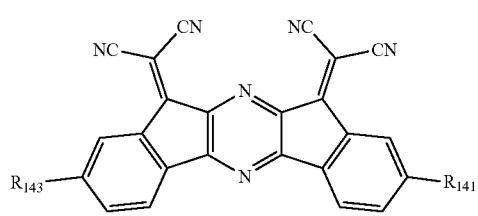
(35)

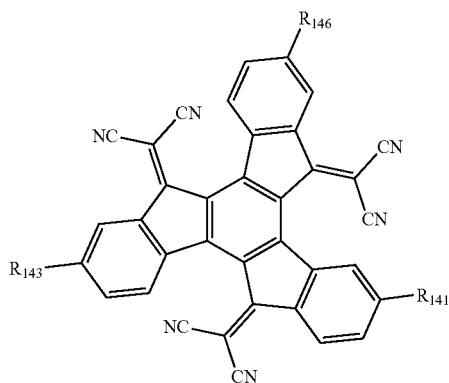
(36)

wherein in the formulas (32) to (36), $R_{141}$, $R_{143}$, $R_{144}$, and $R_{146}$ are independently a fluorine atom, a fluoroalkyl group including 1 to 50 carbon atoms, a fluoroalkoxy group including 1 to 50 carbon atoms, a cyano group, an aromatic hydrocarbon group including 6 to 50 ring carbon atoms substituted with at least one selected from the group consisting of a fluorine atom, a fluoroalkyl group including 1 to 50 carbon atoms, a fluoroalkoxy group including 1 to 50 carbon atoms, and a cyano group, or a heterocyclic group including 5 to 30 ring atoms substituted with at least one selected from the group consisting of a fluorine atom, a fluoroalkyl group including 1 to 50 carbon atoms, a fluoroalkoxy group including 1 to 50 carbon atoms, and a cyano group.

8. The organic electroluminescence device according to claim 7, wherein the acceptor material is the compound represented by the formula (31), and
the compound having a ring structure represented by the formula (31) is a compound represented by the formula (34).

9. The organic electroluminescence device according to claim 1, wherein the first hole-transporting material and the second hole-transporting material are independently selected from a compound represented by the following formula (11):

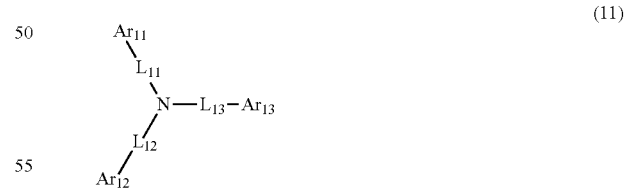
(11)

wherein in the formula (11), two of -$L_{11}$-$Ar_{11}$, -$L_{12}$-$Ar_{12}$, and -$L_{13}$-$Ar_{13}$ form a substituted or unsubstituted N-carbazolyl group by bonding with each other, or do not form the N-carbazolyl group;

$L_{11}$ to $L_{13}$ which are not involved in formation of the N-carbazolyl group are independently a single bond or a linking group;

$Ar_{11}$ to $Ar_{13}$ which are not involved in formation of the N-carbazolyl group are independently a substituted or unsubstituted aryl group including 6 to 50 ring carbon atoms,
a substituted or unsubstituted monovalent heterocyclic group including 5 to 60 ring atoms, or
—N($R_{906}$)($R_{907}$);
$R_{906}$ and $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{906}$ and $R_{907}$ are present, the two or more of each of $R_{906}$ and $R_{907}$ may be the same as or different from each other.

10. The organic electroluminescence device according to claim 9, wherein the compounds represented by the formula (11) are independently selected from a compound represented by the following formula (11-1), a compound represented by the following formula (11-2), and a compound represented by the following formula (11-3):

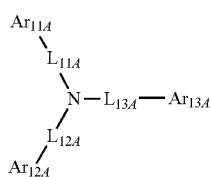

(11-1)

wherein in the formula (11-1),
$L_{11A}$ to $L_{13A}$ are independently a single bond or a linking group;
$Ar_{11A}$ to $Ar_{13A}$ are independently
a substituted or unsubstituted aryl group including 6 to 50 ring carbon atoms, or
a substituted or unsubstituted monovalent heterocyclic group including 5 to 60 ring atoms;

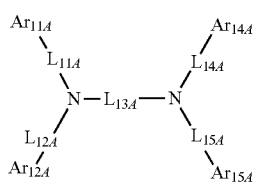

(11-2)

wherein in the formula (11-2),
$L_{13A}$ is a linking group;
$L_{11A}$, $L_{12A}$, $L_{14A}$, and $L_{15A}$ are independently a single bond or a linking group;
$Ar_{11A}$, $Ar_{12A}$, $Ar_{14A}$, and $Ar_{15A}$ are independently
a substituted or unsubstituted aryl group including 6 to 50 ring carbon atoms, or
a substituted or unsubstituted monovalent heterocyclic group including 5 to 60 ring atoms;

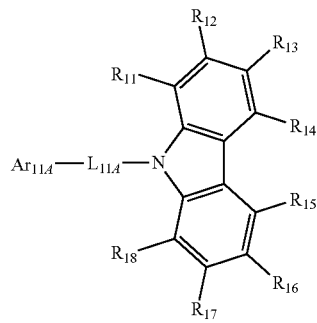

(11-3)

wherein in the formula (11-3),
$L_{11A}$ is a single bond or a linking group;
$Ar_{11A}$ is
a substituted or unsubstituted aryl group including 6 to 50 ring carbon atoms, or
a substituted or unsubstituted monovalent heterocyclic group including 5 to 50 ring atoms;
one or more sets of adjacent two or more of $R_{11}$ to $R_{18}$ form a substituted or unsubstituted, saturated or unsaturated ring by bonding with each other, or do not form the ring;
$R_{11}$ to $R_{18}$ which do not form the ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{901}$ to $R_{907}$ are present, the two or more of each of $R_{901}$ to $R_{907}$ may be the same as or different from each other.

11. The organic electroluminescence device according to claim 10, wherein $Ar_{11A}$ to $Ar_{15A}$ are independently selected from the group consisting of
a substituted or unsubstituted phenyl group,
a substituted or unsubstituted biphenyl group,
a substituted or unsubstituted terphenyl group,
a substituted or unsubstituted fluorenyl group,
a substituted or unsubstituted spirofluorenyl group, a substituted or unsubstituted naphthyl group,
a substituted or unsubstituted anthryl group,
a substituted or unsubstituted carbazolyl group, and
a substituted or unsubstituted dibenzofuranyl group.

12. The organic electroluminescence device according to claim 10, wherein the compound represented by the formula (11-1) is a compound represented by the following formula (11-1B):

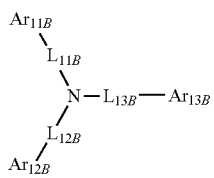

(11-1B)

wherein in the formula (11-1B), $L_{11B}$ to $L_{13B}$ are independently
a single bond, or
a substituted or unsubstituted arylene group including 6 to 50 ring carbon atoms;

$Ar_{11B}$ to $Ar_{13B}$ are independently
a substituted or unsubstituted aryl group including 6 to 50 ring carbon atoms, or
a substituted or unsubstituted monovalent heterocyclic group including 5 to 60 ring atoms;

substituents when $L_{11B}$ to $L_{13B}$ and $Ar_{11B}$ to $Ar_{13B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;

$R_{901}$ to $R_{905}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{905}$ are present, the two or more of each of $R_{901}$ to $R_{905}$ may be the same as or different from each other.

13. The organic electroluminescence device according to claim 10, wherein the compound represented by the formula (11-2) is a compound represented by the following formula (11-2B):

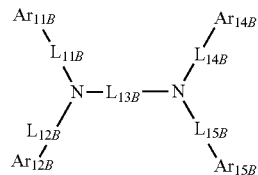

(11-2B)

wherein in the formula (11-2B), $L_{13B}$ is a substituted or unsubstituted arylene group including 6 to 50 ring carbon atoms;

$L_{11B}$, $L_{12B}$, $L_{14B}$, and $L_{15B}$ are independently
a single bond, or
a substituted or unsubstituted arylene group including 6 to 50 ring carbon atoms;

$Ar_{11B}$, $Ar_{12B}$, $Ar_{14B}$, and $Ar_{15B}$ are independently
a substituted or unsubstituted aryl group including 6 to 50 ring carbon atoms, or
a substituted or unsubstituted monovalent heterocyclic group including 5 to 60 ring atoms;

substituents when $L_{11B}$ to $L_{15B}$, $Ar_{11B}$, $Ar_{12B}$, $Ar_{14B}$, and $Ar_{15B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;

$R_{901}$ to $R_{905}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{905}$ are present, the two or more of each of $R_{901}$ to $R_{905}$ may be the same as or different from each other.

14. The organic electroluminescence device according to claim 10, wherein the compound represented by the formula (11-3) is a compound represented by the following formula (11-3B):

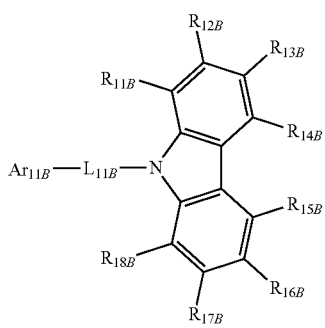

(11-3B)

wherein in the formula (11-3B),
$L_{11B}$ is
a single bond, or
a substituted or unsubstituted arylene group including 6 to 50 ring carbon atoms;
$Ar_{11B}$ is
a substituted or unsubstituted aryl group including 6 to 50 ring carbon atoms, or
a substituted or unsubstituted monovalent heterocyclic group including 5 to 50 ring atoms;
$R_{11B}$ to $R_{18B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11B}$, $Ar_{11B}$, and $R_{11B}$ to $R_{18B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{905}$ are as defined above.

15. The organic electroluminescence device according to claim 9, wherein the linking group is
a substituted or unsubstituted arylene group including 6 to 50 ring carbon atoms, or
a substituted or unsubstituted divalent heterocyclic group including 5 to 50 ring atoms.

16. The organic electroluminescence device according to claim 1, wherein one of the first hole-transporting material and the second hole-transporting material in the first layer is one or more selected from compounds represented by the following formula (11-3C); and
the other is one or more selected from the compounds represented by the formula (11) other than the compound represented by the following formula (11-3C):

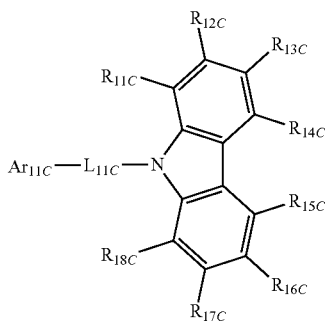

(11-3C)

wherein in the formula (11-3 C),
$L_{11C}$ is a single bond or a linking group;
$Ar_{11C}$ is
a substituted or unsubstituted aryl group including 6 to 50 ring carbon atoms, or
a substituted or unsubstituted monovalent heterocyclic group including 5 to 50 ring atoms;
one or more sets of adjacent two or more of $R_{11C}$ to $R_{18C}$ form a substituted or unsubstituted, saturated or unsaturated ring by bonding with each other, or do not form the ring;
$R_{11C}$ to $R_{18C}$ which do not form the ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$), a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11C}$, $Ar_{11C}$, and $R_{11C}$ to $R_{18C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—$N(R_{906})(R_{907})$,
—$Si(R_{901})(R_{902})(R_{903})$,
—$O$—$(R_{904})$,
—$S$—$(R_{905})$,
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{905}$ are as defined above; and
provided that the sum of the number of —$N(R_{906})(R_{907})$'s which are $R_{11C}$ to $R_{18C}$ and the number of substituents —$N(R_{906})(R_{907})$ possessed by $Ar_{11C}$, $L_{11C}$, and $R_{11C}$ to $R_{18C}$ is 1.

17. The organic electroluminescence device according to claim 1, wherein one of the first hole-transporting material and the second hole-transporting material in the first layer is one or more selected from compounds represented by the following formula (11-1C); and
the other is one or more compounds represented by the following formula (11-3D):

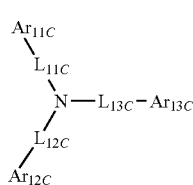

(11-1C)

wherein in the formula (11-1C),
$L_{11C}$ to $L_{13C}$ are independently
a single bond, or
a substituted or unsubstituted arylene group including 6 to 50 ring carbon atoms;

$Ar_{11C}$ to $Ar_{13C}$ are independently
a substituted or unsubstituted aryl group including 6 to 50 ring carbon atoms, or
a substituted or unsubstituted monovalent heterocyclic group including 5 to 60 ring atoms; provided that a substituted or unsubstituted carbazolyl group is excluded;
substituents when $L_{11C}$ to $L_{13C}$, and $Ar_{11C}$ to $Ar_{13C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—$Si(R_{901})(R_{902})(R_{903})$,
—$O$—$(R_{904})$,
—$S$—$(R_{905})$,
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; provided that a substituted or unsubstituted carbazolyl group is excluded;
$R_{901}$ to $R_{905}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; provided that a substituted or unsubstituted carbazolyl group is excluded; when two or more of each of $R_{901}$ to $R_{905}$ are present, the two or more of each of $R_{901}$ to $R_{905}$ may be the same as or different from each other;

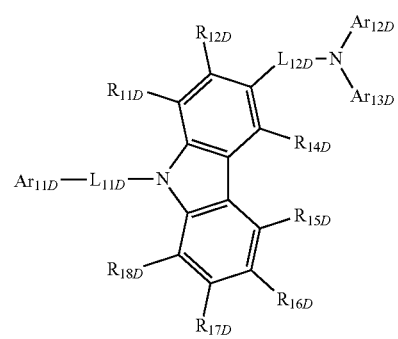

(11-3D)

wherein in the formula (11-3D),
$L_{11D}$ and $L_{12D}$ are independently
a single bond, or
a substituted or unsubstituted arylene group including 6 to 50 ring carbon atoms;
$Ar_{11D}$ to $Ar_{13D}$ are independently
a substituted or unsubstituted aryl group including 6 to 50 ring carbon atoms, or
a substituted or unsubstituted monovalent heterocyclic group including 5 to 50 ring atoms;

$R_{11D}$, $R_{12D}$, and $R_{14D}$ to $R_{18D}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11D}$, $L_{12D}$, $Ar_{11D}$ to $Ar_{13D}$, $R_{11D}$, $R_{12D}$, and $R_{14D}$ to $R_{18D}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{905}$ are as defined above.

18. The organic electroluminescence device according to claim 1, wherein the first hole-transporting material has an ionization potential value smaller than the ionization potential value of the second hole-transporting material.

19. The organic electroluminescence device according to claim 1, wherein a mass ratio of the first hole-transporting material and the second hole-transporting material in the first layer is within a range of 80:20 to 20:80.

20. The organic electroluminescence device according to claim 1, wherein the second layer comprises
the acceptor material,
one or more compounds selected from compounds represented by the following formula (11-3B), and
one or more compounds represented by the following formula (11) other than the compound represented by the following formula (11-3B):

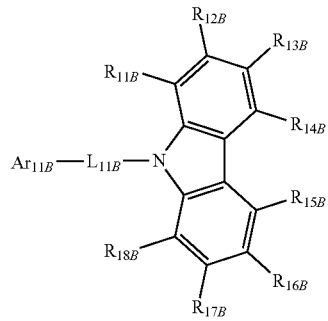

(11-3B)

wherein in the formula (11-3B),
$L_{11B}$ is
a single bond, or
a substituted or unsubstituted arylene group including 6 to 50 ring carbon atoms;
$Ar_{11B}$ is
a substituted or unsubstituted aryl group including 6 to 50 ring carbon atoms, or
a substituted or unsubstituted monovalent heterocyclic group including 5 to 50 ring atoms;
$R_{11B}$ to $R_{18B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11B}$, $Ar_{11B}$, and $R_{11B}$ to $R_{18B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{905}$ are as defined above;

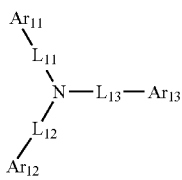
(11)

wherein in the formula (11), two of -$L_{11}$-$Ar_{11}$, -$L_{12}$-$Ar_{12}$, and -$L_{13}$-$Ar_{13}$ form a substituted or unsubstituted N-carbazolyl group by bonding with each other, or do not form the N-carbazolyl group;

$L_{11}$ to $L_{13}$ which are not involved in formation of the N-carbazolyl group are independently a single bond or a linking group;

$Ar_{11}$ to $Ar_{13}$ which are not involved in formation of the N-carbazolyl group are independently a substituted or unsubstituted aryl group including 6 to 50 ring carbon atoms, a substituted or unsubstituted monovalent heterocyclic group including 5 to 60 ring atoms, or

—N($R_{906}$)($R_{907}$);

$R_{906}$ and $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{906}$ and $R_{907}$ are present, the two or more of each of $R_{906}$ and $R_{907}$ may be the same as or different from each other.

21. The organic electroluminescence device according to claim 1, wherein the second layer comprises the acceptor material, one or more selected from compounds represented by the following formula (11-3D), and one or more compounds represented by the following formula (11) other than the compound represented by the following formula (11-3D):

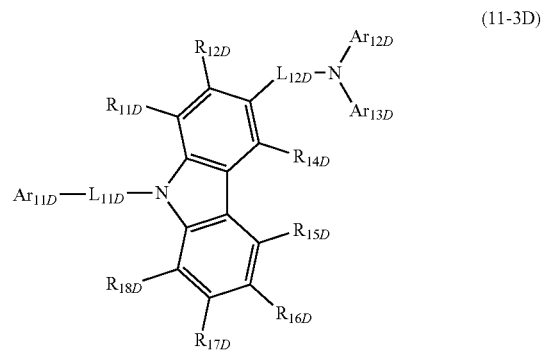
(11-3D)

wherein in the formula (11-3D), $L_{11D}$ and $L_{12D}$ are independently a single bond, or a substituted or unsubstituted arylene group including 6 to 50 ring carbon atoms;

$Ar_{11D}$ to $Ar_{13D}$ are independently a substituted or unsubstituted aryl group including 6 to 50 ring carbon atoms, or a substituted or unsubstituted monovalent heterocyclic group including 5 to 50 ring atoms;

$R_{11D}$, $R_{12D}$, and $R_{14D}$ to $R_{18D}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;

substituents when $L_{11D}$, $L_{12D}$, $Ar_{11D}$ to $Ar_{13D}$, $R_1ID$, $R_{12D}$, and $R_{14D}$ to $R_{18D}$ have substituents are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms,
—Si(R$_{901}$)(R$_{902}$)(R$_{903}$),
—O—(R$_{904}$),
—S—(R$_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
R$_{901}$ to R$_{905}$ are as defined above;

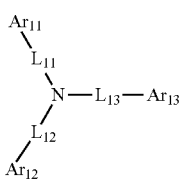
(11)

wherein in the formula (11),
two of -L$_{11}$-Ar$_{11}$, -L$_{12}$-Ar$_{12}$, and -L$_{13}$-Ar$_{13}$ form a substituted or unsubstituted N-carbazolyl group by bonding with each other, or do not form the N-carbazolyl group;
L$_{11}$ to L$_{13}$ which are not involved in formation of the N-carbazolyl group are independently a single bond or a linking group;
Ar$_{11}$ to Ar$_{13}$ which are not involved in formation of the N-carbazolyl group are independently
a substituted or unsubstituted aryl group including 6 to 50 ring carbon atoms,
a substituted or unsubstituted monovalent heterocyclic group including 5 to 60 ring atoms, or
—N(R$_{906}$)(R$_{907}$);
R$_{906}$ and R$_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of R$_{906}$ and R$_{907}$ are present, the two or more of each of R$_{906}$ and R$_{907}$ may be the same as or different from each other.

22. The organic electroluminescence device according to claim 1, wherein one of the first hole-transporting material and the second hole-transporting material in the first layer is one or more selected from compounds represented by the following formula (11-3C);
the other is one or more selected from the compounds represented by the formula (11) other than the compound represented by the following formula (11-3C), and
the second layer comprises
the acceptor material,
one or more compounds selected from compounds represented by the following formula (11-3B), and
one or more compounds represented by the following formula (11) other than the compound represented by the following formula (11-3B):

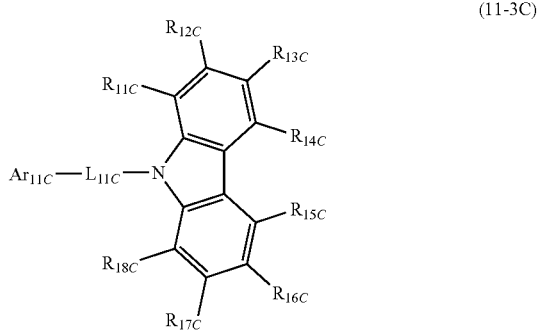
(11-3C)

wherein in the formula (11-3C),
L$_{11C}$ is a single bond or a linking group;
Ar$_{11C}$ is
a substituted or unsubstituted aryl group including 6 to 50 ring carbon atoms, or
a substituted or unsubstituted monovalent heterocyclic group including 5 to 50 ring atoms;
one or more sets of adjacent two or more of R$_{11C}$ to R$_{18C}$ form a substituted or unsubstituted, saturated or unsaturated ring by bonding with each other, or do not form the ring;
R$_{11C}$ to R$_{18C}$ which do not form the ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si(R$_{901}$)(R$_{902}$)(R$_{903}$),
—O—(R$_{904}$),
—S—(R$_{905}$),
—N(R$_{906}$)(R$_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
R$_{901}$ to R$_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of R$_{901}$ to R$_{907}$ are present, the two or more of each of R$_{901}$ to R$_{907}$ may be the same as or different from each other;
substituents when L$_{11C}$, Ar$_{11C}$, and R$_{11C}$ to R$_{18C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms, a substituted or unsubstituted cycloalkyl group including 3 to 50 ring carbon atoms,
—N($R_{906}$)($R_{907}$),
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{905}$ are as defined above; and
provided that the sum of the number of —N($R_{906}$)($R_{907}$)'s which are $R_{11C}$ to $R_{18C}$ and the number of substituents —N($R_{906}$)($R_{907}$) possessed by $Ar_{11C}$, $L_{11C}$, and $R_{11C}$ to $R_{18C}$ is 1;

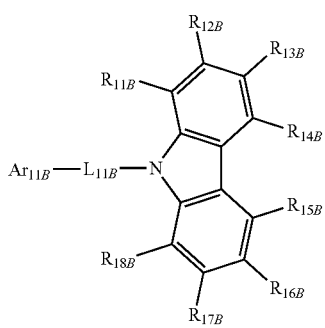

(11-3B)

wherein in the formula (11-3B),
$L_{11B}$ is
a single bond, or
a substituted or unsubstituted arylene group including 6 to 50 ring carbon atoms;
$Ar_{11B}$ is
a substituted or unsubstituted aryl group including 6 to 50 ring carbon atoms, or
a substituted or unsubstituted monovalent heterocyclic group including 5 to 50 ring atoms;
$R_{11B}$ to $R_{18B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11B}$, $Ar_{11B}$, and $R_{11B}$ to $R_{18B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{905}$ are as defined above;

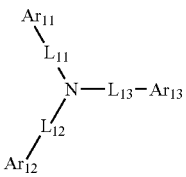

(11)

wherein in the formula (11),
two of -$L_{11}$-$Ar_{11}$, -$L_{12}$-$Ar_{12}$, and -$L_{13}$-$Ar_{13}$ form a substituted or unsubstituted N-carbazolyl group by bonding with each other, or do not form the N-carbazolyl group;
$L_{11}$ to $L_{13}$ which are not involved in formation of the N-carbazolyl group are independently a single bond or a linking group;
$Ar_{11}$ to $Ar_{13}$ which are not involved in formation of the N-carbazolyl group are independently
a substituted or unsubstituted aryl group including 6 to 50 ring carbon atoms,
a substituted or unsubstituted monovalent heterocyclic group including 5 to 60 ring atoms, or
—N($R_{906}$)($R_{907}$);
$R_{906}$ and $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{906}$ and $R_{907}$ are present, the two or more of each of $R_{906}$ and $R_{907}$ may be the same as or different from each other.

23. The organic electroluminescence device according to claim 1, wherein one of the first hole-transporting material and the second hole-transporting material in the first layer is one or more selected from compounds represented by the following formula (11-1C);

the other is a compound represented by the following formula (11-3D)
the second layer comprises
the acceptor material,
one or more selected from compounds represented by the following formula (11-3D), and
one or more compounds represented by the following formula (11) other than the compound represented by the following formula (11-3D):

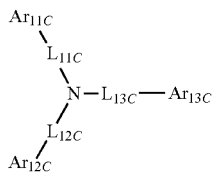

(11-1C)

wherein in the formula (11-1C),
$L_{11C}$ to $L_{13C}$ are independently
a single bond, or
a substituted or unsubstituted arylene group including 6 to 50 ring carbon atoms;
$Ar_{11C}$ to $Ar_{13C}$ are independently
a substituted or unsubstituted aryl group including 6 to 50 ring carbon atoms, or
a substituted or unsubstituted monovalent heterocyclic group including 5 to 60 ring atoms, provided that a substituted or unsubstituted carbazolyl group is excluded;
substituents when $L_{11C}$ to $L_{13C}$, and $Ar_{11C}$ to $Ar_{13C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms, provided that a substituted or unsubstituted carbazolyl group is excluded;
$R_{901}$ to $R_{905}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms, provided that a substituted or unsubstituted carbazolyl group is excluded; and when two or more of each of $R_{901}$ to $R_{905}$ are present, the two or more of each of $R_{901}$ to $R_{905}$ may be the same as or different from each other;

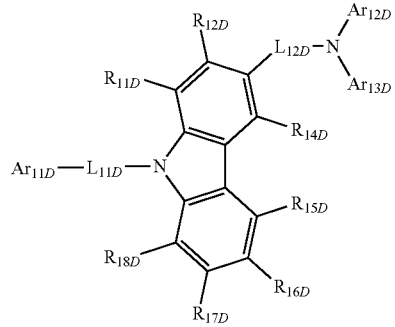

(11-3D)

wherein in the formula (11-3D),
$L_{11D}$ and $L_{12D}$ are independently
a single bond, or
a substituted or unsubstituted arylene group including 6 to 50 ring carbon atoms;
$Ar_{11D}$ to $Ar_{13D}$ are independently
a substituted or unsubstituted aryl group including 6 to 50 ring carbon atoms, or
a substituted or unsubstituted monovalent heterocyclic group including 5 to 50 ring atoms;
$R_{11D}$, $R_{12D}$, and $R_{14D}$ to $R_{18D}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11D}$, $L_{12D}$, $Ar_{11D}$ to $Ar_{13D}$, $R_{11D}$, $R_{12D}$, and $R_{14D}$ to $R_{18D}$ have substituents are independently
a substituted or unsubstituted alkyl group including 1 to 50 carbon atoms, a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{905}$ are as defined above;

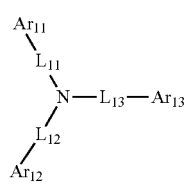
(11)

wherein in the formula (11),
two of -$L_{11}$-$Ar_{11}$, -$L_{12}$-$Ar_{12}$, and -$L_{13}$-$Ar_{13}$ form a substituted or unsubstituted N-carbazolyl group by bonding with each other, or do not form the N-carbazolyl group;
$L_{11}$ to $L_{13}$ which are not involved in formation of the N-carbazolyl group are independently a single bond or a linking group;
$Ar_{11}$ to $Ar_{13}$ which are not involved in formation of the N-carbazolyl group are independently
a substituted or unsubstituted aryl group including 6 to 50 ring carbon atoms,
a substituted or unsubstituted monovalent heterocyclic group including 5 to 60 ring atoms, or
—N($R_{906}$)($R_{907}$);
$R_{906}$ and $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of each of $R_{906}$ and $R_{907}$ are present, the two or more of each of $R_{906}$ and $R_{907}$ may be the same as or different from each other.

24. An organic electroluminescence device comprising a cathode, an anode, and an organic layer disposed between the cathode and the anode, wherein
the organic layer comprises an emitting layer, a first layer, and a second layer,
the first layer is disposed between the anode and the emitting layer,
the second layer is disposed between the anode and the first layer,
the first layer comprises a first hole-transporting material, and a second hole-transporting material, and
the second layer comprises an acceptor material having an affinity value in the range of 3.8 to 6.0 eV, and at least one hole-transporting material, wherein one of the first hole-transporting material and the second hole-transporting material in the first layer is one or more selected from compounds represented by the following formula (11-3C); and
the other is one or more selected from compounds represented by the formula (11) other than the compound represented by the following formula (11-3C), and
the second layer comprises
the acceptor material, and
a compound selected from compounds represented by the following formula (11-3B) or (11-3D):

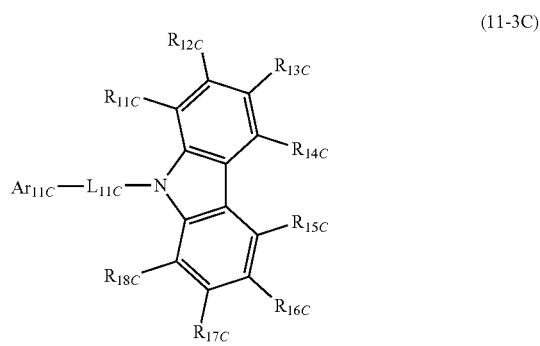
(11-3C)

wherein in the formula (11-3C),
$L_{11C}$ is a single bond or a linking group;
$Ar_{11C}$ is
a substituted or unsubstituted aryl group including 6 to 50 ring carbon atoms, or
a substituted or unsubstituted monovalent heterocyclic group including 5 to 50 ring atoms;
one or more sets of adjacent two or more of $R_{11C}$ to $R_{18C}$ form a substituted or unsubstituted, saturated or unsaturated ring by bonding with each other, or do not form the ring;
$R_{11C}$ to $R_{18C}$ which do not form the ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms, a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11C}$, $Ar_{11C}$, and $R_{11C}$ to $R_{18C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—$N(R_{906})(R_{907})$,
—$Si(R_{901})(R_{902})(R_{903})$,
—$O$—$(R_{904})$,
—$S$—$(R_{905})$,
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{905}$ are as defined above;
provided that the sum of the number of —$N(R_{906})(R_{907})$'s which are $R_{11C}$ to $R_{18C}$ and the number of substituents —$N(R_{906})(R_{907})$ possessed by $Ar_{11C}$, $L_{11C}$, and $R_{11C}$ to $R_{18C}$ is 1;

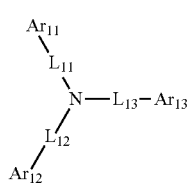

(11)

wherein in the formula (11),
two of -$L_{11}$-$Ar_{11}$, -$L_{12}$-$Ar_{12}$, and -$L_{13}$-$Ar_{13}$ form a substituted or unsubstituted N-carbazolyl group by bonding with each other, or do not form the N-carbazolyl group;
$L_{11}$ to $L_{13}$ which are not involved in formation of the N-carbazolyl group are independently a single bond or a linking group;
$Ar_{11}$ to $Ar_{13}$ which are not involved in formation of the N-carbazolyl group are independently
a substituted or unsubstituted aryl group including 6 to 50 ring carbon atoms,
a substituted or unsubstituted monovalent heterocyclic group including 5 to 60 ring atoms, or
—$N(R_{906})(R_{907})$;
$R_{906}$ and $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{906}$ and $R_{907}$ are present, the two or more of each of $R_{906}$ and $R_{907}$ may be the same as or different from each other;

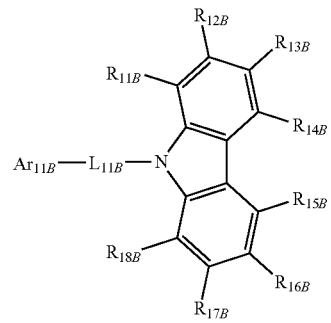

(11-3B)

wherein in the formula (11-3B),
$L_{11B}$ is
a single bond, or
a substituted or unsubstituted arylene group including 6 to 50 ring carbon atoms;
$Ar_{11B}$ is
a substituted or unsubstituted aryl group including 6 to 50 ring carbon atoms, or
a substituted or unsubstituted monovalent heterocyclic group including 5 to 50 ring atoms;
$R_{11B}$ to $R_{18B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—$Si(R_{901})(R_{902})(R_{903})$,
—$O$—$(R_{904})$,
—$S$—$(R_{905})$,
—$N(R_{906})(R_{907})$,
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11B}$, $Ar_{11B}$, and $R_{11B}$ to $R_{18B}$ have substituents are independently
a substituted or unsubstituted alkyl group including 1 to 50 carbon atoms, a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{905}$ are as defined above;

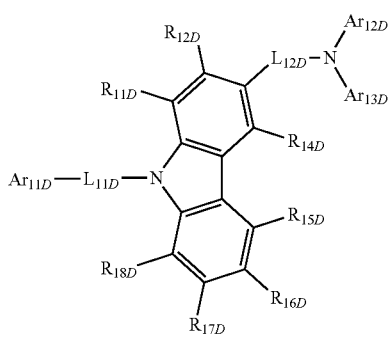

(11-3D)

wherein in the formula (11-3 D),
$L_{11D}$ and $L_{12D}$ are independently
a single bond, or
a substituted or unsubstituted arylene group including 6 to 50 ring carbon atoms;
$Ar_{11D}$ to $Ar_{13D}$ are independently
a substituted or unsubstituted aryl group including 6 to 50 ring carbon atoms, or
a substituted or unsubstituted monovalent heterocyclic group including 5 to 50 ring atoms;
$R_{11D}$, $R_{12D}$, and $R_{14D}$ to $R_{18D}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms, a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11D}$, $L_{12D}$, $Ar_{11D}$ to $Ar_{13D}$, $R_{11D}$, $R_{12D}$, and $R_{14D}$ to $R_{18D}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{905}$ are as defined above.

25. The organic electroluminescence device according to claim 24, wherein one of the first hole-transporting material and the second hole-transporting material in the first layer is one or more selected from compounds represented by the following formula (11-3C); and
the other is one or more selected from compounds represented by the formula (11) other than the compound represented by the following formula (11-3C), and
the second layer comprises
the acceptor material, and
a compound selected from compounds represented by the following formula (11-3B):

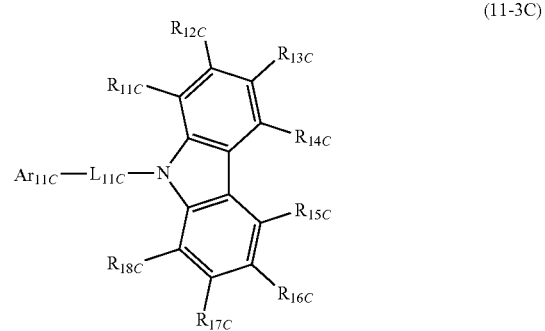

(11-3C)

wherein in the formula (11-3C),
$L_{11C}$ is a single bond or a linking group;
$Ar_{11C}$ is
a substituted or unsubstituted aryl group including 6 to 50 ring carbon atoms, or
a substituted or unsubstituted monovalent heterocyclic group including 5 to 50 ring atoms;
one or more sets of adjacent two or more of $R_{11C}$ to $R_{18C}$ form a substituted or unsubstituted, saturated or unsaturated ring by bonding with each other, or do not form the ring;

$R_{11C}$ to $R_{18C}$ which do not form the ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11C}$, $Ar_{11C}$, and $R_{11C}$ to $R_{18C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—N($R_{906}$)($R_{907}$),
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{905}$ are as defined above;
provided that the sum of the number of —N($R_{906}$)($R_{907}$)'s which are $R_{11C}$ to $R_{18C}$ and the number of substituents —N($R_{906}$)($R_{907}$) possessed by $Ar_{11C}$, $L_{11C}$, and $R_{11C}$ to $R_{18C}$ is 1;

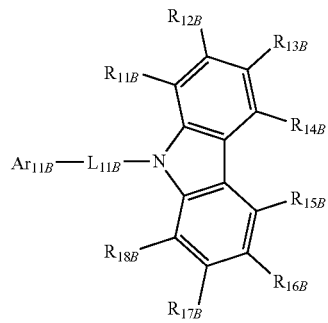

(11-3B)

wherein in the formula (11-3B),
$L_{11B}$ is
a single bond, or
a substituted or unsubstituted arylene group including 6 to 50 ring carbon atoms;
$Ar_{11B}$ is
a substituted or unsubstituted aryl group including 6 to 50 ring carbon atoms, or
a substituted or unsubstituted monovalent heterocyclic group including 5 to 50 ring atoms;
$R_{11B}$ to $R_{18B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11B}$, $Ar_{11B}$, and $R_{11B}$ to $R_{18B}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms, a substituted or unsubstituted cycloalkyl group including 3 to 50 ring carbon atoms,
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{905}$ are as defined above.

26. The organic electroluminescence device according to claim 24, wherein one of the first hole-transporting material and the second hole-transporting material in the first layer is one or more selected from compounds represented by the following formula (11-3C); and
the other is one or more selected from the compounds represented by the formula (11) other than the compound represented by the following formula (11-3C), and
the second layer comprises
the acceptor material, and
a compound selected from compounds represented by the following formula (11-3D):

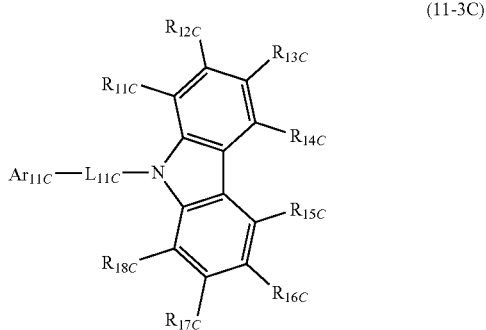

(11-3C)

wherein in the formula (11-3C),
$L_{11C}$ is a single bond or a linking group;
$Ar_{11C}$ is
a substituted or unsubstituted aryl group including 6 to 50 ring carbon atoms, or
a substituted or unsubstituted monovalent heterocyclic group including 5 to 50 ring atoms;
one or more sets of adjacent two or more of $R_{11C}$ to $R_{18C}$ form a substituted or unsubstituted, saturated or unsaturated ring by bonding with each other, or do not form the ring;
$R_{11C}$ to $R_{18C}$ which do not form the ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
substituents when $L_{11C}$, $Ar_{11C}$, and $R_{11C}$ to $R_{18C}$ have substituents are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—N($R_{906}$)($R_{907}$),
—Si($R_{901}$)($R_{902}$)($R_{903}$),
—O—($R_{904}$),
—S—($R_{905}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{905}$ are as defined above; and
provided that the sum of the number of —N($R_{906}$)($R_{907}$)'s which are $R_{11C}$ to $R_{18C}$ and the number of substituents —N($R_{906}$)($R_{907}$) possessed by $Ar_{11C}$, $L_{11C}$, and $R_{11C}$ to $R_{18C}$ is 1;

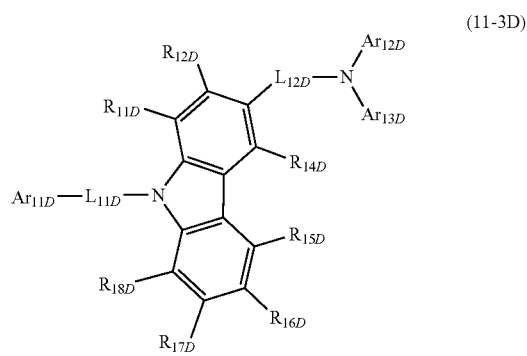

(11-3D)

wherein in the formula (11-3 D),
$L_{11D}$ and $L_{12D}$ are independently
a single bond, or
a substituted or unsubstituted arylene group including 6 to 50 ring carbon atoms;
$Ar_{11D}$ to $Ar_{13D}$ are independently
a substituted or unsubstituted aryl group including 6 to 50 ring carbon atoms, or a substituted or unsubstituted monovalent heterocyclic group including 5 to 50 ring atoms;

$R_{11D}$, $R_{12D}$, and $R_{14D}$ to $R_{18D}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;

substituents when $L_{11D}$, $L_{12D}$, $Ar_{11D}$ to $Ar_{13D}$, $R_{11D}$, $R_{12D}$, and $R_{14D}$ to $R_{18D}$ have substituents are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{905}$ are as defined above.

* * * * *